(12) United States Patent
Miya et al.

(10) Patent No.: US 9,214,331 B2
(45) Date of Patent: Dec. 15, 2015

(54) SUBSTRATE PROCESSING METHOD AND SUBSTRATE PROCESSING APPARATUS

(75) Inventors: Katsuhiko Miya, Kyoto (JP); Naozumi Fujiwara, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 942 days.

(21) Appl. No.: 13/309,070

(22) Filed: Dec. 1, 2011

(65) Prior Publication Data

US 2012/0175819 A1  Jul. 12, 2012

(30) Foreign Application Priority Data

Jan. 6, 2011  (JP) ................. 2011-001367
Jan. 28, 2011  (JP) ................. 2011-016178
Oct. 7, 2011  (JP) ................. 2011-222634

(51) Int. Cl.
*H01L 21/02* (2006.01)
*B08B 7/00* (2006.01)
*B08B 3/10* (2006.01)
*B08B 3/12* (2006.01)
*H01L 21/67* (2006.01)

(52) U.S. Cl.
CPC ............ *H01L 21/02052* (2013.01); *B08B 3/10* (2013.01); *B08B 3/12* (2013.01); *B08B 7/0021* (2013.01); *H01L 21/02* (2013.01); *H01L 21/67051* (2013.01); *H01L 21/67196* (2013.01)

(58) Field of Classification Search
CPC .......... B08B 5/00; B08B 7/00; B08B 7/0021; B08B 3/12; B08B 3/10; H01L 21/02
USPC .................. 134/4, 5, 6, 31, 32, 33, 35, 37
See application file for complete search history.

(56) References Cited

U.S. PATENT DOCUMENTS

| | | | |
|---|---|---|---|
| 4,817,652 A | 4/1989 | Liu et al. | |
| 4,962,776 A | 10/1990 | Liu et al. | |
| 5,857,474 A * | 1/1999 | Sakai et al. | ............... 134/102.3 |
| 6,783,599 B2 | 8/2004 | Gale et al. | |
| 2003/0108823 A1 | 6/2003 | Muraoka et al. | ............. 430/329 |
| 2004/0112406 A1* | 6/2004 | Cotte et al. | ........................ 134/4 |
| 2006/0281649 A1 | 12/2006 | Tanaka et al. | ................ 510/108 |
| 2007/0235062 A1 | 10/2007 | Fujiwara et al. | |
| 2008/0060686 A1* | 3/2008 | Miya et al. | ...................... 134/37 |

(Continued)

FOREIGN PATENT DOCUMENTS

| CN | 1709591 A | 12/2005 |
|---|---|---|
| CN | 101145502 A | 3/2008 |

(Continued)

OTHER PUBLICATIONS

Chinese Office Action dated Feb. 8, 2014 for corresponding Chinese Patent Application No. 201210005467.6 (15 pages).

(Continued)

*Primary Examiner* — Saeed T Chaudhry
(74) *Attorney, Agent, or Firm* — Ostrolenk Faber LLP

(57) ABSTRACT

DIW in an excessively cooled state is supplied as a solidification liquid to a substrate W, and a solidified material of the DIW is formed by a landing impact on the substrate W. This makes the use of a gaseous refrigerant necessary to form a solidified material unnecessary, eliminates the need for a facility to generate the gaseous refrigerant, shortens a processing time and further enables running cost and the like to be suppressed.

12 Claims, 33 Drawing Sheets

(56) References Cited

U.S. PATENT DOCUMENTS

| | | | |
|---|---|---|---|
| 2008/0127508 A1 | 6/2008 | Ohno et al. | |
| 2008/0236634 A1* | 10/2008 | Moriya et al. | 134/95.3 |
| 2010/0313915 A1* | 12/2010 | Fujiwara et al. | 134/33 |

FOREIGN PATENT DOCUMENTS

| | | |
|---|---|---|
| EP | 0 423 761 | 4/1991 |
| JP | 62-169420 | 7/1987 |
| JP | 3-145130 | 6/1991 |
| JP | 3-503975 | 9/1991 |
| JP | 3-261142 | 11/1991 |
| JP | 07-042000 | 2/1995 |
| JP | 7-240356 | 9/1995 |
| JP | 10-22245 | 1/1998 |
| JP | 11-162813 | 6/1999 |
| JP | 2000-150345 | 5/2000 |
| JP | 2000-350957 | 12/2000 |
| JP | 3343013 | 11/2002 |
| JP | 2003-203856 | 7/2003 |
| JP | 2008-28008 | 2/2008 |
| JP | 2008-71875 | 3/2008 |
| JP | 2008-130822 | 6/2008 |
| JP | 2010-027816 | 2/2010 |
| JP | 2010-27930 | 2/2010 |
| JP | 2010-80584 | 4/2010 |
| JP | 2010-123835 | 6/2010 |
| JP | 2010-186901 | 8/2010 |
| KR | 10-2007-0101124 | 10/2007 |

OTHER PUBLICATIONS

Office Action issued Jun. 19, 2015 in corresponding Japanese Patent Application No. 2011-222634 (3 pages).

* cited by examiner

F I G. 2
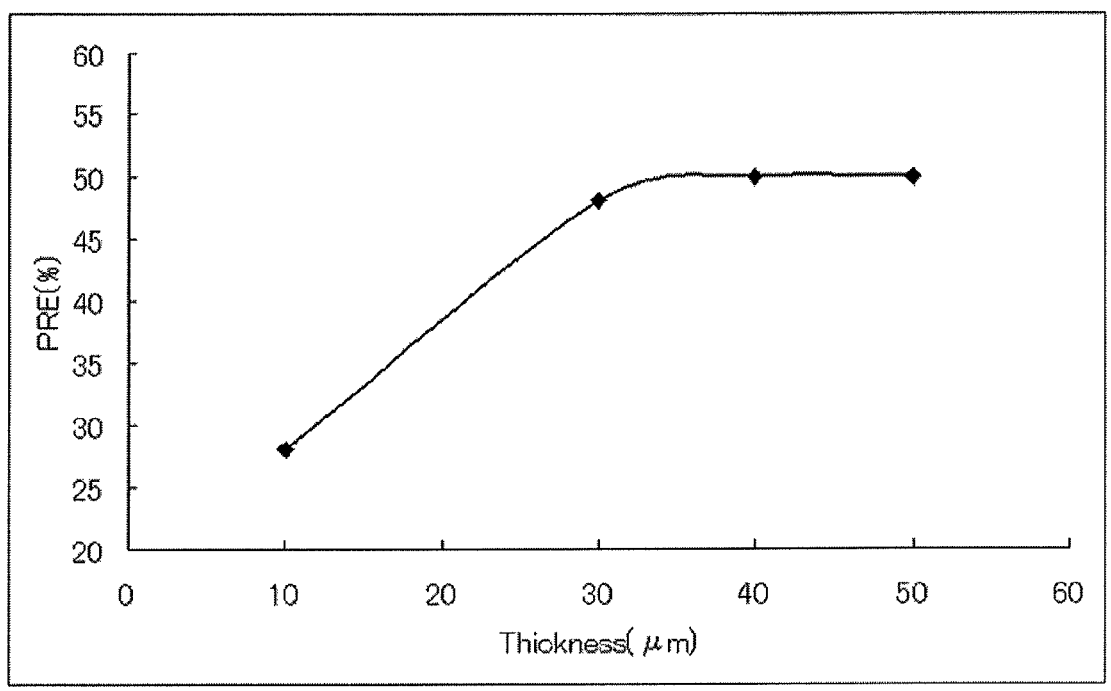

F I G. 5
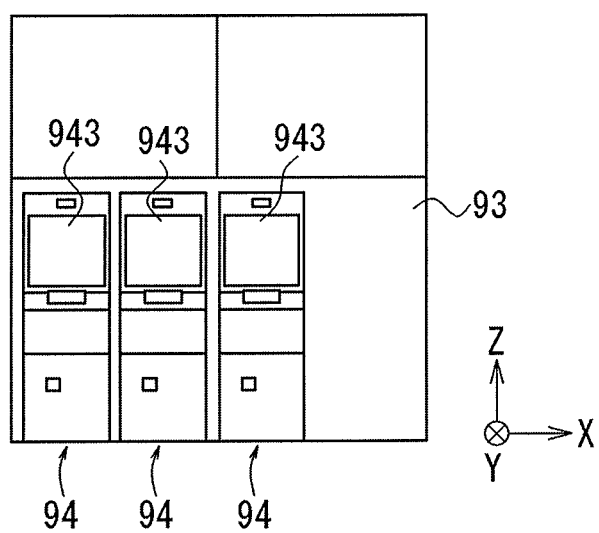

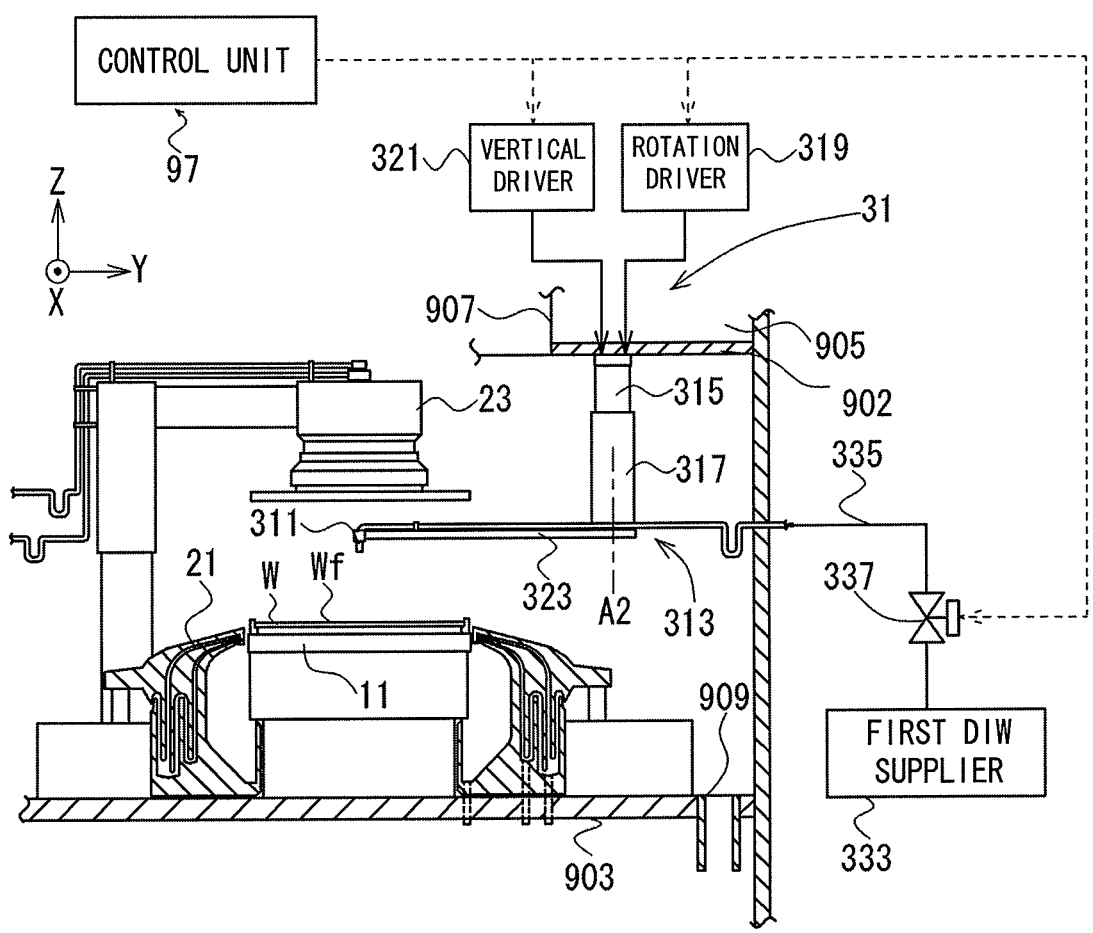
F I G. 8

F I G. 1 3
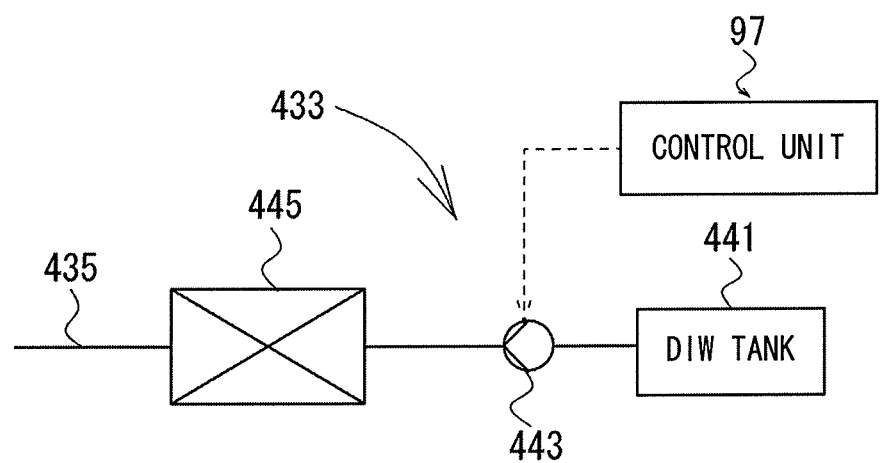

FIG. 22
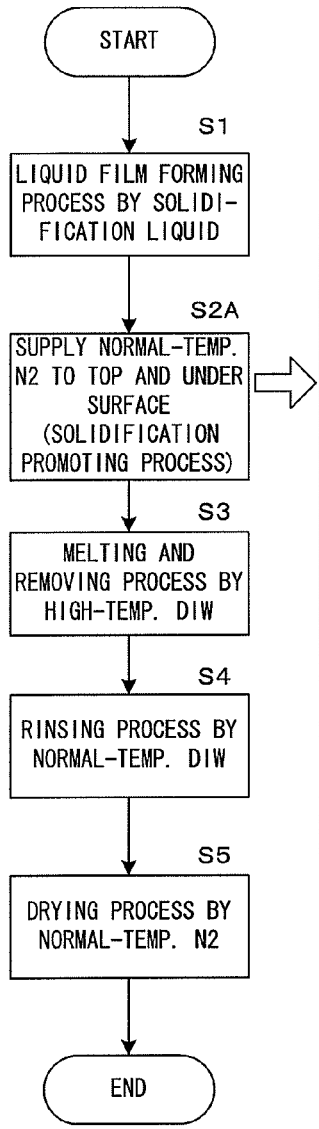
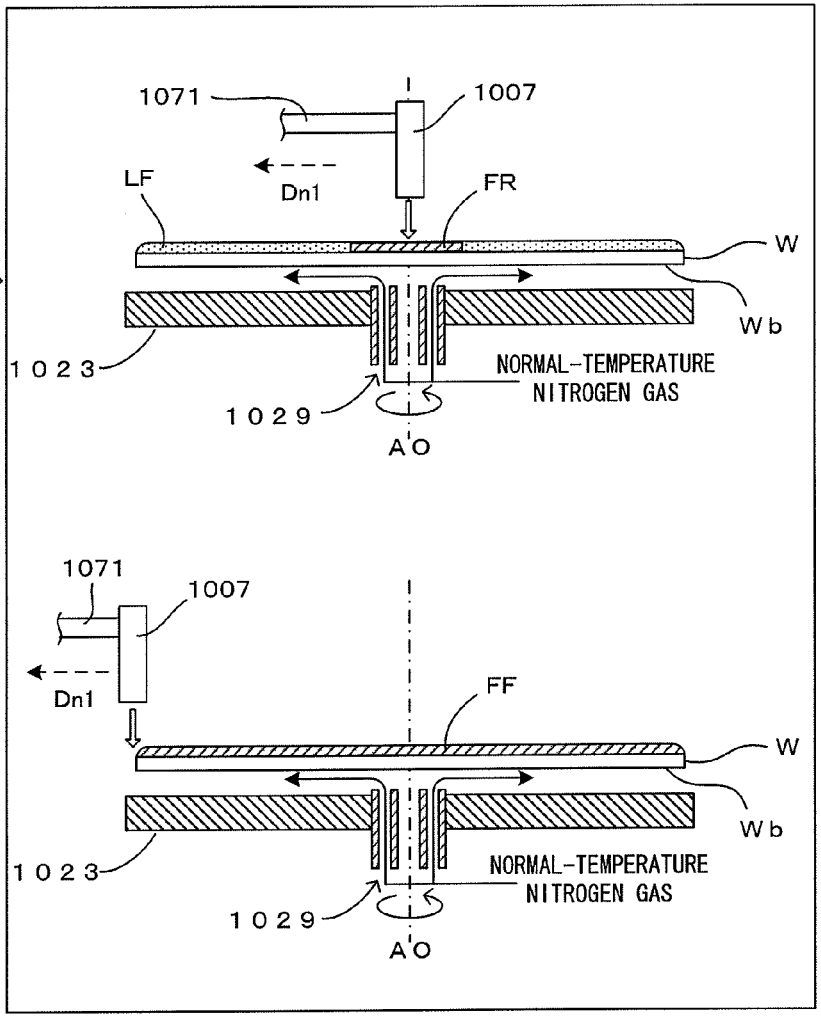

FIG. 23
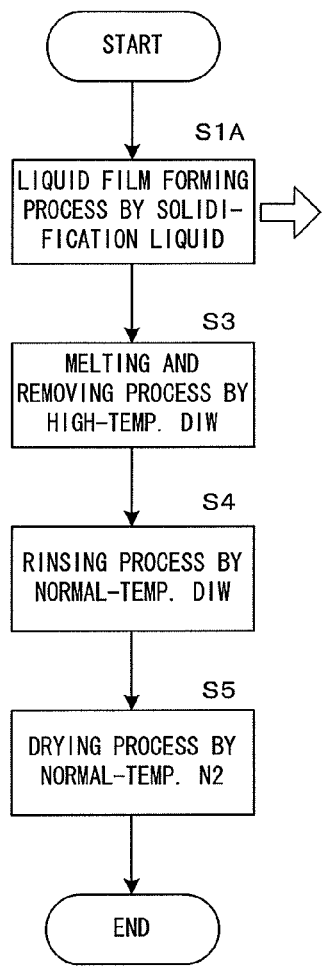
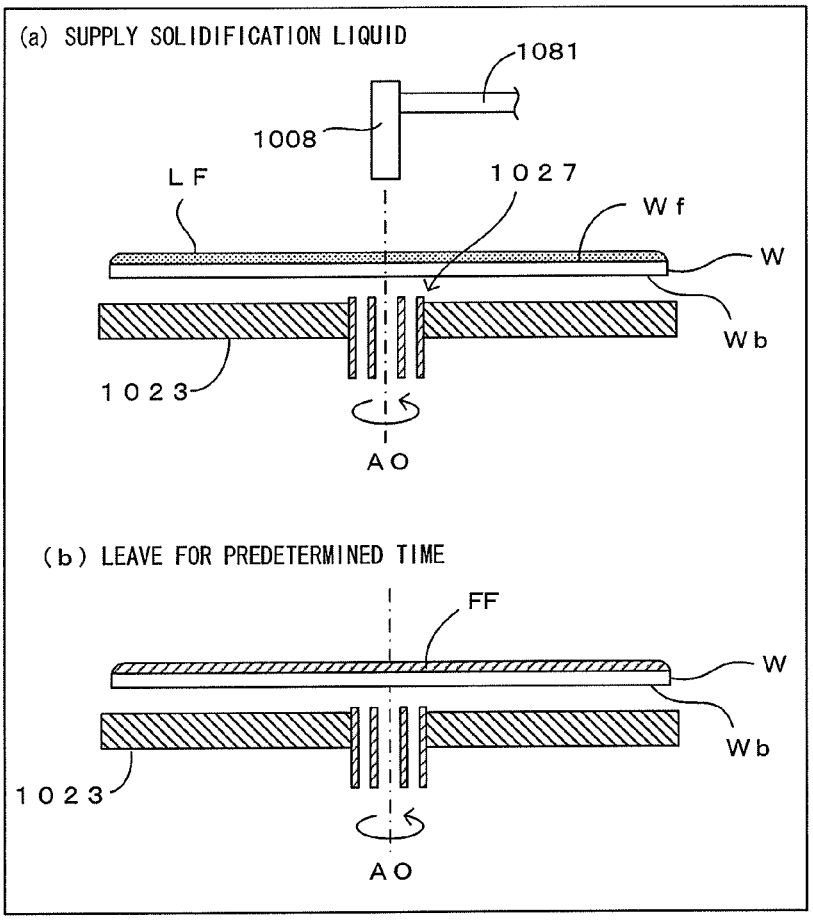

FIG. 24
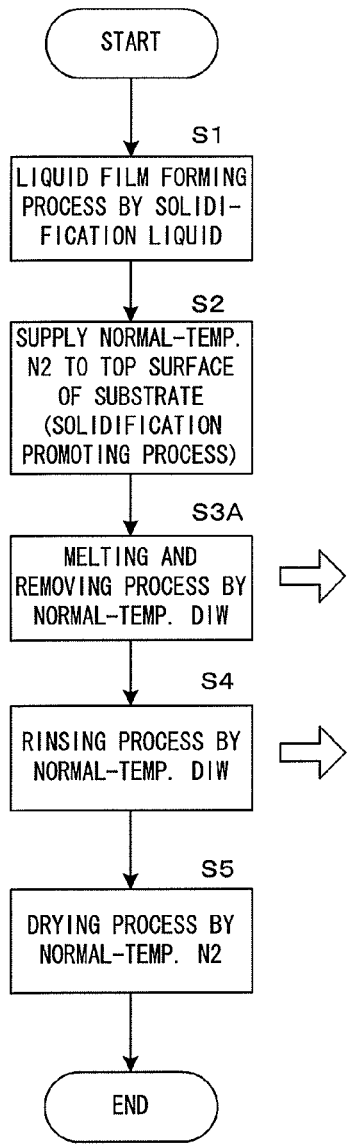
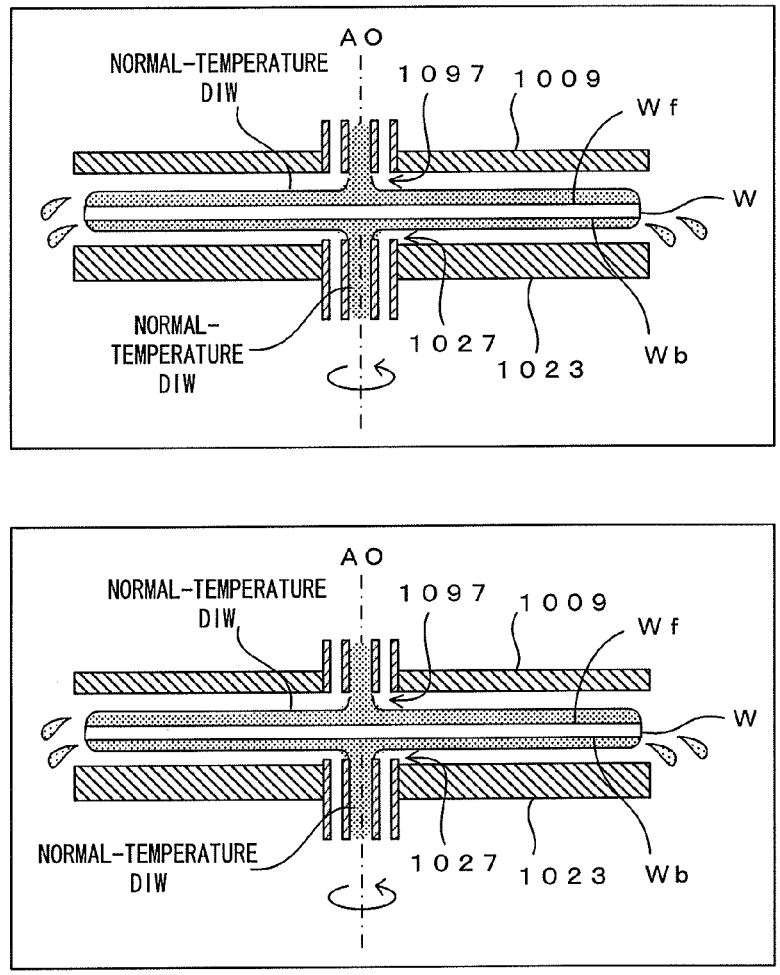

FIG. 28
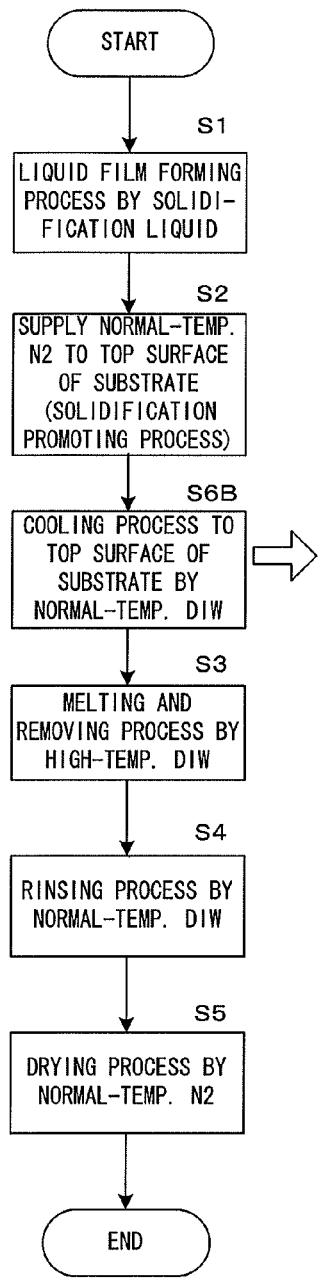
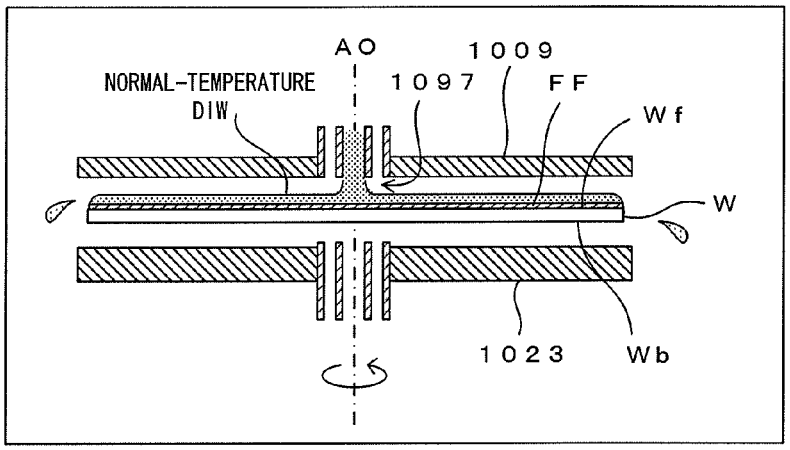

FIG. 30
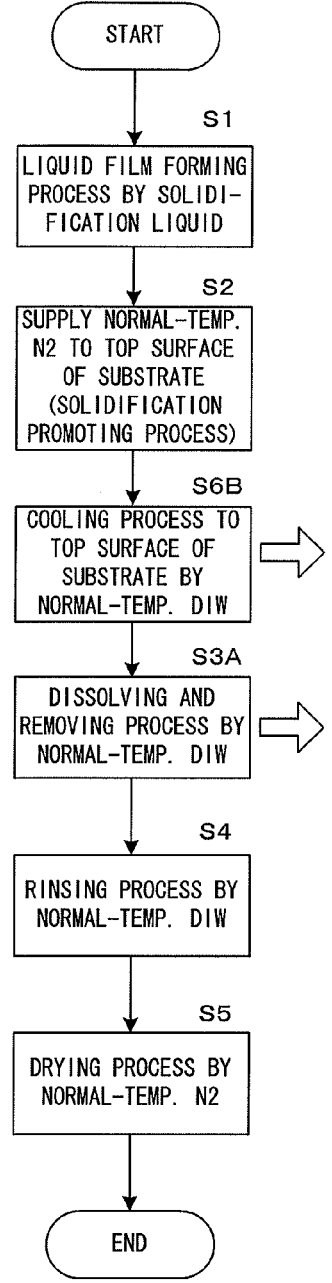
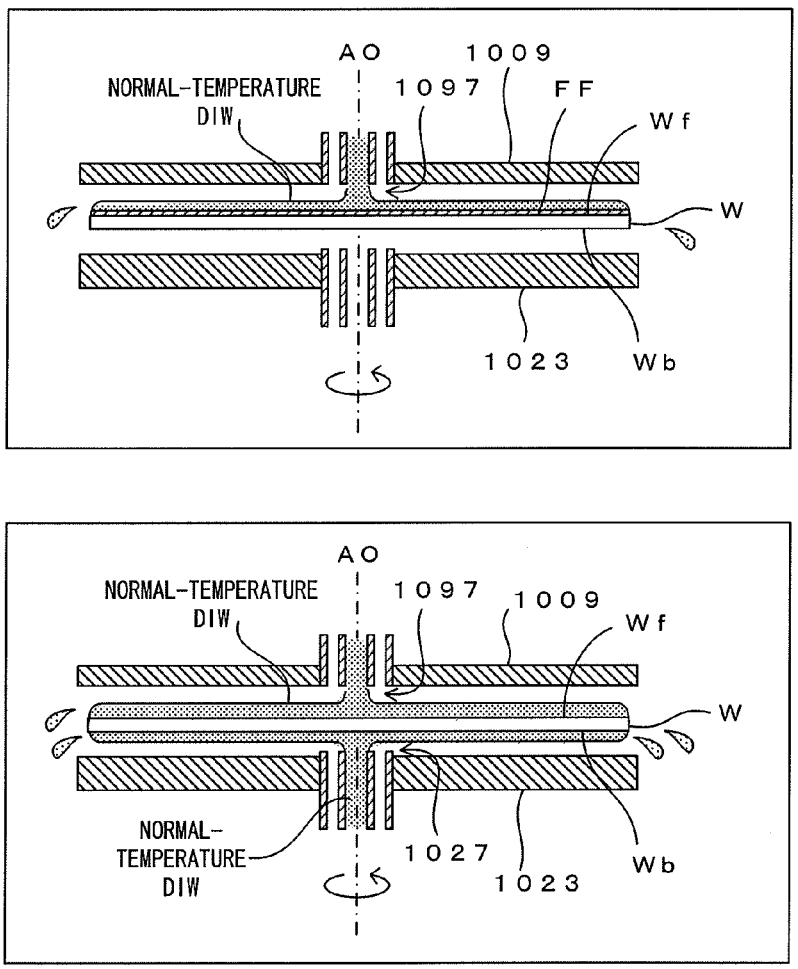

SUBSTRATE PROCESSING METHOD AND SUBSTRATE PROCESSING APPARATUS

CROSS REFERENCE TO RELATED APPLICATION

The disclosure of Japanese Patent Applications enumerated below including specifications, drawings and claims is incorporated herein by reference in its entirety:
No. 2011-001367 filed on Jan. 6, 2011;
No. 2011-016178 filed on Jan. 28, 2011; and
No. 2011-222634 filed on Oct. 7, 2011.

BACKGROUND OF THE INVENTION

1. Field of the Invention

This invention relates to a substrate processing method and a substrate processing apparatus for performing a cleaning process on various substrates such as semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs (hereinafter, merely referred to as "substrates").

2. Description of the Related Art

A production process of electronic components such as semiconductor devices and liquid crystal displays includes a process of forming a fine pattern by repeatedly performing processes such as film formation on a top surface of a substrate and etching. Here, the top surface of the substrate needs to be kept clean to satisfactorily perform microfabrication, and a cleaning process is performed on the substrate top surface if necessary. For example, in an apparatus disclosed in JP-A-2008-71875, after a liquid such as deionized water (hereinafter referred to as "DIW") is supplied to a substrate top surface and frozen, the frozen liquid is melted and removed by a rinsing liquid to clean the substrate top surface.

That is, the following process is performed in the apparatus disclosed in JP-A-2008-71875. First, a liquid film of DIW is formed on the entire substrate top, surface by supplying the DIW to the top surface of the substrate. Subsequently, the supply of the DIW is stopped and a low-temperature nitrogen gas is supplied to the substrate top surface to freeze the DIW. This causes the DIW having penetrated between contaminants such as particles and the substrate top surface to become ice and expand, whereby the contaminants such as particles are separated from the substrate by an infinitesimal distance. Further, by expanding in a direction parallel to the top surface of the substrate, particles and the like adhering to the substrate are peeled off. As a result, adhesion between the substrate top surface and the contaminants such as particles is reduced and, further, the contaminants such as particles are detached from the substrate top surface. Thereafter, by melting and removing the ice on the substrate top surface by DIW as a rinsing liquid, the contaminants such as particles can be efficiently removed from the substrate top surface.

To produce a low-temperature nitrogen gas, a method for causing a nitrogen gas to flow in a pipe immersed in liquid nitrogen stored in a container and cooling the nitrogen gas by heat exchange is performed as in an apparatus disclosed, for example, in JP-A-2010-123835.

SUMMARY OF THE INVENTION

In freeze cleaning for removing particles and the like by freezing the DIW on the substrate as in the above conventional technology, the temperature of the DIW after freezing needs to be reduced to about −20° C. (Celsius) to improve an ability to remove particles and the like (expressed by "PRE" in FIG. 1; larger numerical value indicating a higher ability to remove particles; and hereinafter, referred to as "cleaning ability") as shown in FIG. 1.

Although the nitrogen gas is used to cool the DIW on the substrate in the above conventional technology, such a method cannot be said to have high cooling efficiency since a liquid is cooled by a gas. For cooling in a short time, it has been necessary to reduce the temperature of the nitrogen gas to −100° C. (Celsius) or below. Accordingly, a method for cooling a nitrogen gas by liquid nitrogen has been adopted to obtain a clean nitrogen gas having a temperature and a flow rate necessary to cool a substrate.

In such a case, thermal insulation properties need to be improved to prevent heat absorption from an atmosphere for the container for storing the liquid nitrogen for heat exchange and the pipe for feeding the cooled nitrogen gas, which has led to enlargement of the apparatus and a cost increase. Further, the use of the liquid nitrogen has led to an increase in running cost. Furthermore, due to cooling by the gas, heat transfer efficiency has been low and it has taken time to freeze all the DIW on the substrate and cool the frozen DIW to a necessary temperature.

Contrary to this, it is also thought to directly supply a liquid refrigerant to freeze the liquid DIW on the substrate. However, if the liquid refrigerant is supplied onto the liquid DIW, the following problem may occur. The DIW is eliminated from the substrate top surface by the liquid refrigerant and cleaning cannot be performed, or a part of the DIW is pushed out to make an ice film after freezing uneven on the substrate, whereby the cleaning ability within the plane of the substrate varies.

This invention was developed in view of the above problems and an object thereof is to provide a substrate processing method and a substrate processing apparatus capable of cleaning a substrate without using a gaseous refrigerant which leads to a cost increase and a processing time increase.

In order to solve the above problems, a substrate processing method according to the present invention comprises: a preparation step of preparing a solidification liquid to be supplied to a substrate in a liquid state; a solidified material forming step of supplying the solidification liquid prepared in the preparation step to the substrate via a space and forming a solidified material of the solidification liquid on the substrate; and a removing step of removing the solidified material of the solidification liquid on the substrate; the solidification liquid being solidified by an external stimulus from the preparation step to the solidified material forming step.

In order to solve the above problems, a substrate processing apparatus according to the present invention comprises: a solidified material forming unit for discharging a solidification liquid in a liquid state from a nozzle, supplying it to a substrate and forming a solidified material of the solidification liquid on the substrate; and a remover for removing the solidified material of the solidification liquid on the substrate; the solidification liquid being solidified by an external stimulus received in at least one of a process of landing on the substrate after being discharged from the nozzle and a process of being left on the substrate as it is.

In the invention thus constructed (substrate processing method and substrate processing apparatus), it is not necessary to supply a gas for solidifying the solidification liquid since the solidification liquid prepared in a liquid state is solidified by an external stimulus. This can prevent size enlargement of the apparatus, a cost increase and further a running cost increase caused by the use of liquid nitrogen or the like.

BRIEF DESCRIPTION OF THE DRAWINGS

FIG. 2 is a graph showing a relationship between liquid film thickness and particle removal efficiency in a freeze cleaning technology.

FIG. 5 is a side view of the substrate processing apparatus when viewed in a direction of an arrow B2 in FIG. 3.

FIG. 8 is a diagram showing the construction of the solidified material forming unit in the processing unit of FIG. 6.

FIG. 13 is a diagram showing the construction of the second DIW supplier in the melter of FIG. 12.

FIG. 22 is a view showing movements of a fifth embodiment of the substrate processing apparatus according to this invention.

FIG. 23 is a view showing movements of a sixth embodiment of the substrate processing apparatus according to this invention.

FIG. 24 is a view showing movements of a seventh embodiment of the substrate processing apparatus according to this invention.

FIG. 28 is a view showing movements of a tenth embodiment of the substrate processing apparatus according to this invention.

FIG. 30 is a view showing movements of a twelfth embodiment of the substrate processing apparatus according to this invention.

DETAILED DESCRIPTION OF THE PREFERRED EMBODIMENTS

In the following description, substrates mean various substrates such as semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs.

In the following description, a substrate having a circuit pattern and the like formed only on one principle surface is used as an example. Here, a principle surface where the circuit pattern and the like are formed is called a "top surface" and an opposite principle surface where the circuit pattern and the like are not formed is called an "under surface". Further, a surface of the substrate facing downward is called a "lower surface" and a surface thereof facing upward is called an "upper surface". Note that it is assumed the upper surface is the top surface in the following description.

Further, in the following description, "supercooling" indicates a state where a state of a substance does not change even at or below a temperature where the state is supposed to change in a phase change of the substance, specifically indicates a state where a liquid is not solidified even if being cooled below a solidification point (transition point) and holds a liquid phase. For example, in the case of water, it indicates a state where water is not frozen even at or below 0° C. In the following first to third embodiments, a solidification liquid in such an supercooled state is supplied to a substrate and a landing impact on the substrate is utilized as an external stimulus.

Hereinafter, embodiments of the invention are described with reference to the drawings, taking a substrate processing apparatus used to process semiconductor substrates as an example. Note that the invention can be also applied to processes for various substrates such as glass substrates for liquid crystal displays without being limited to processes for semiconductor substrates. Further, substrate processing apparatuses to which the present invention is applicable are not limited to those in which a cleaning process and a drying process are successively performed in the same apparatus, and may also be apparatuses in which only a single process is performed.

First Embodiment

Figure 3:
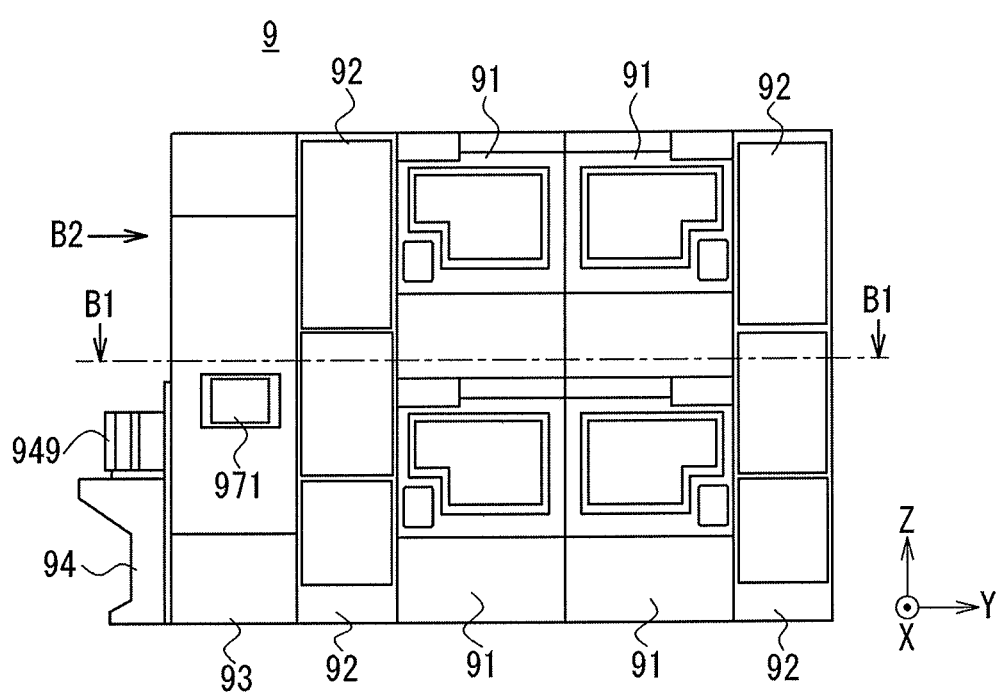
FIG. 3 is a front view showing a schematic construction of the substrate processing apparatus according to this invention.
Figure 4:
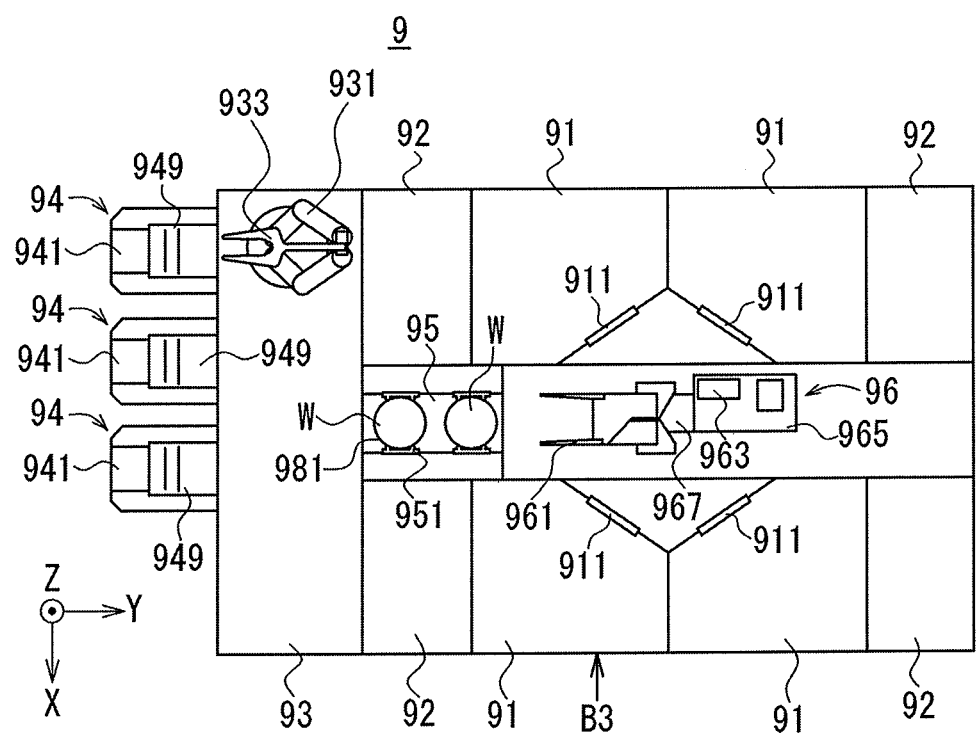
FIG. 4 is a sectional view of the substrate processing apparatus taken along a line B1-B1 indicted by arrows in FIG. 3.

FIGS. 3, 4 and 5 are diagrams showing a schematic construction of a substrate processing apparatus 9 according to this invention. FIG. 3 is a front view of the substrate processing apparatus 9, FIG. 4 is a sectional view taken along a line B1-B1 indicted by arrows of the substrate processing apparatus 9 in FIG. 3. FIG. 5 is a side view of the substrate processing apparatus 9 in FIG. 3 when viewed in a direction of an arrow B2. This apparatus is a single-substrate processing apparatus used in a cleaning process for removing contaminants such as particles (hereinafter, referred to as "particles and the like") adhering to a substrate W such as a semiconductor substrate (hereinafter, merely referred to as a "substrate W").

Note that a coordinate system with a Z axis extending in a vertical direction and an XY plane as a horizontal plane is appropriately attached to the respective drawings to make a directional relationship clear. Further, in each coordinate system, a pointing direction of an arrow is a + (plus) direction and an opposite direction is a − (minus) direction.

The substrate processing apparatus 9 includes openers 94 each carrying a FOUP (Front Open Unified Pod) 949 housing, for example, 25 substrates W, an indexer unit 93 for taking out an unprocessed substrate W from the FOUP 949 on the opener 94 and storing the substrate W after the completion of the process into the FOUP 949, a shuttle 95 for transferring the substrate W between the indexer unit 93 and a center robot 96, processing units 91 for cleaning the substrate W loaded thereinto by the center robot 96 and fluid boxes 92 housing pipes, on-off valves and the like for liquids and gases to be supplied to the processing units 91.

First, a planar arrangement of these is described using FIG. 4. At one end (left end in FIG. 4) of the substrate processing apparatus 9, a plurality of (three in this embodiment) openers 94 are arranged. The indexer unit 93 is arranged to the right of (+Y side) and adjacent to the openers 94 in FIG. 4. The shuttle 95 is arranged near a center of the indexer unit 93 in an X direction and to the right of (+Y side) and adjacent to the indexer unit 93 in FIG. 4. The center robot 96 is so arranged to the right of (+Y side) and adjacent to the shuttle 95 in FIG. 4 as to be juxtaposed with the shuttle 95 in a +Y direction. In this way, the indexer unit 93, the shuttle 95 and the center robot 96 are arranged on two orthogonal lines.

At an upper side (−X side) and a lower side (+X side) of the shuttle 95 and the center robot 96 juxtaposed in the +Y direction in FIG. 4, the processing units 91 and the fluid boxes 92 are arranged. That is, the fluid box 92, the processing unit 91, the processing unit 91 and the fluid box 92 are arranged in this order at the upper side (−X side) and the lower side (+X side) of the shuttle 95 and the center robot 96 in FIG. 4 and to the right of (+Y side) and adjacent to the indexer unit 93 in FIG. 4.

Note that an operation unit 971 of a control unit 97 to be described later is disposed on a side surface of the indexer unit 93 at the +X side (lower side in FIG. 4) (see FIG. 3).

Next, the opener 94 is described. The opener 94 includes a placing surface 941 which is located on the top of the opener 94 and on which the FOUP 949 is placed, and an opening/closing mechanism 943 (see FIG. 5) arranged to face the front surface of the FOUP 949 (surface of the FOUP 949 on the right side (+Y side) in FIGS. 3 and 4) and adapted to open and close a lid (not shown) on the front surface of the FOUP 949.

The FOUP 949 loaded by an automatic transport vehicle or the like from the outside of the substrate processing apparatus 9 is placed on the placing surface 941 of the opener 94 and the lid is opened by the opening/closing mechanism 943. This enables an indexer robot 931 of the indexer unit 93 to be described later to unload the substrate W from the FOUP 949 or conversely to load the substrate W into the FOUP 949.

Next, the indexer unit 93 is described. The indexer unit 93 includes the indexer robot 931 which takes out unprocessed substrates W before the process one by one from the FOUP 949, stores the substrates W after the process one by one into the FOUP 949 and further transfers the substrates W to and from the shuttle 95. This indexer robot 931 includes two upper and lower hands 933 spaced apart in a Z-axis direction. The indexer robot 931 is constructed to be horizontally movable in an X-axis direction, vertically movable in the Z-axis direction and rotatable about the Z axis.

Next, the shuttle 95 is described. The shuttle 95 includes two upper and lower hands 951 spaced apart in the Z-axis direction and adapted to hold the substrate W at positions which are near upper (−X side) and lower (+X side) peripheral parts in FIG. 4 and do not interfere with the hands 933 of the indexer robot 931 and hands 961 of the center robot 96 to be described later. Further, the shuttle 95 includes a horizontal moving mechanism (not shown) for independently horizontally moving the two hands 951 in a Y-axis direction.

The shuttle 95 is constructed to be able to transfer the substrate W to and from both the indexer robot 931 and the center robot 96. That is, when the hands 951 are moved to the left side (−Y side) in FIG. 4 by the unillustrated horizontal moving mechanism, the transfer of the substrate W to and from the hands 933 of the indexer robot 931 is possible. Further, when the hands 951 are moved to the right side (+Y side) in FIG. 4 by the unillustrated horizontal moving mechanism, the transfer of the substrate W to and from the hands 961 of the center robot 96 is possible.

Next, the center robot 96 is described. The center robot 96 include two upper and lower hands 961 spaced apart in the Z-axis direction and adapted to hold one substrate W and transfer it between the shuttle 95 or the processing unit 91. Further, the center robot 96 includes an elevating shaft 963 which extends in the vertical direction (Z-axis direction) and along which the hands 961 are moved in the vertical direction, an elevating mechanism 965 for moving the hands 961 upward and downward and a rotating mechanism 967 for rotating the hands 961 about the Z axis. The center robot 96 is so constructed that the hands are vertically movable along the elevating shaft 963 in the Z-axis direction and rotatable about the Z axis by the rotating mechanism 967.

Note that an opening used to load or unload the substrate W into or from the processing unit 91 by extending the hands 961 of the center robot 96 is provided at a side wall of each processing unit 91 to be described later and in a surface facing the center robot 96. Further, a shutter 911 is provided to close the above opening and keep an atmosphere in the processing unit 91 clean while the center robot 96 does not transfer the substrate W to and from the processing unit 91.

Note that the processing units 91 and the fluid boxes 92 are stacked up in two upper and lower levels as shown in FIG. 3. Accordingly, the substrate processing apparatus 9 in this embodiment includes eight processing units 91 and eight fluid boxes 92.

Next, a procedure of conveying the substrate W by the indexer robot 931, the shuttle 95 and the center robot 96 is described. The FOUP 949 loaded by the automatic transport vehicle or the like from the outside of the substrate processing apparatus 9 is placed on the placing surface 941 of the opener 94 and the lid thereof is opened by the opening/closing mechanism 943. The indexer robot 931 takes out one substrate W at a predetermined position of the FOUP 949 by the lower hand 933. Thereafter, the indexer robot 931 moves to a position before the shuttle 95 (near the center of the indexer unit 93 in the X-axis direction in FIG. 4). Simultaneously, the shuttle 95 moves the lower hand 951 to a side of the indexer unit 93 (left side (−Y side) in FIG. 4).

The indexer robot 931 having moved to the position before the shuttle 95 transfers the substrate W held on the lower hand 933 to the lower hand 951 of the shuttle 95. Thereafter, the shuttle 95 moves the lower hand 951 to a side of the center robot 96 (right side (+Y side) in FIG. 4). Further, the center robot 96 moves to a position where the hand 961 is facing the shuttle 95.

Thereafter, the center robot 96 takes out the substrate W held on the lower hand 951 of the shuttle 95 by the lower hand 961 and moves such that the hand 961 faces a shutter of any one of the eight processing units 91. Thereafter, the shutter 911 is opened, the center robot 96 extends the lower hand 961 to load the substrate W into the processing unit 91, and the cleaning process for the substrate W is started in the processing unit 91.

The substrate W finished with the process in the processing unit 91 is unloaded by the upper hand 961 of the center robot 96. Thereafter, contrary to the above case of loading the unprocessed substrate W, the substrate W is transferred to the upper hand 961 of the center robot 96, the upper hand 951 of the shuttle 95 and the upper hand 933 of the indexer robot 931 in this order and finally stored at the predetermined position of the FOUP 949.

Figure 6:
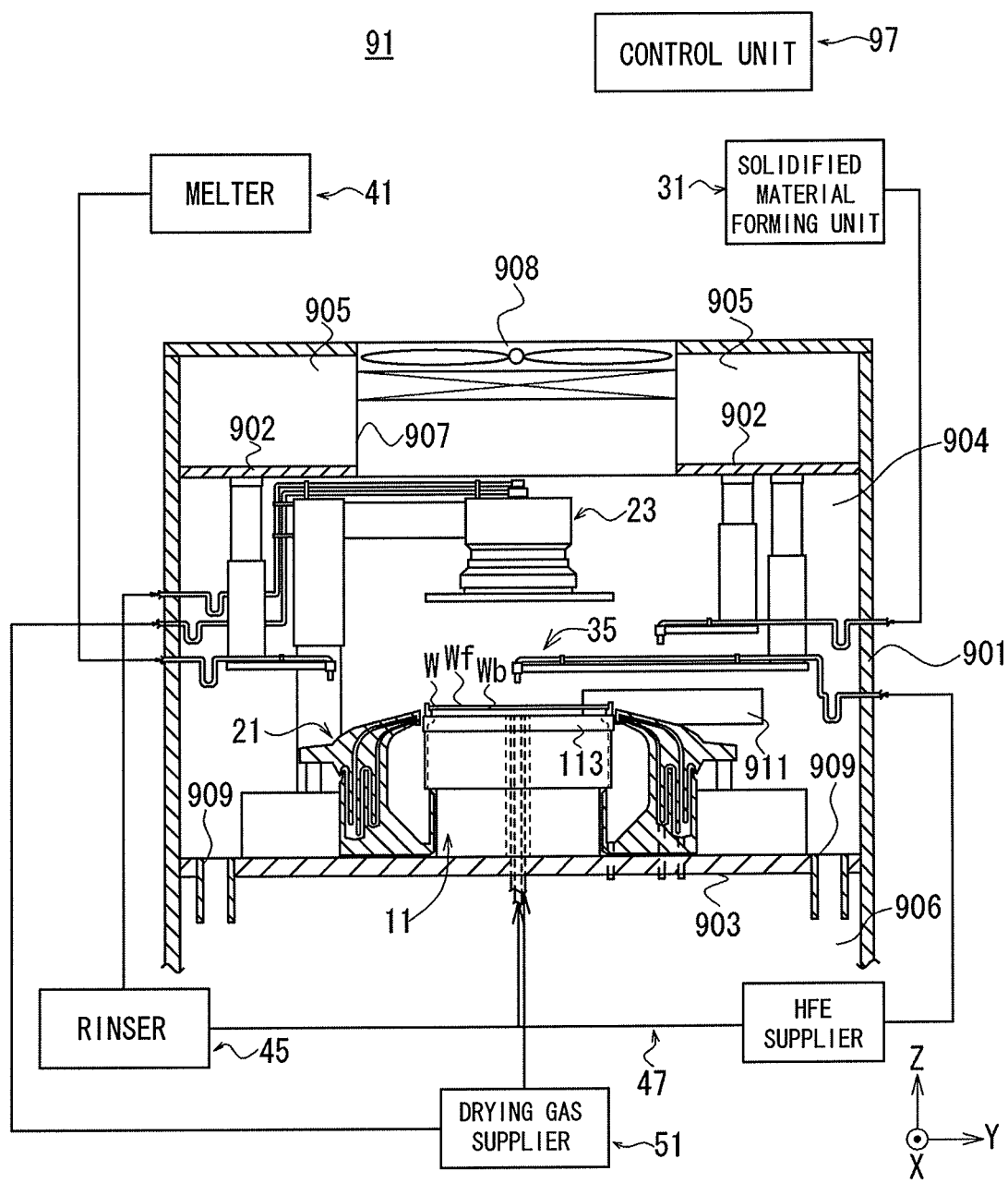
FIG. 6 is a diagram showing the construction of the processing unit according to a first embodiment.

Next, the construction of the processing unit 91 is described using FIG. 6. FIG. 6 is a diagram showing the construction of the processing unit 91. Here, since the eight processing units 91 in this embodiment respectively have the same construction, the processing unit 91 indicated by an arrow B3 in FIG. 4 (lower left processing unit 91 in FIG. 3) is described below as a representative example.

The processing unit 91 includes a substrate holder 11 which substantially horizontally holds the substrate W and rotates, a drainage collector 21 which houses the substrate holder 11 inside and receives and discharges/drains substances scattered from the substrate holder 11 and the substrate W, and an atmosphere blocker 23 which is arranged to face a top surface Wf of the substrate W held on the substrate holder 11 and shuts off a space above the substrate top surface Wf from outside air.

The processing unit 91 also includes a solidified material forming unit 31 for forming a solidified material of a solidification liquid on the substrate W by supplying the solidification liquid, which can form the solidified material, in an supercooled state to the substrate W, a surface cooler 35 for cooling the solidified material of the solidification liquid on the substrate W by supplying a liquid coolant having a solidification point lower than that of the solidification liquid and a temperature lower than the solidification point of the solidification liquid, a melter 41 as a remover for melting and removing the solidified solidification liquid, a rinser 45 for supplying a rinsing liquid toward the substrate top surface Wf and a substrate under surface Wb, an under surface cooler 47 for cooling the substrate W by discharging a refrigerant having a temperature lower than the solidification point of the solidification liquid to the substrate under surface Wb, a drying gas supplier 51 for supplying a drying gas toward the substrate top surface Wf and the substrate under surface Wb to shut off the substrate top surface Wf and the substrate under surface Wb from outside air, and the control unit 97 for controlling operations of the respective parts of the substrate processing apparatus 9 based on a cleaning program to be described later.

Note that, in this embodiment, deionized water (hereinafter, referred to as "DIW") is used as the solidification liquid, the melting liquid and the rinsing liquid and HFE is used as a refrigerant for cooling the top surface and the under surface. Further, a nitrogen gas is used as the drying gas in this embodiment.

Here, HFE is a liquid mainly containing hydrofluoroether. Novec (registered trademark) HFP produced by Sumitomo 3M Ltd. can be, for example, used as the "HFE". Specifically, HFEs having a chemical formula: $C_4F_9OCH_3$, a chemical formula: $C_4F_9OC_2H_5$, a chemical formula: $C_6F_{13}OCH_3$, a chemical formula: $C_3HF_6\text{—}CH(CH_3)O\text{—}C_3HF_6$ and a chemical formula: $C_2HF_4OCH_3$ (solidification point: − (minus) 38° C. (Celsius) or below) can be, for example, used as the HFE. These HFEs may be diluted.

The processing unit 91 also includes a side wall 901 having a substantially hollow rectangular column shape, and an upper base member 902 and a lower base member 903 which are substantially horizontally fixed to the side wall 901 and partition the space in the processing unit 91. Further, the processing unit 91 includes an upper space 905 located in the side wall 901 and above the upper base member 902, a processing space 904 located in the side wall 901, below the upper base member 902 and above the lower base member 903, and a lower space 906 located in the side wall 901 and below the lower base member 903. Note that although the side wall 901 has the substantially hollow rectangular column shape, the shape of the side wall is not limited thereto and may have a substantially cylindrical shape or another shape.

Note that the opening through which the center robot 96 can load and unload the substrate W into and from the processing unit 91 and the shutter 911 for closing the opening to keep the atmosphere in the processing unit 91 clean are provided at a side of the side wall 901 facing the center robot 96.

The upper base member 902 is substantially horizontally fixed in an upper part (upper side in FIG. 6) of the side wall 901 and partitions the upper space 905 and the processing space 904 which are internal spaces of the processing unit 91. An atmosphere introduction path 907 communicating with the upper end of the processing unit 91 from the lower surface of the upper base member 902 is provided near the center of the upper base member 902. Further, a fan filter unit 908 for supplying a clean atmosphere to the processing space 904 is provided near the upper end of the atmosphere introduction path 907. The fan filter unit 908 disposed in the atmosphere introduction path 907 in the upper space 905 introduces the atmosphere from an upper side of the processing unit 91, collects fine particles and the like in the atmosphere by a built-in HEPA filter or the like and then supplying the cleaned atmosphere into the processing space 904 located below.

The lower base member 903 is substantially horizontally fixed in a middle part (lower side in FIG. 6) of the side wall 901 and partitions between the processing space 904 and the lower space 906 which are internal spaces of the processing unit 91. The lower base member 903 is provided with a plurality of exhaust vents 909, which are connected to an unillustrated exhaust system to exhaust the atmosphere in the processing space 904 to the outside.

Here, the processing space 904 is a space in which the atmosphere is kept clean and cleaning of the substrate W and the like are performed. Further, the upper space 905 and the lower space 906 are spaces in which a drive source for driving the respective members disposed in the processing space 904 and the like are arranged.

The atmosphere supplied into the processing space 904 through the fan filter unit 908 flows downward from the upper side of the processing space 904 and is finally exhausted to the outside of the processing space 904 through the exhaust vents 909. In this way, fine particles of the liquids and the like produced in the respective steps of processing the substrate W to be described later are moved downward and exhausted from the exhaust vents 909 by an air stream flowing from up to down in the processing space 904. Thus, adhesion of these fine particles to the substrate W and the respective members in the processing space 904 can be prevented.

Figure 7:
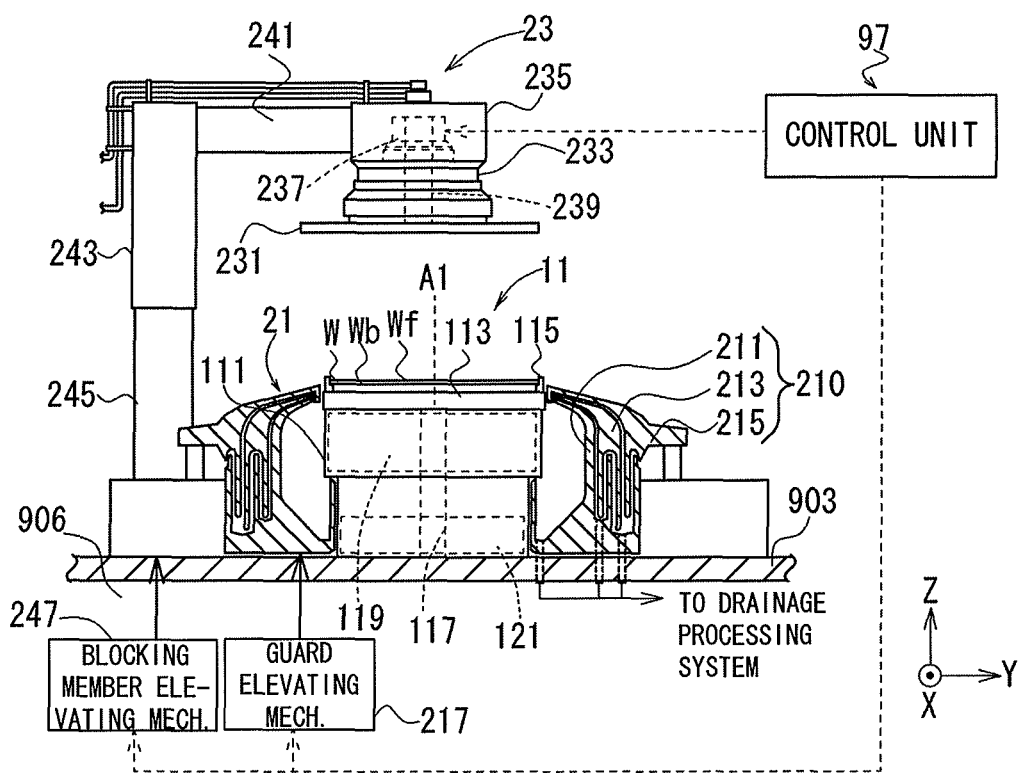
FIG. 7 is a diagram showing the construction of the substrate holder, the drainage collector and the atmosphere blocker in the processing unit of FIG. 6.

Next, the constructions of the substrate holder 11, the drainage collector 21 and the atmosphere blocker 23 are described using FIG. 7. FIG. 7 is a diagram showing the constructions of the substrate holder 11, the drainage collector 21 and the atmosphere blocker 23.

First, the substrate holder 11 is described. A base unit 111 of the substrate holder 11 is fixed on the lower base member 903, and a disc-shaped spin base 113 including an opening in a central part is rotatably and substantially horizontally supported above the base unit 111. The upper end of a center shaft 117 is fixed to the center of the lower surface of the spin base 113 by a fastening member such as a screw. Further, a plurality of substrate holding members 115 for gripping a peripheral edge part of the substrate W stand near the peripheral edge of the spin base 113. Three or more substrate holding members 115 may be provided to reliably hold the circular substrate W and are arranged at equal angular intervals along the peripheral edge of the spin base 113. Each substrate holding member 115 includes a substrate supporting portion for supporting the peripheral edge part of the substrate W from below and a substrate holding portion for holding the substrate W by pressing the outer peripheral end surface of the substrate W supported by the substrate supporting portion.

The respective substrate holding members 115 are coupled to an air cylinder in a substrate holding member driving mechanism 119 via known link mechanisms, sliding members or the like. Note that the substrate holding member driving mechanism 119 is disposed below the spin base 113 and in the base unit 111. Further, the substrate holding member driving mechanism 119 is electrically connected to the control unit 97. The air cylinder of the substrate holding member driving mechanism 119 extends or contracts in response to an operation command from the control unit 97 to the substrate holder 11, whereby the respective substrate holding members 115 are switchable between a "closed state" where the substrate holding portions thereof press the outer peripheral end surface of the substrate W and an "open state" where the substrate holding portions thereof are separated from the outer peripheral end surface of the substrate W. Note that, besides the air cylinder, a known drive source such as a motor or a solenoid can also be used as the drive source for the substrate holding members 115.

The respective substrate holding members 115 are set to the open state when the substrate W is transferred to the spin base 113 while being set to the closed state when the cleaning process and the like are performed on the substrate W. When being set to the closed state, the respective substrate holding members 115 grip the peripheral edge part of the substrate W and the substrate W is held in a substantially horizontal posture at a predetermined distance from the spin base 113. This causes the substrate W to be held with the top surface Wf thereof faced upward and the under surface Wb thereof faced downward. Note that, in this embodiment, a fine pattern is formed on the top surface Wf of the substrate W and the top surface Wf serves as a pattern forming surface.

A rotary shaft of a substrate rotating mechanism 121 including a motor is coupled to the center shaft 117 of the substrate holder 11. Note that the substrate rotating mechanism 121 is disposed above the lower base member 903 and in the base unit 111. Further, the substrate rotating mechanism 121 is electrically connected to the control unit 97. When the substrate rotating mechanism 121 is driven in response to an operation command from the control unit 97 to the substrate holder 11, the spin base 113 fixed to the center shaft 117 rotates about a central axis of rotation A1.

Note that a communicating hollow part is formed through the center shaft 117 from the upper surface of the spin base 113 to the lower space 906 so that a lower first supply pipe and a lower second supply pipe to be described later are insertable.

Next, the drainage collector 21 is described. A substantially annular cup 210 is provided around the substrate holder 11 and above the lower base member 903 to enclose the substrate W held on the substrate holder 11. The cup 210 has a substantially rotationally symmetrical shape with respect to the central axis of rotation A1 so as to be able to collect liquids and the like scattered from the substrate holder 11 and the substrate W. Note that a cross-sectional shape of the cup 210 is shown in FIG. 7 for explanation.

The cup 210 includes an inner structural member 211, a middle structural member 213 and an outer structural member 215 which are vertically movable independently of each other. As shown in FIG. 7, the middle structural member 213 and the outer structural member 215 are placed on the inner structural member 211. The inner structural member 211, the middle structural member 213 and the outer structural member 215 are respectively connected to a guard elevating mechanism 217 provided in the lower space 906 and including a known driving mechanism such as a motor and a ball screw. Further, the guard elevating mechanism 217 is electrically connected to the control unit 97. When the guard elevating mechanism 217 is driven in response to an operation command from the control unit 97 to the drainage collector 21, the inner structural member 211, the middle structural member 213 and the outer structural member 215 are respectively moved independently or a plurality of members are moved in synchronization in the vertical direction along the central axis of rotation A1.

The inner structural member 211 is provided with three collection grooves for introducing liquids respectively collected by the inner structural member 211, the middle structural member 213 and the outer structural member 215 to drainage processing systems respectively via different paths. The respective collection grooves are substantially concentrically provided about the central axis of rotation A1 and pipes connected to the unillustrated drainage processing systems are respectively connected to the respective collection grooves.

The cup 210 is used by combining the inner structural member 211, the middle structural member 213 and the outer structural member 215 respectively located at an upper or lower position. For example, the cup 210 is at a home position when the inner structural member 211, the middle structural member 213 and the outer structural member 215 are all at the lower position; at an outer collecting position when the inner structural member 211 and the middle structural member 213 are at the lower position and only the outer structural member 215 is at the upper position; at a middle collecting position when the inner structural member 211 is at the lower position and the middle structural member 213 and the outer structural member 215 are at the upper position; and at an inner collecting position when the inner structural member 211, the middle structural member 213 and the outer structural member 215 are all at the upper position.

The home position is set, such as when the center robot 96 loads or unloads the substrate W into or from the processing unit 91. The outer collecting position is a position where the liquid received by the outer structural member 215 is collected and introduced to the outer collection groove, the middle collecting position is a position where the liquid received by the middle structural member 213 is collected and introduced to the middle collection groove, and the inner collecting position is a position where the liquid received by the inner structural member 211 is collected and introduced to the inner collection groove.

By using the drainage collector 21 constructed as described above, it becomes possible to change the positions of the inner structural member 211, the middle structural member 213 and the outer structural member 215 and separately collect the liquids according to the liquids used for the process. By separating the respective liquids and exhausting them to the corresponding drainage processing systems, it becomes possible to reutilize the liquids and separately process a plurality of liquids which are dangerous to mix.

Next, the atmosphere blocker 23 is described. A blocking member 231 as a substrate facing member of the atmosphere blocker 23 is in the form of a disc including an opening in a central part. The lower surface of the blocking member 231 serves as a substrate facing surface facing the top surface Wf of the substrate W substantially in parallel, and is dimensioned to have a diameter equal to or larger than the diameter of the substrate W. The blocking member 231 is rotatably and substantially horizontally supported below a supporting shaft 233 having a hollow interior and a substantially cylindrical shape.

An upper end part of the supporting shaft 233 is fixed to the lower surface of a blocking member rotating mechanism 235 for rotating the blocking member 231. The blocking member rotating mechanism 235 includes, for example, a hollow motor 237 and a hollow shaft 239. One end (upper end in FIG. 7) of the hollow shaft 239 is coupled to a rotary shaft of the hollow motor 237, and the other end (lower end in FIG. 7) is coupled to the upper surface of the blocking member 231 through the interior of the supporting shaft 233. Further, the blocking member rotating mechanism 235 is electrically connected to the control unit 97. When the blocking member rotating mechanism 235 is driven in response to an operation command from the control unit 97 to the atmosphere blocker 23, the blocking member 231 is rotated about a vertical axis passing through the center of the supporting shaft 233. The blocking member rotating mechanism 235 is constructed to rotate the blocking member 231 in the same rotational direction and substantially at the same rotational speed as the substrate W according to the rotation of the substrate W held on the substrate holder 11.

Note that a communicating hollow part including the internal spaces of the hollow motor 237 and the hollow shaft 239 is formed from the upper surface of the blocking member rotating mechanism 235 to the opening in the central part of the blocking member 231, so that an upper first supply pipe and an upper second supply pipe to be described later are insertable.

One end of an arm 241 is connected to one side surface (left side surface in FIG. 7) of the blocking member rotating mechanism 235, and the other end thereof is connected to the vicinity of the upper end of a vertical shaft 243 in FIG. 7. The vertical shaft 243 is so attached to a cylindrical base member 245 located at a radially outer side of the cup 210 of the drainage collector 21 and fixed on the lower base member 903 as to be vertically movable. A blocking member elevating mechanism 247 including a known driving mechanism such as a motor and a ball screw is connected to the vertical shaft 243 through the interior of the base member 245.

Note that the blocking member elevating mechanism 247 is provided in the lower space 906. Further, the blocking member elevating mechanism 247 is electrically connected to the control unit 97. When the blocking member elevating mechanism 247 is driven in response to an operation command from the control unit 97 to the atmosphere blocker 23, the blocking member 231 is brought closer to or conversely away from the spin base 113.

That is, the control unit 97 controls the operation of the blocking member elevating mechanism 247 to elevate the blocking member 231 to a separated position above the substrate holder 11 in loading or unloading the substrate W into or from the processing unit 91. On the other hand, in performing a rinsing process, a drying process or the like on the substrate W, the blocking member 231 is lowered to a facing position set very close to the top surface Wf of the substrate W held on the substrate holder 11.

Next, the construction of the solidified material forming unit 31 is described using FIG. 8. FIG. 8 is a diagram showing the construction of the solidified material forming unit 31. A nozzle 311 for supplying a solidification liquid to the substrate W is so supported on a nozzle driving mechanism 313 disposed on the lower surface of the upper base member 902 as to be vertically movable and rotatable. A base member 315 of the nozzle driving mechanism 313 is fixed to extend downward from the lower surface of the upper base member 902 at the outer side of the atmosphere introduction path 907.

A rotary vertical shaft 317 is so supported below the base member 315 as to be vertically movable and rotatable. Note that the base member 315 has a substantially hollow cylindrical shape to connect a vertical driver 321 and a rotation driver 319 to be described later to the rotary vertical shaft 317. One end of an arm 323 is coupled to the lower surface of the rotary vertical shaft 317 and the nozzle 311 is mounted on the other end of the arm 323.

The rotary vertical shaft 317 is connected to the vertical driver 321 including a known driving mechanism such as a motor and a ball screw and the rotation driver 319 including a known driving mechanism such as a motor and a gear through the interior of the base member 315. Further, the vertical driver 321 and the rotation driver 319 are electrically connected to the control unit 97. Note that the vertical driver 321 and the rotation driver 319 are arranged in the upper space 905.

When the vertical driver 321 is driven in response to an operation command from the control unit 97 to the solidified material forming unit 31, the rotary vertical shaft 317 vertically moves to vertically move the nozzle 311 mounted on the arm 323. Further, when the rotation driver 319 is driven in response to the operation command from the control unit 97 to the solidified material forming unit 31, the rotary vertical shaft 317 rotates about a central axis of rotation A2 to rotate the arm 323, whereby the nozzle 311 mounted on the arm 323 is pivoted.

The nozzle 311 is connected to a first DIW supplier 333 via a pipe 335. Further, an on-off valve 337 is disposed in the pipe 335 and normally closed. Further, the on-off valve 337 is electrically connected to the control unit 97. When the on-off valve 337 is opened in response to an operation command from the control unit 97 to the solidified material forming unit 31, supercooled DIW is pressure-fed from the first DIW supplier 333 to the nozzle 311 via the pipe 335. Note that the first DIW supplier 333 may be provided in or outside the substrate processing apparatus 9.

Figure 9:
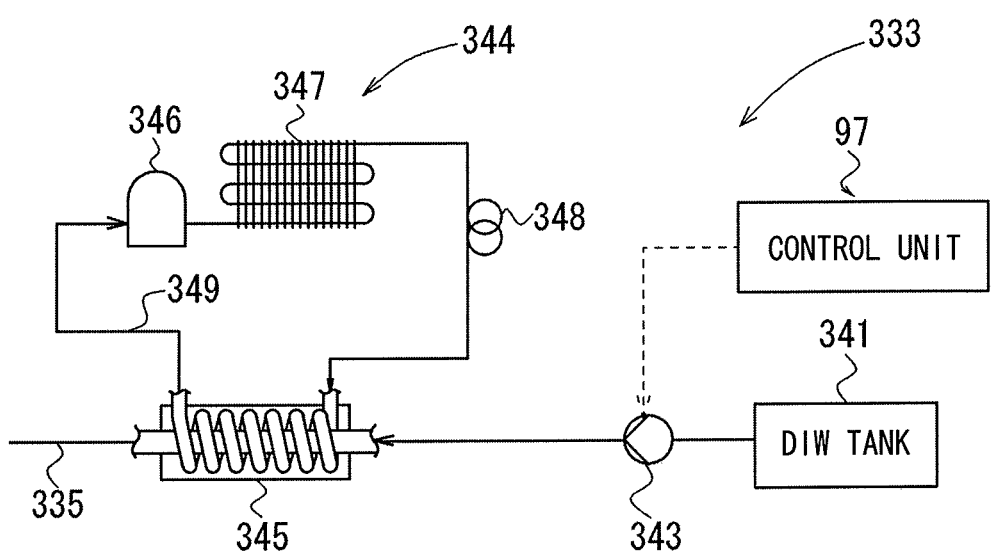
FIG. 9 is a diagram showing the construction of the first DIW supplier in the solidified material forming unit of FIG. 8.

FIG. 9 shows the construction of the first DIW supplier 333. The first DIW supplier 333 includes a DIW tank 341 for storing DIW, a pump 343 for pressure-feeding the DIW from the DIW tank 341 and a cooling unit 344 for cooling the DIW. The pump 343 connected to the DIW tank 341 via a pipe feeds the DIW to the cooling unit 344 while pressurizing it. The DIW supplied to the cooling unit 344 via the pump 343 is supercooled in the cooling unit 344 and supplied to the nozzle 311 via the pipe 335.

In this embodiment, a cooling apparatus with a refrigeration cycle using a gaseous refrigerant is used as the cooling unit 344. A gas such as HCFC (hydrochlorofluorocarbon), HFC (hydrofluorocarbon), carbon dioxide or ammonia is compressed by a compressor 346 and pressure-fed to a condenser 347 via a pipe 349. A refrigerant pressurized in the compressor 346 is cooled in the condenser 347 to become a high-pressure liquid and fed via the pipe 349 to a capillary tube 348 to be depressurized. The liquid depressurized in the capillary tube 348 is fed to an evaporator 345 via the pipe 349.

The evaporator 345 is structured such that the pipe 349 is spirally wound around the pipe 335. Vaporization heat is generated by vaporizing the refrigerant in the pipe 349 wound around the pipe 335 and the solidification liquid in the pipe 335 is deprived of heat to be cooled. The refrigerant vaporized in the evaporator 345 returns to the compressor 346 again via the pipe 349. The above cycle is repeatedly performed.

Note that although the cooling apparatus using the refrigeration cycle is used as the cooling unit 344 in this embodiment, a means for cooling the solidification liquid is not limited to this. That is, it is possible to use, as the cooling unit 344, a known cooling means such as an electrical cooling apparatus using a Peltier element or a cooling method for directly immersing the pipe 335 in a cooled refrigerant. Further, it is also possible to directly supply DIW from a factory utility side without providing the DIW tank 341 in the first DIW supplier 333. Note that the pump 343 of the first DIW supplier 333 constantly operates after the substrate processing apparatus 9 is started.

Figure 10:
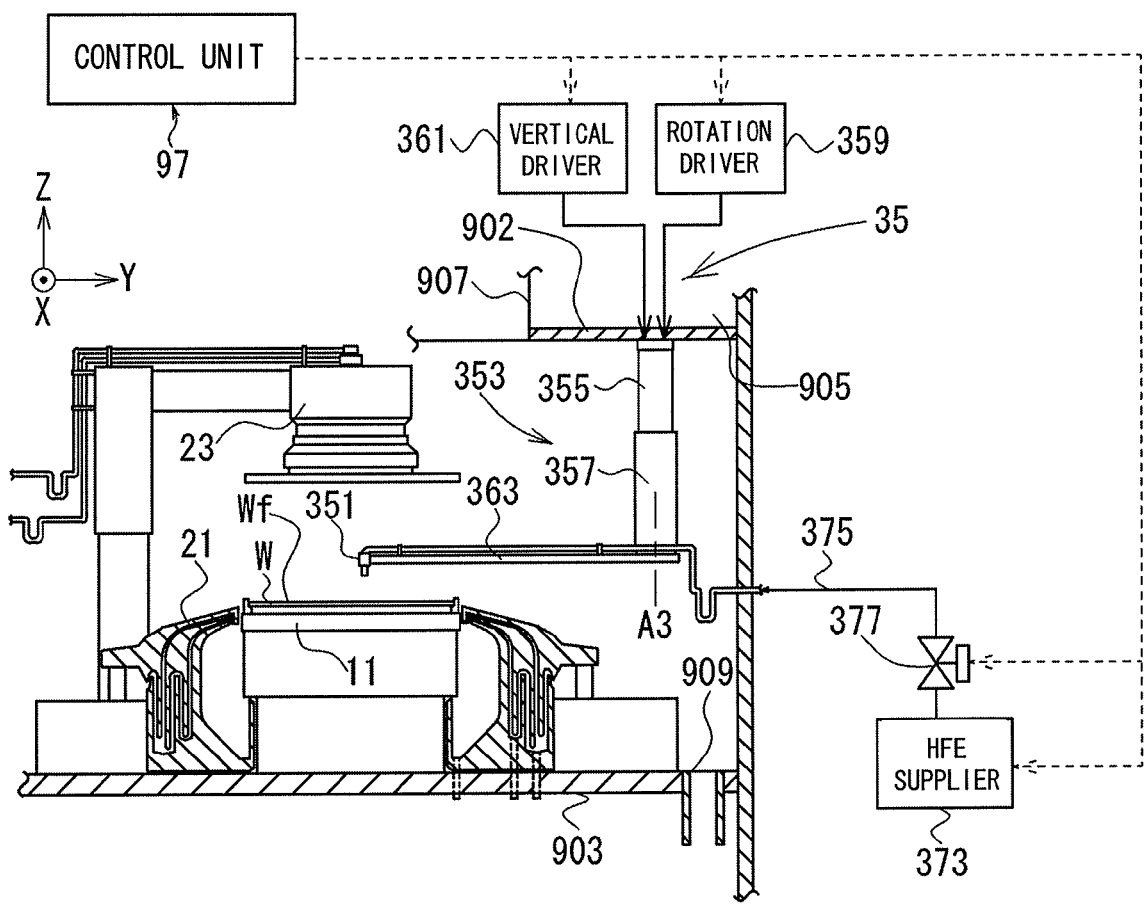
FIG. 10 is a diagram showing the construction of the surface cooler in the processing unit of FIG. 6.

Next, the construction of the surface cooler 35 is described using FIG. 10. FIG. 10 is a diagram showing the construction of the surface cooler 35. A nozzle 351 for supplying a liquid refrigerant to the substrate W is so supported on a nozzle driving mechanism 353 disposed on the lower surface of the upper base member 902 as to be vertically movable and rotatable. A base member 355 of the nozzle driving mechanism 353 is fixed to extend downward from the lower surface of the upper base member 902 at the outer side of the atmosphere introduction path 907.

A rotary vertical shaft 357 is so supported below the base member 355 as to be vertically movable and rotatable. Note that the base member 355 has a substantially hollow cylindrical shape to connect a vertical driver 361 and a rotation driver 359 to be described later to the rotary vertical shaft 357. One end of an arm 363 is coupled to the lower surface of the rotary vertical shaft 357 and the nozzle 351 is mounted on the other end of the arm 363.

The rotary vertical shaft 357 is connected to the vertical driver 361 including a known driving mechanism such as a motor and a ball screw and the rotation driver 359 including a known driving mechanism such as a motor and a gear through the interior of the base member 355. Further, the vertical driver 361 and the rotation driver 359 are electrically connected to the control unit 97. Note that the vertical driver 361 and the rotation driver 359 are arranged in the upper space 905.

When the vertical driver 361 is driven in response to an operation command from the control unit 97 to the surface cooler 35, the rotary vertical shaft 357 vertically moves to vertically move the nozzle 351 mounted on the arm 363. Further, when the rotation driver 359 is driven in response to the operation command from the control unit 97 to the surface cooler 35, the rotary vertical shaft 357 rotates about a central axis of rotation A3 to rotate the arm 363, whereby the nozzle 351 mounted on the arm 363 is pivoted.

The nozzle 351 is connected to a HFE supplier 373 via a pipe 375. Further, an on-off valve 377 is disposed in the pipe 375 and normally closed. Further, the on-off valve 377 is electrically connected to the control unit 97. When the on-off valve 377 is opened in response to an operation command from the control unit 97 to the surface cooler 35, low-temperature HFE is pressure-fed from the HFE supplier 373 to the nozzle 351 via the pipe 375. Note that the HFE supplier 373 may be provided in or outside the substrate processing apparatus 9.

Figure 11:
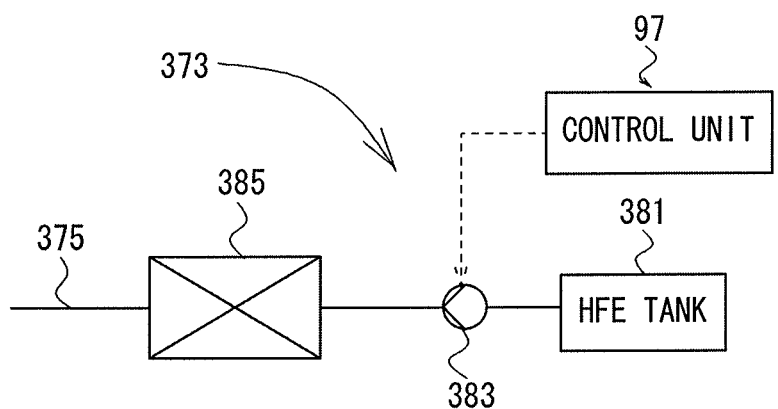
FIG. 11 is a diagram showing the construction of the HFE supplier in the surface cooler of FIG. 10.

FIG. 11 shows the construction of the HFE supplier 373. The HFE supplier 373 includes a HFE tank 381 for storing HFE, a pump 383 for pressure-feeding the HFE from the HFE tank 381 and a temperature regulation unit 385 for regulating the temperature of the HFE. The pump 383 connected to the HFE tank 381 via a pipe feeds the HFE to the temperature regulation unit 385 while pressurizing it. The HFE supplied to the temperature regulation unit 385 via the pump 383 is cooled in the temperature regulation unit 385 and supplied to the nozzle 351 via the pipe 375.

Here, a known temperature regulator such as a temperature regulator using a Peltier element or a heat exchanger using a refrigerant can be used as the temperature regulation unit 385. Further, it is also possible to directly supply HFE from a factory utility side without providing the HFE tank 381 in the HFE supplier 373. Note that the pump 383 of the HFE supplier 373 constantly operates after the substrate processing apparatus 9 is started.

Figure 12:
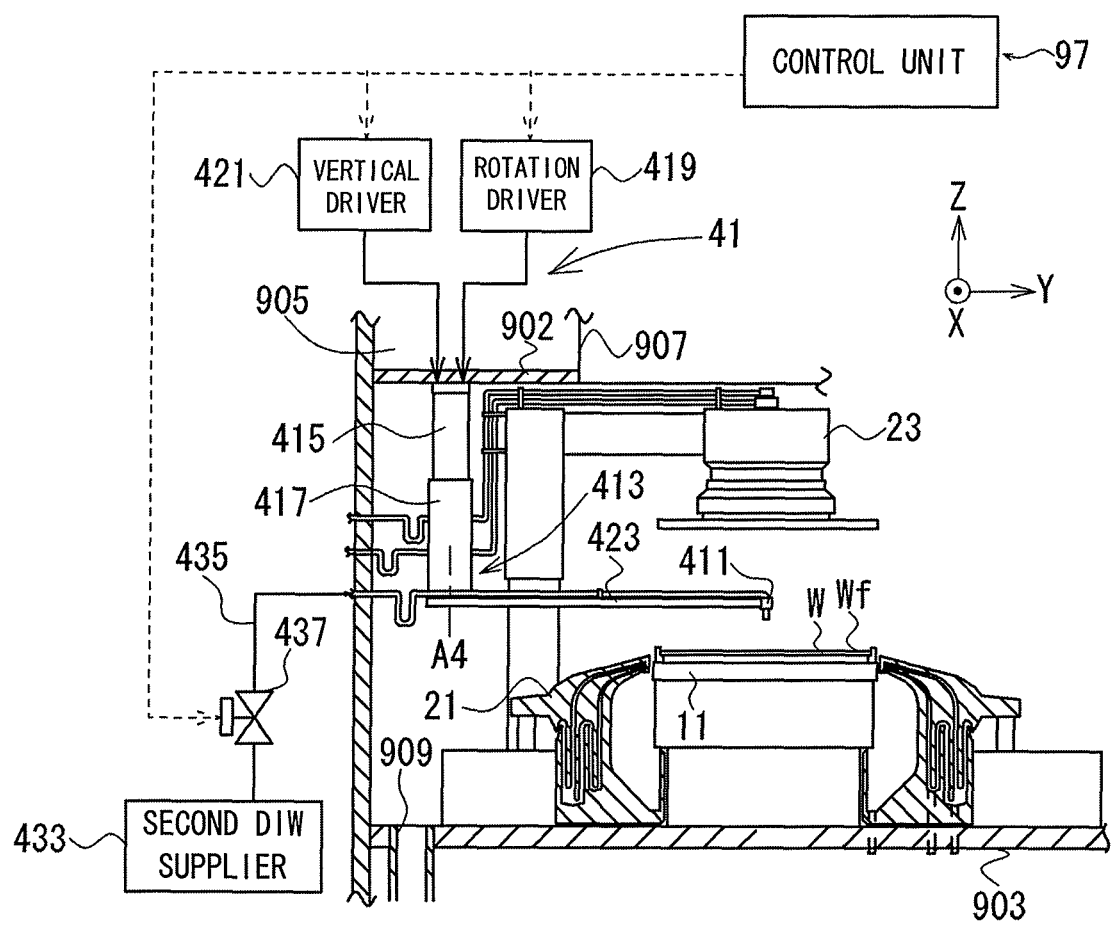
FIG. 12 is a diagram showing the construction of the melter in the processing unit of FIG. 6.

Next, the construction of the melter 41 is described using FIG. 12. FIG. 12 is a diagram showing the construction of the melter 41. A nozzle 411 for supplying a melting liquid to the substrate W is so supported on a nozzle driving mechanism 413 disposed on the lower surface of the upper base member 902 as to be vertically movable and rotatable. A base member 415 of the nozzle driving mechanism 413 is fixed to extend downward from the lower surface of the upper base member 902 at the outer side of the atmosphere introduction path 907.

A rotary vertical shaft 417 is so supported below the base member 415 as to be vertically movable and rotatable. Note that the base member 415 has a substantially hollow cylindrical shape to connect a vertical driver 421 and a rotation driver 419 to be described later to the rotary vertical shaft 417. One end of an arm 423 is coupled to the lower surface of the rotary vertical shaft 417 and the nozzle 411 is mounted on the other end of the arm 423.

The rotary vertical shaft 417 is connected to the vertical driver 421 including a known driving mechanism such as a motor and a ball screw and the rotation driver 419 including a known driving mechanism such as a motor and a gear through the interior of the base member 415. Further, the vertical driver 421 and the rotation driver 419 are electrically connected to the control unit 97. Note that the vertical driver 421 and the rotation driver 419 are arranged in the upper space 905.

When the vertical driver 421 is driven in response to an operation command from the control unit 97 to the melter 41, the rotary vertical shaft 417 vertically moves to vertically move the nozzle 411 mounted on the arm 423. Further, when the rotation driver 419 is driven in response to the operation command from the control unit 97 to the melter 41, the rotary vertical shaft 417 rotates about a central axis of rotation A4 to rotate the arm 423, whereby the nozzle 411 mounted on the arm 423 is pivoted.

The nozzle 411 is connected to a second DIW supplier 433 via a pipe 435. Further, an on-off valve 437 is disposed in the pipe 435 and normally closed. Further, the on-off valve 437 is electrically connected to the control unit 97. When the on-off valve 437 is opened in response to an operation command from the control unit 97 to the melter 41, DIW is pressure-fed from the second DIW supplier 433 to the nozzle 411 via the pipe 435. Note that the second DIW supplier 433 may be provided in or outside the substrate processing apparatus 9.

FIG. 13 shows the construction of the second DIW supplier 433. The second DIW supplier 433 includes a DIW tank 441 for storing DIW, a pump 443 for pressure-feeding the DIW from the DIW tank 441 and a temperature regulation unit 445 for regulating the temperature of the DIW. The pump 443 connected to the DIW tank 441 via a pipe feeds the DIW to the temperature regulation unit 445 while pressurizing it. The DIW supplied to the temperature regulation unit 445 via the pump 443 is temperature-regulated in the temperature regulation unit 445 and supplied to the nozzle 411 via the pipe 435.

Here, a known temperature regulator such as a temperature regulator using a Peltier element or a heat exchanger using a refrigerant can be used as the temperature regulation unit 485. Further, it is also possible to directly supply DIW from a factory utility side without providing the DIW tank 441 in the second DIW supplier 433. Note that the pump 443 of the second DIW supplier 433 constantly operates after the substrate processing apparatus 9 is started.

Figure 14:
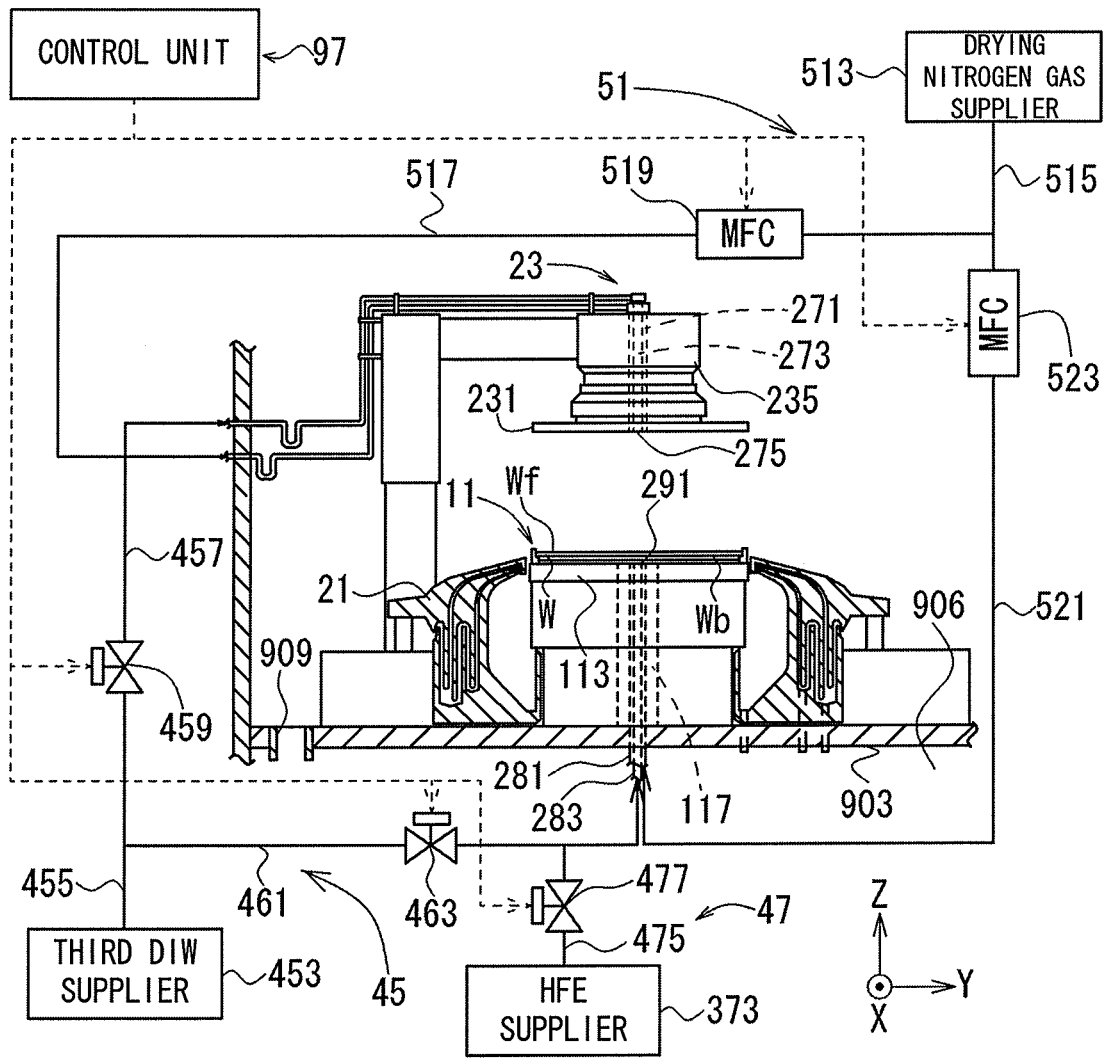
FIG. 14 is a diagram showing the constructions of the rinser, the drying gas supplier and the under surface cooler in the processing unit of FIG. 6.

Next, the constructions of the rinser 45, the under surface cooler 47 and the drying gas supplier 51 are described using FIG. 14. FIG. 14 is a diagram showing the constructions of the rinser 45, the under surface cooler 47 and the drying gas supplier 51. The rinser 45 is for supplying the rinsing liquid toward the substrate top surface Wf and the substrate under surface Wb, the under surface cooler 47 is for supplying the refrigerant to the substrate under surface Wb and the drying gas supplier 51 is for supplying a drying gas toward the substrate top surface Wf and the substrate under surface Wb.

First, a pipe construction at the side of the substrate top surface Wf is described. An upper first supply pipe 271 is inserted into the interior of the hollow part communicating from the upper surface of the blocking member rotating mechanism 235 of the atmosphere blocker 23 described above to the opening in the central part of the blocking member 231. An upper second supply pipe 273 is inserted into the upper first supply pipe 271, thereby forming a so-called double tube structure. Lower end parts of the upper first and second supply pipes 271, 273 extend up to the opening of the blocking member 231, and a nozzle 275 is provided on the leading end of the upper second supply pipe 273.

Next, a pipe construction at the side of the substrate under surface Wf is described. A lower first supply pipe 281 is inserted into the interior of a communication space extending from the upper surface of the spin base 113 of the substrate holder 11 described above to the lower space 906 through the center shaft 117. A lower second supply pipe 283 is inserted into the lower first supply pipe 281, thereby forming a so-called double tube structure. Upper end parts of the lower first and second supply pipes 281, 283 extend up to the opening of the spin base 113, and a nozzle 291 is provided on the leading end of the lower second supply pipe 283.

Next, the rinser 45 is described. The rinser 45 supplies the rinsing liquid respectively to the substrate top surface Wf and the substrate under surface Wb from a third DIW supplier 453 as a supply source of the rinsing liquid. One end of a main pipe 455 is connected to the third DIW supplier 453 including an unillustrated DIW tank, a temperature regulation unit and a pump. The other end of the main pipe 455 is branched off into an upper branch pipe 457 and a lower branch pipe 461, wherein the upper branch pipe 457 is connected to the upper second supply pipe 273 and the lower branch pipe 461 is connected to the lower second supply pipe 283. Further, the pump of the third DIW supplier 453 constantly operates after the substrate processing apparatus 9 is started.

An on-off valve 459 is disposed in the upper branch pipe 457 and normally closed. Further, the on-off valve 459 is electrically connected to the control unit 97. When the on-off valve 459 is opened in response to an operation command from the control unit 97 to the rinser 45, the DIW is supplied to the substrate top surface Wf from the third DIW supplier 453 through the nozzle 275 via the main pipe 455, the upper branch pipe 457 and the upper second supply pipe 273.

An on-off valve 463 is disposed in the lower branch pipe 461 and normally closed. Further, the on-off valve 463 is electrically connected to the control unit 97. When the on-off valve 463 is opened in response to an operation command from the control unit 97 to the rinser 45, the DIW is supplied to the substrate top surface Wf from the third DIW supplier 453 through the nozzle 291 via the main pipe 455, the lower branch pipe 461 and the lower second supply pipe 283.

The third DIW supplier 453, the main pipe 455, the upper branch pipe 457, the lower branch pipe 461, the on-off valves 459 and 463, the upper second supply pipe 273, the lower second supply pipe 283, and the nozzles 275 and 291 construct the rinser 45. Note that the third DIW supplier 453 may be provided in or outside the substrate processing apparatus 9.

Next, the under surface cooler 47 is described. The under surface cooler supplies the HFE as a liquid coolant to the substrate under surface Wb from the HFE supplier 373. A pipe 475 having one end connected to the HFE supplier 373 has the other end connected to join the lower branch pipe 461 between the on-off valve 463 and the lower second supply pipe 283.

An on-off valve 477 is disposed in the pipe 475 and normally closed. Further, the on-off valve 477 is electrically connected to the control unit 97. When the on-off valve 477 is opened in response to an operation command from the control unit 97 to the under surface cooler 47, the HFE is supplied to the substrate under surface Wb from the HFE supplier 373 through the nozzle 291 via the pipe 475, the lower branch pipe 461 and the lower second supply pipe 283.

Next, the drying gas supplier 51 is described. The drying gas supplier 51 supplies the drying gas respectively to the substrate top surface Wf and the substrate under surface Wb from a drying nitrogen gas supplier 513 as a supply source of the drying gas. One end of a main pipe 515 is connected to the drying nitrogen gas supplier 513 including an unillustrated nitrogen gas tank and a pump. The other end of the main pipe 515 is branched off into an upper branch pipe 517 and a lower branch pipe 521, wherein the upper branch pipe 517 is connected to the upper first supply pipe 271 and the lower branch pipe 521 is connected to the lower first supply pipe 281. Further, the pump of the drying nitrogen gas supplier 513 constantly operates after the substrate processing apparatus 9 is started.

A mass flow controller 519 is disposed in the upper branch pipe 517. The mass flow controller 519 is electrically connected to the control unit 97. When the mass flow controller 519 is opened to attain a predetermined flow rate in response to an operation command from the control unit 97 to the drying gas supplier 51, a normal-temperature nitrogen gas is supplied to the substrate top surface Wf via the main pipe 515, the upper branch pipe 517 and the upper first supply pipe 271.

A mass flow controller 523 is disposed in the lower branch pipe 521. The mass flow controller 523 is electrically connected to the control unit 97. When the mass flow controller 523 is opened to attain a predetermined flow rate in response to an operation command from the control unit 97 to the drying gas supplier 51, a normal-temperature nitrogen gas is supplied to the substrate under surface Wb via the main pipe 515, the lower branch pipe 521 and the lower first supply pipe 281.

The drying nitrogen gas supplier 513, the main pipe 515, the upper branch pipe 517, the lower branch pipe 521, the mass flow controllers 519 and 523, the upper first supply pipe 271, and the lower first supply pipe 281 construct the drying gas supplier 51. Note that the drying nitrogen gas supplier 513 may be provided in or outside the substrate processing apparatus 9.

The control unit 97 includes a CPU for performing various arithmetic processings, a ROM which is a read-only memory storing a basic program, a RAM which is a read and write memory storing various pieces of information and a magnetic disc storing control software, data and the like. Cleaning conditions corresponding to substrates W are stored as a cleaning program (also called a recipe) in the magnetic disc. The CPU reads the content of the cleaning program and writes it in the RAM, and controls the respective components of the substrate processing apparatus 9 in accordance with the content of the cleaning program written in the RAM. Note that the operation unit 971 (see FIG. 3) used to prepare/change the cleaning program or select a desired one out of a plurality of cleaning programs is connected to the control unit 97.

Figure 15:
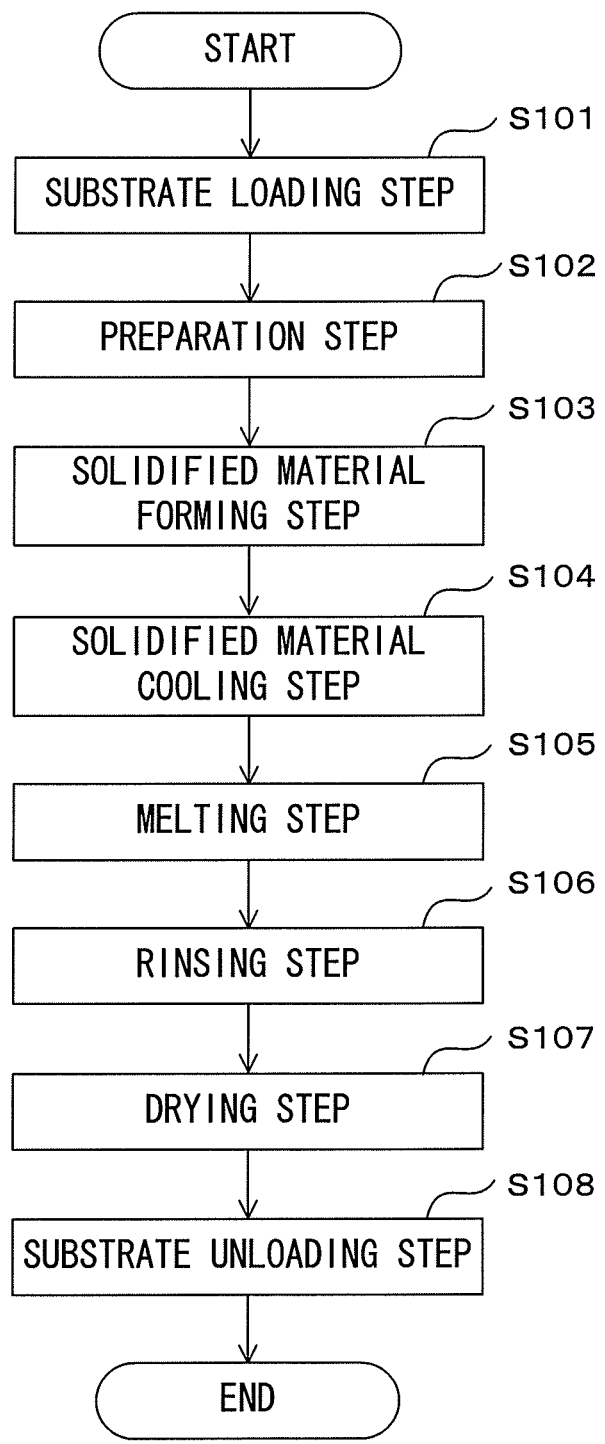
FIG. 15 is a flowchart showing the movements of the substrate processing apparatus according to a first embodiment.
Figure 16:
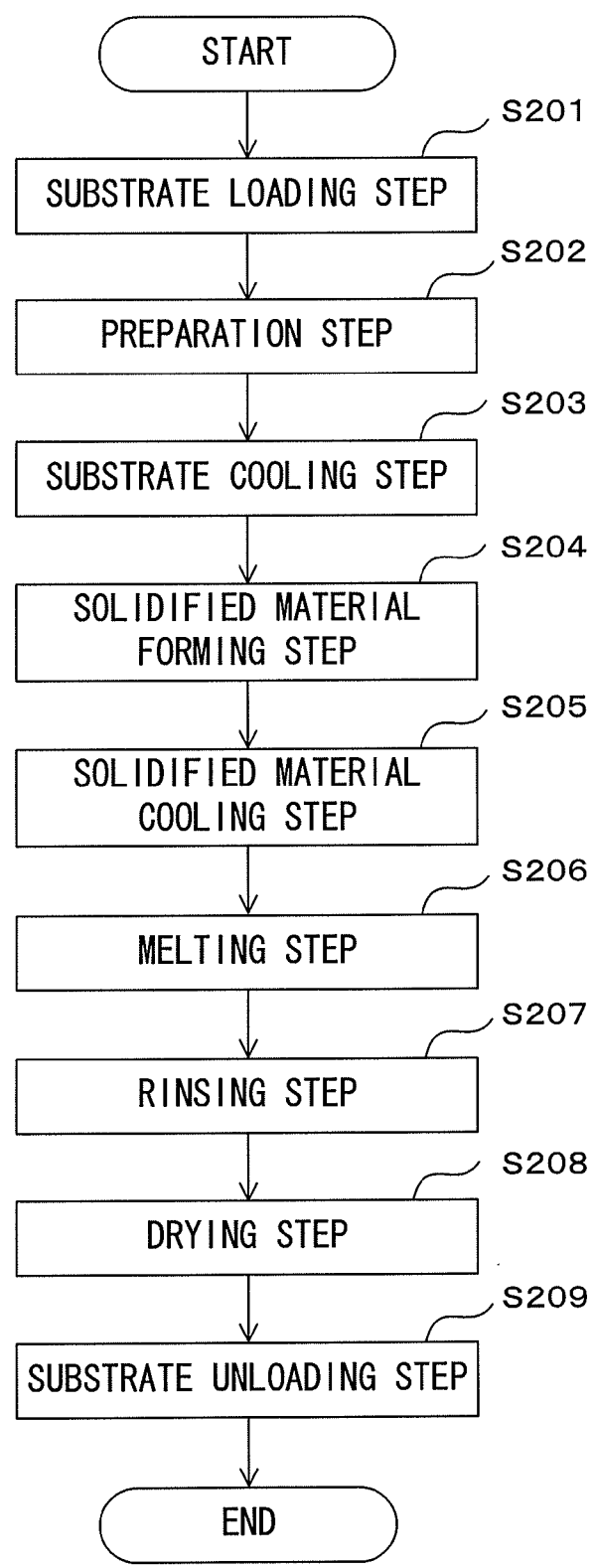
FIG. 16 is a flowchart showing the movements of the substrate processing apparatus according to a second embodiment.

Next, a cleaning operation in the substrate processing apparatus 9 constructed as described above is described with reference to FIG. 15. FIG. 15 is a flow chart showing the overall operation of the substrate processing apparatus 9. Note that unless otherwise specified in the following description, it is assumed that the atmosphere blocker 23 rotates the blocking member 231 substantially at the same number of rotations in a direction in which a substrate rotator 13 of the substrate holder 11 rotates the spin base 113 when the blocking member 231 is at the facing position.

First, the cleaning program corresponding to specified substrates W is selected by the operation unit 971 and instructed to be executed. Thereafter, as a preparation for loading the substrate W into the processing unit 91, the following operations are performed in response to an operation command from the control unit 97.

That is, the atmosphere blocker 23 stops the rotation of the blocking member 231 and the substrate holder 11 stops the rotation of the spin base 113. The atmosphere blocker 23 moves the blocking member 231 to the separated position and the substrate holder 11 positions the spin base 113 to a position suitable for the transfer of the substrate W. Further, the drainage collector 21 positions the cup 210 to the home position. After the spin base 113 is positioned to the position suitable for the transfer of the substrate W, the substrate holder 11 sets the substrate holding members 115 in the open state.

Further, the solidified material forming unit 31 moves the nozzle 311 to a retracted position (position where the nozzle 311 is retracted radially outwardly of the cup 210). Further, the surface cooler 35 moves the nozzle 351 to a retracted position (position where the nozzle 351 is retracted radially outwardly of the cup 210). Further, the melter 41 moves the nozzle 411 to a retracted position (position where the nozzle 411 is retracted radially outwardly of the cup 210). Furthermore, the on-off valves 337, 377, 437, 459, 463 and 477 are closed. Further, the mass flow controllers 519 and 523 are set to a flow rate of 0 (zero).

After the preparation for loading the substrate W into the processing unit 91 is completed, a substrate loading step of loading an unprocessed substrate W into the processing unit 91 is performed (Step S101). That is, the indexer robot 931 takes out a substrate W at the predetermined position of the FOUP 949 on the opener 94 by the lower hand 933 and transfers it to the lower hand 951 of the shuttle 95. Thereafter, the lower hand 951 of the shuttle 95 is moved toward the center robot 96, and the center robot 96 picks up the substrate W on the lower hand 951 of the shuttle 95 by the lower hand 961.

Thereafter, the shutter 911 of the processing unit 91 is opened and the center robot 96 extends the lower hand 961 into the processing unit 91 and places the substrate W on the substrate supporting portions of the substrate holding members 115 of the substrate holder 11. When the loading of the substrate W into the processing unit 91 is finished, the center robot 96 contracts the lower hand 961 to the outside of the processing unit 91 and the shutter 91 is closed.

When the unprocessed substrate W is loaded into the processing unit 91 and placed on the substrate supporting portions of the substrate holding members 115, the substrate holding member driving mechanism 119 sets the substrate holding members 115 in the closed state in response to an operation command from the control unit 97 to the substrate holder 11.

Subsequently, a preparation step of preparing the DIW as the solidification liquid in an supercooled state (Step S102) is performed. Note that this preparation step needs not necessarily be performed after the substrate loading step is finished and may be performed in parallel with the substrate loading step or before the substrate loading step.

Subsequently, a solidified material forming step of forming a solidified material of the solidification liquid on the substrate top surface Wf (Step S103) is performed. First, the substrate rotating mechanism 121 changes the number of rotations of the spin base 113 and maintains this number of rotations during the solidified material forming step in response to an operation command from the control unit 97 to the substrate holder 11. Further, the cup 210 is positioned to the inner collecting position in response to an operation command from the control unit 97 to the drainage collector 21. Note that the blocking member 231 of the atmosphere blocker 23 is kept at the separated position.

The number of rotations of the substrate W in the solidified material forming step is preferably set at 50 to 300 rpm so that the DIW as the solidification liquid supplied to the substrate top surface Wf can stably form the solidified material. In the following description, the number of rotations of the substrate W in the solidified material forming step is set at 80 rpm.

Further, the nozzle driving mechanism 313 positions the nozzle 311 to a position above the vicinity of the center of the substrate top surface Wf in response to an operation command from the control unit 97 to the solidified material forming unit 31. After the positioning of the nozzle 311 is completed, the on-off valve 337 is opened in response to an operation command from the control unit 97 to the solidified material forming unit 31. This causes the solidification liquid to be supplied from the first DIW supplier 333 to the vicinity of the center of the substrate top surface Wf through the nozzle 311 via the pipe 335.

Note that the DIW as the solidification liquid is preferably temperature-regulated to − (minus) 5° C. (Celsius) to 0° C. (Celsius) so that the DIW as the solidification liquid supplied in the supercooled state to the substrate top surface Wf can stably form the solidified material and is not solidified in the pipe before being supplied to the substrate top surface Wf. In the following description, the temperature of the solidification liquid is set at − (minus) 5° C. (Celsius).

In order for molecules constituting a liquid to transition to a crystallization process (phase transition of the first kind), a microscopic phase as a nucleus (seed crystal or the like in the case of a liquid) is necessary. In supercooling, development of a microscopic phase is insufficient and a phase transition is not carried out if it is left as it is. Contrary to this, if a certain physical stimulus (vibration or the like) is applied to a liquid in an supercooled state, a temperature distribution in the liquid fluctuates, the liquid locally reaches a low temperature to generate a seed crystal, and crystallization rapidly progresses using this seed crystal as a nucleus (inoculative freezing). For example, a phenomenon in which supercooled water in a bottle is rapidly frozen only by being hit and, if it is attempted to transfer the water into another container, it is frozen to form a column-like ice while being poured falls under the inoculative freezing.

In the case of this embodiment, the solidification liquid discharged from the nozzle 311 is solidified by a landing impact on the substrate top surface Wf to form the solidified material of the solidification liquid on the substrate top surface Wf. Note that if the solidification liquid is formulated to form the solidified material on the substrate top surface Wf, crystallization of the supercooled solidification liquid is started not only on the substrate top surface Wf, but may be started also in the process before reaching the substrate W. In a state where the nozzle 311 remains stationary above the vicinity of the center of the substrate top surface Wf, the solidified material of the solidification liquid is concentrated near the position right below the nozzle 311. Accordingly, in the solidified material forming step, the solidification liquid is preferably discharged while the nozzle 311 is moved above the rotating substrate W.

That is, after the discharge of the solidification liquid from the nozzle 311 is started, the nozzle driving mechanism 313 moves the nozzle 311 from the position above the vicinity of the center of the substrate top surface Wf to a position above the vicinity of the peripheral edge in response to an operation command from the control unit 97 to the solidified material forming unit 31. In this way, the nozzle 311 discharges the solidification liquid while moving from the position above the vicinity of the center to the position above the vicinity of the peripheral edge above the rotating substrate W, whereby the solidification liquid can be discharged to the entire substrate top surface Wf and, as a result, the solidified material of the solidification liquid can be formed on the entire substrate top surface Wf.

Since the solidified material of the solidification liquid is formed in a concentrated manner in the vicinity right below the nozzle 311, the thickness of the solidified material of the solidification liquid, which is formed on respective parts of the substrate top surface Wf, can be changed by changing the amount of the solidification liquid supplied to the substrate top surface Wf from the nozzle 311.

That is, as described above, the thickness of the solidified material of the solidification liquid can be changed by changing the amount of the solidification liquid discharged from the nozzle 311 with a moving speed of the nozzle 311 kept constant or by changing the moving speed of the nozzle 311 with the amount of the solidification liquid discharged from the nozzle 311 kept constant while the nozzle 311 is moved from the position above the vicinity of the center of the substrate top surface Wf to the position above the vicinity of the peripheral edge while discharging the solidification liquid. By changing the thickness of the solidified material of the solidification liquid formed on the substrate top surface Wf in this way, a cleaning ability can be changed as described above (see FIG. 2).

Figure 1:
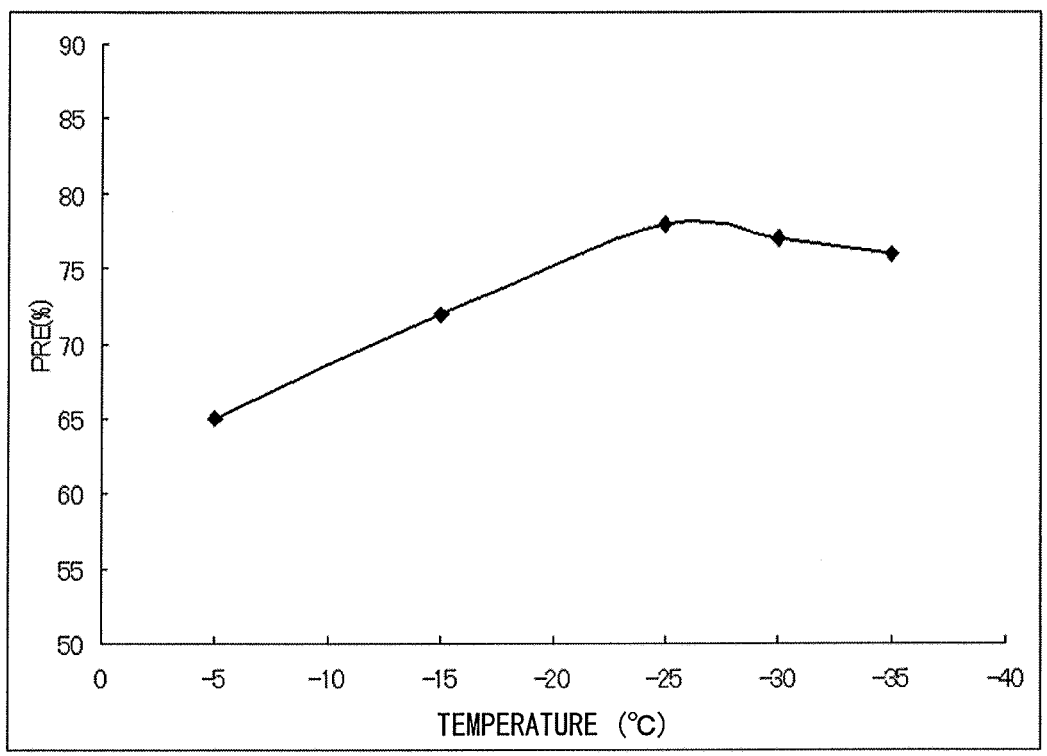
FIG. 1 is a graph showing a relationship between frozen liquid film temperature and particle removal efficiency in a freeze cleaning technology.

The vicinity of the peripheral edge of the substrate W is low in cooling efficiency as compared with the vicinity of the center of the substrate W since the vicinity of the peripheral edge of the substrate W is distant from the nozzle 291 that discharges the liquid coolant toward the substrate under surface Wb in the substrate cooling step descried above and an area to be cooled is larger than the vicinity of the center. In addition, in the vicinity of the peripheral edge of the substrate W, temperature is likely to increase due to the influence of the atmosphere flowing down from above in the processing unit 91. Thus, the temperature of the solidified material of the solidification liquid formed on the substrate top surface Wf is more likely to increase and the cleaning ability may be lower in the vicinity of the peripheral edge part than in the vicinity of the central part of the substrate W (see FIG. 1).

Thus, it is preferable to prevent a reduction in the cleaning ability by increasing the thickness of the solidified material of the solidification liquid in the vicinity of the outer peripheral part of the substrate W than in the vicinity of the central part. Note that if the thickness of the solidified material of the solidification liquid is large, thermal capacity increases and temperature is unlikely to increase, wherefore a temperature increase caused by heat absorption from the atmosphere can also be suppressed and a reduction in the cleaning ability can be prevented in this respect as well.

The volume of the DIW as the solidification liquid increases as the DIW is solidified to become ice (if water of 0° C. (Celsius) becomes ice of 0° C. (Celsius), the volume thereof increases approximately by 10%). Accordingly, the DIW having penetrated between the substrate top surface Wf and particles and the like is solidified to expand, whereby the particles and the like are separated from the substrate top surface Wf by an infinitesimal distance. As a result, adhesion between the substrate top surface Wf and the particles and the like is reduced and, further, the particles and the like are detached from the substrate W. By expanding also in a direction parallel to the substrate top surface Wf, the particles and the like adhering to the substrate W can be separated. In this way, ice as the solidified material of the DIW is removed and the particles and the like are also removed by a removing step to be described later.

After the solidified material of the solidification liquid is formed over the entire substrate top surface Wf, the on-off valve 337 is closed in response to an operation command from the control unit 97 to the solidified material forming unit 31. Further, the nozzle driving mechanism 313 positions the nozzle 311 to the retracted position (position where the nozzle 311 is retracted radially outwardly of the cup 210) in response to the operation command from the control unit 97 to the solidified material forming unit 31.

Subsequently, a solidified material cooling step of supplying the liquid coolant to the substrate top surface Wf (Step S104) is performed. First, the substrate rotating mechanism 121 changes the number of rotations of the spin base 113 and maintains this number of rotations during the solidified material cooling step in response to an operation command from the control unit 97 to the substrate holder 11. Further, the cup 210 is positioned to the middle collecting position in response to an operation command from the control unit 97 to the drainage collector 21. Note that the blocking member 231 of the atmosphere blocker 23 is kept at the separated position.

The number of rotations of the substrate W in the solidified material cooling step is preferably set at 300 to 900 rpm so that the liquid coolant supplied to the substrate top surface Wf can spread over the entire substrate top surface Wf. In the following description, the number of rotations of the substrate W in the solidified material cooling step is set at 400 rpm.

Further, the nozzle driving mechanism 353 positions the nozzle 351 to a position above the vicinity of the center of the substrate top surface Wf in response to an operation command from the control unit 97 to the surface cooler 35. After the positioning of the nozzle 351 is completed, the on-off valve 377 is opened in response to an operation command from the control unit 97 to the surface cooler 35. This causes the liquid coolant to be supplied from the HFE supplier 373 to the vicinity of the center of the substrate top surface Wf through the nozzle 351 via the pipe 375.

Note that the HFE as the liquid coolant is preferably temperature-regulated to – (minus) 40° C. (Celsius) to – (minus) 10° C. (Celsius) to improve the cleaning ability by reducing the temperature of the solidified material of the solidification liquid on the substrate top surface Wf. In the following description, the temperature of the HFE as the liquid coolant is set at – (minus) 20° C. (Celsius).

The liquid coolant supplied to the vicinity of the center of the substrate top surface Wf flows from the center to the peripheral edge part of the substrate W due to a centrifugal force produced by the rotation of the substrate W and spreads over the entire substrate top surface Wf. This enables the temperature of the entire solidified material of the solidification liquid formed on the substrate top surface Wf to be reduced.

Note that the liquid coolant supplied to the substrate top surface Wf in the solidified material cooling step flows from the center to the peripheral edge part of the substrate W and is scattered out of the substrate due to the centrifugal force produced by the rotation of the substrate W, thereby being collected and drained by the drainage collector 21. The collected liquid coolant contains the solidification liquid in the liquid state remaining on the substrate. However, since the HFE as the liquid coolant does not dissolve into the DIW as the solidification liquid, it is possible to separate, collect and reutilize only the liquid coolant. This point holds also for the liquid coolant used in the substrate cooling step described above.

Further, although the liquid coolant is supplied while the nozzle 351 remains stationary at the position above the vicinity of the center of the substrate top surface Wf in this embodiment, the method for cooling the substrate top surface Wf is not limited to this. That is, after the supply of the liquid coolant to the substrate top surface Wf from the nozzle 351 is started, the nozzle driving mechanism 353 moves the nozzle 351 from the position above the vicinity of the center of the substrate top surface Wf to the position above the vicinity of the peripheral edge in response to an operation command from the control unit 97 to the surface cooler 35. This enables the liquid coolant to be evenly supplied to the entire substrate top surface Wf.

Note that since temperature is more likely to increase in the vicinity of the peripheral edge part of the substrate W than in the vicinity of the center as described above, the vicinity of the peripheral edge part of the substrate W may be more strongly cooled by stopping the nozzle 351 at the position above the vicinity of the peripheral edge part and continuing the discharge of the liquid coolant for a predetermined time after the nozzle 351 is moved from the position above the vicinity of the center of the substrate top surface Wf to the position above the vicinity of the peripheral edge. This can make the cleaning ability even.

After the liquid coolant spreads over the entire substrate top surface Wf, the on-off valve 377 is closed in response to an operational command from the control unit 97 to the surface cooler 35. Further, the nozzle driving mechanism 353 positions the nozzle 351 to the retracted position (position where the nozzle 351 is retracted radially outwardly of the cup 210) in response to the operation command from the control unit 97 to the surface cooler 35.

Subsequently, a melting step as a removing step of melting and removing the solidified material of the DIW as the solidification liquid formed on the substrate top surface Wf (Step S105) is performed. First, in response to an operation command from the control unit 97 to the substrate holder 11, the substrate rotating mechanism 121 changes the number of rotations of the spin base 113 and maintains this number of rotations during the melting step. Further, the cup 210 is positioned to the inner collecting position in response to an operation command from the control unit 97 to the drainage collector 21. Note that the blocking member 231 of the atmosphere blocker 23 is kept at the separated position.

The number of rotations of the substrate W in the melting step is preferably set at 1500 to 2500 rpm so that the DIW as a melting liquid supplied to the substrate top surface Wf can spread over the entire substrate top surface Wf and the liquid coolant remaining on the substrate top surface Wf and the particles and the like detached from the substrate top surface Wf can be pushed out by a flow spreading over the substrate top surface Wf. In the following description, the number of rotations of the substrate W in the melting step is set at 2000 rpm.

Further, the nozzle driving mechanism 413 positions the nozzle 411 to a position above the vicinity of the center of the substrate top surface Wf in response to an operation command from the control unit 97 to the melter 41. After the positioning of the nozzle 411 is completed, the on-off valve 437 is opened in response to an operation command from the control unit 97 to the melter 41. This causes the melting liquid to be supplied from the second DIW supplier 433 to the vicinity of the center of the substrate top surface Wf through the nozzle 411 via the pipe 435.

The DIW as a melting liquid supplied to the substrate top surface Wf is preferably temperature-regulated to 50° C. (Celsius) to 90° C. (Celsius) to shorten a time required to melt the solidified material of the solidification liquid formed on the top surface Wf of the substrate W and prevent the solidified material of the solidification liquid, which could not be melted, from being suspended in the DIW as the melting liquid and colliding with the pattern to give a damage. In the following description, the DIW of 80° C. (Celsius) is supplied as the melting liquid.

The melting liquid supplied to the vicinity of the center of the substrate top surface Wf flows from the center of the substrate top surface Wf toward the peripheral edge part of the substrate top surface Wf, spreads over the entire substrate top surface Wf and is scattered out of the substrate due to the centrifugal force resulting from the rotation of the substrate W, thereby being collected and drained by the drainage collector 21. The melting liquid spread on the substrate top surface Wf rapidly melts the solidified material of the solidification liquid formed on the substrate top surface Wf and, by its flow, pushes out the particles and the like detached from the substrate top surface Wf to discharge them out of the substrate W. Further, the liquid coolant remaining on the substrate top surface Wf is also pushed out and discharged out of the substrate W by the flow of the melting liquid.

After the solidified material of the solidification liquid on the substrate top surface Wf is melted, the on-off valve 437 is closed in response to an operational command from the control unit 97 to the melter 41. Further, the nozzle driving mechanism 413 positions the nozzle 411 to the retracted position (position where the nozzle 411 is retracted radially outwardly of the cup 210) in response to the operation command from the control unit 97 to the melter 41.

Subsequently, a rinsing step (Step S106) is performed. In response to an operation command from the control unit 97 to the atmosphere blocker 23, the blocking member elevating mechanism 247 moves the blocking member 231 to the facing position. Further, in response to an operation command from the control unit 97 to the substrate holder 11, the substrate rotator 13 changes the number of rotations of the spin base 113 and maintains this number of rotations during the rinsing step. Note that the cup 210 is kept at the inner collecting position.

The number of rotations of the substrate W in the rinsing step is preferably set at 300 to 1000 rpm so that the rinsing liquid supplied to the substrate top surface Wf and the substrate under surface Wb can spread over the entire substrate top surface Wf and substrate under surface Wb. In the following description, the number of rotations of the substrate W in the rinsing step is set at 800 rpm.

After the blocking member 231 is positioned to the facing position, the on-off valves 459, 463 are opened in response to an operation command from the control unit 97 to the rinser 45.

This causes the rinsing liquid to be supplied from the third DIW supplier 453 to the substrate top surface Wf through the nozzle 275 via the main pipe 455, the upper branch pipe 457 and the upper second supply pipe 273 and also to the substrate under surface Wb through the nozzle 291 via the main pipe 455, the lower branch pipe 461 and the lower second supply pipe 283. The rinsing liquid supplied to the vicinities of the centers of the respective substrate top surface Wf and substrate under surface Wb flows in directions toward the substrate peripheral edge and is finally scattered out of the substrate W from the substrate peripheral edge part due to the centrifugal force resulting from the rotation of the substrate W, thereby being collected and drained by the drainage collector 21.

Note that the rinsing liquid also functions to remove the DIW and the like that are scattered to the under surface Wb of the substrate W in the respective preceding steps and the particles and the like suspended in the atmosphere and adhering to the substrate W.

After the rinsing step, the on-off valves 459, 463 are closed in response to an operation command from the control unit 97 to the rinser 45.

Subsequently, a drying step of drying the substrate W (Step S107) is performed. In response to an operation command from the control unit 97 to the drying gas supplier S1, the mass flow controllers 519, 523 are opened to attain predetermined flow rates. Note that the blocking member 231 of the atmosphere blocker 23 is kept at the facing position and the cup 210 is kept at the inner collecting position.

This causes the normal-temperature drying nitrogen gas to be supplied from the drying nitrogen gas supplier 513 to the substrate top surface Wf via the main pipe 515, the upper branch pipe 517 and the upper first supply pipe 271 and also to the substrate under surface Wb via the main pipe 515, the lower branch pipe 521 and the lower first supply pipe 281. The drying nitrogen gas fills up the space between the lower surface of the blocking member 231 positioned at the facing position and the substrate top surface Wf and also fills up the space between the upper surface of the spin base 113 and the substrate under surface Wb, whereby contact of the substrate top surface Wf and the substrate under surface Wb with outside air is prevented.

After the substrate W is blocked from outside air, the substrate rotating mechanism 121 changes the number of rotations of the spin base 113 and maintains this number of rotations during the drying step in response to an operation command from the control unit 97 to the substrate holder 11. The number of rotations of the substrate W in the drying step is preferably set at 1500 to 3000 rpm so that the rinsing liquid remaining on the substrate top surface Wf and the substrate under surface Wb can be spun off the substrate W by the centrifugal force. In the following description, the number of rotations of the substrate W in the drying step is set at 2000 rpm.

After the drying of the substrate W is completed, the mass flow controllers 519, 523 are set to a flow rate of 0 (zero) in response to an operation command from the control unit 97 to the drying gas supplier 51. Further, the substrate rotating mechanism 121 stops the rotation of the spin base 113 in response to an operation command from the control unit 97. Further, the blocking member rotating mechanism 235 stops the rotation of the blocking member 231 in response to an operation command from the control unit 97 to the atmosphere blocker 23.

Further, in response to an operation command from the control unit 97 to the drainage collector 21, the cup 210 is positioned to the home position. After the rotation of the spin base 113 is stopped, the substrate rotating mechanism 121 positions the spin base 113 to the position suitable for the transfer of the substrate W in response to an operation command from the control unit 97. Further, the blocking member elevating mechanism 247 moves the blocking member 231 to the separated position in response to an operation command from the control unit 97 to the atmosphere blocker 23.

Finally, a substrate unloading step of unloading the substrate W from the processing unit 91 (Step S108) is performed. After the substrate holder 11 is positioned to the position suitable for the transfer of the substrate W, the substrate holding member driving mechanism 119 sets the substrate holding members 115 in the open state and places the substrate W on the substrate supporting portions of the respective substrate holding members 115 in response to an operation command from the control unit 97 to the substrate holder 11.

Thereafter, the shutter 911 is opened and the center robot 96 extends the upper hand 961 into the processing unit 91, unloads the substrate W to the outside of the processing unit 91 and transfers it to the upper hand 951 of the shuttle 95. Thereafter, the shuttle 95 moves the upper hand 951 toward the indexer unit 93.

Then, the indexer robot 931 picks up the substrate W held on the upper hand of the shuttle 95 by the upper hand 933 and brings it to the predetermined position of the FOUP 949, whereby a series of operations are finished.

As described above, in this embodiment, the supercooled solidification liquid is discharged to the substrate top surface Wf and solidified utilizing a landing impact on the substrate top surface Wf. Accordingly, a cooler for solidifying a liquid film of the solidification liquid on the substrate top surface Wf as in the conventional technology, i.e. an apparatus or the like for cooling a nitrogen gas with liquid nitrogen and supplying the cooled nitrogen gas is not necessary, and enlargement of the entire apparatus and a cost increase caused by adding such an apparatus and a running cost increase caused by the use of liquid nitrogen or the like can be prevented.

Further, since a gaseous refrigerant with low heat transfer efficiency is not used to solidify the liquid film of the solidification liquid on the substrate top surface Wf and the solidified material of the solidification liquid is formed only by supplying the supercooled solidification liquid itself onto the substrate top surface Wf, a time required to form the solidified material can be shortened.

Further, in order to reduce the temperature of the solidified material of the solidification liquid formed on the substrate top surface Wf, the liquid coolant is directly discharged to the solidified material of the solidification liquid to cool it. Since a liquid has higher heat transfer efficiency than a gas, the temperature of the solidified material of the solidification liquid can be reduced in a short time and a time required for the process can be shortened.

Further, since the solidified material is formed by discharging the supercooled solidification liquid to the substrate top surface Wf, even if the liquid coolant is discharged onto the substrate top surface Wf thereafter, the solidified material on the substrate top surface Wf is solidified and not eliminated. Accordingly, the thickness of the solidified material of the solidification liquid on the substrate top surface Wf is not changed by the supply of the liquid coolant and the cleaning ability can be precisely controlled.

Second Embodiment

Next, a second embodiment of the substrate processing apparatus according to this invention is described. This second embodiment largely differs from the first embodiment in that the substrate cooling step of cooling a substrate W is performed before the solidified material forming step.

Note that since the construction of the second embodiment is basically identical to the substrate processing apparatus 9 and the processing units 91 shown in FIGS. 3 to 14, it is denoted by the same reference numerals and not described in the following description.

Also in this second embodiment, a substrate loading step of loading a substrate W into a processing unit 91 (S201) and a preparation step of preparing the DIW as the solidification liquid in an supercooled state (S202) are performed as in the first embodiment.

Subsequently, a substrate cooling step of cooling the substrate W (Step S203) is performed on a substrate under surface Wb. First, in response to an operation command from a control unit 97 to a substrate holder 11, a substrate rotating mechanism 121 starts rotating a spin base 113 and keeps rotating it in the substrate cooling step. Further, a cup 210 is positioned to a middle collecting position in response to an operation command from the control unit 97 to a drainage collector 21. Note that a blocking member 231 of an atmosphere blocker 23 is kept at a separated position.

The number of rotations of the substrate W in the substrate cooling step is preferably set at 300 to 900 rpm so that a liquid coolant supplied to the substrate under surface Wb can spread over the entire substrate under surface Wb. In the following description, the number of rotations of the substrate W in the substrate cooling step is set at 400 rpm.

Further, an on-off valve 477 is opened in response to an operation command from the control unit 97 to an under surface cooler 47. This causes the liquid coolant to be supplied from an HFE supplier 373 to the substrate under surface Wb through a nozzle 291 via a pipe 475, a lower branch pipe 461 and a lower second supply pipe 283.

Note that the HFE as the liquid coolant is preferably temperature-regulated to – (minus) 40° C. (Celsius) to – (minus) 10° C. (Celsius) to rapidly solidify the solidification liquid adhering to the substrate top surface Wf in a solidified material forming step to be described later. In the following description, the temperature of the liquid coolant is set at – (minus) 20° C. (Celsius).

The liquid coolant supplied to the vicinity of the center of the substrate under surface Wb spreads from the vicinity of the center toward a peripheral edge part of the substrate under surface Wb due to a centrifugal force produced by the rotation of the substrate W. This causes the liquid coolant to spread over the entire substrate under surface Wb, the entire substrate under surface Wb comes into contact with the liquid coolant, and the substrate W is cooled by cold heat of the liquid coolant.

Subsequently, similar to the first embodiment, the solidified material forming step of forming a solidified material of a solidification liquid by supplying the supercooled solidification liquid to the substrate top surface Wf is performed (Step S204).

Also in this embodiment, similar to the first embodiment, the solidification liquid discharged from a nozzle 311 is solidified by a landing impact on the substrate top surface Wf. In addition to this, the solidification liquid is solidified also by coming into contact with the substrate W cooled to or below a solidification point.

Further, by cooling the substrate W with the liquid coolant beforehand, the solidification liquid supplied to the substrate top surface Wf in the solidified material forming step is rapidly solidified when landing on the substrate top surface Wf without the temperature thereof being increased by heat of the substrate W.

Further, when the solidification liquid is solidified, heat of solidification is generated to increase the temperature of the surrounding solidification liquid and extends a time required for solidification as a whole. However, since the generated heat of solidification is absorbed by the cooled substrate W in this embodiment, the temperature of the surrounding solidification liquid is not increased and the solidified material is rapidly formed.

After the solidified material of the solidification liquid is formed over the entire substrate top surface Wf, the on-off valve 337 is closed in response to an operation command from the control unit 97 to the solidified material forming unit 31. Further, the nozzle driving mechanism 313 positions the nozzle 311 to the retracted position (position where the nozzle 311 is retracted radially outwardly of the cup 210) in response to the operation command from the control unit 97 to the solidified material forming unit 31. Further, the on-off valve 477 is closed in response to an operation command from the control unit 97 to the under surface cooler 47.

Note that the liquid coolant may not be discharged from the under surface cooler 47 until the solidified material forming step is finished since it is sufficient to be able to shorten the time required to form the solidified material of the solidification liquid by cooling the substrate W. That is, the discharge of the liquid coolant may be stopped when the solidified material forming step is started or may be stopped during the solidified material forming step. Alternatively, the liquid coolant may be discharged until a solidified material cooling step to be described later is finished.

Thereafter, similar to the first embodiment, the solidified material cooling step (Step S205), a melting step (Step S206), a rinsing step (Step S207), a drying step (Step S208) and a substrate unloading step (Step S209) are performed, whereby a series of operations are finished.

As described above, in this embodiment, the supercooled solidification liquid is discharged to the substrate top surface Wf and solidified utilizing its landing impact on the substrate top surface Wf and a rapid cooling stimulus by cold heat of the cooled substrate W. Accordingly, a cooler for solidifying a liquid film of the solidification liquid on the substrate top surface Wf as in the conventional technology, i.e. an apparatus or the like for cooling a nitrogen gas with liquid nitrogen and supplying the cooled nitrogen gas is not necessary, and enlargement of the entire apparatus and a cost increase caused by adding such an apparatus and a running cost increase caused by the use of liquid nitrogen or the like can be prevented.

Further, since a gaseous refrigerant with low heat transfer efficiency is not used to solidify the liquid film of the solidification liquid on the substrate top surface Wf and the solidified material of the solidification liquid is formed only by supplying the supercooled solidification liquid itself onto the substrate top surface Wf, a time required to form the solidified material can be shortened.

Further, by cooling the substrate W with the liquid coolant beforehand, the solidification liquid supplied to the substrate top surface Wf in the solidified material forming step is rapidly solidified when landing on the substrate top surface Wf without the temperature thereof being increased by the heat of the substrate W.

Further, heat of solidification is generated when the solidification liquid is solidified, thereby increasing the temperature of the surrounding solidification liquid and extending the time required for solidification as a whole. However, in this embodiment, the generated heat of solidification is absorbed by the cooled substrate W and the solidified material is rapidly formed without the temperature of the surrounding solidification liquid being increased.

Further, in order to reduce the temperature of the solidified material of the solidification liquid formed on the substrate top surface Wf, the liquid coolant is directly discharged to the solidified material of the solidification liquid to cool it. Since a liquid has higher heat transfer efficiency than a gas, the temperature of the solidified material of the solidification liquid can be reduced in a short time and a time required for the process can be shortened.

Further, since the solidified material is formed by discharging the supercooled solidification liquid to the substrate top surface Wf, even if the liquid coolant is discharged onto the substrate top surface Wf thereafter, the solidified material on the substrate top surface Wf is solidified and not eliminated. Accordingly, the thickness of the solidified material of the solidification liquid on the substrate top surface Wf is not changed by the supply of the liquid coolant and the cleaning ability can be precisely controlled.

Although the substrate is cooled by discharging the liquid coolant to the substrate under surface Wb of the substrate W before the solidification liquid is discharged in this embodiment, the method for cooling the substrate is not limited to this. That is, the substrate W may be cooled by supplying the liquid coolant to the substrate top surface Wf before the solidification liquid is supplied. Further, the substrate may be cooled by discharging the solidification liquid to the vicinity of the center of the substrate top surface Wf for a predetermined period before the nozzle 311 is rotationally moved after the discharge of the solidification liquid to the substrate top surface Wf is started in the solidified material forming step.

Third Embodiment

Next, a third embodiment of the substrate processing apparatus according to this invention is described. This third embodiment largely differs from the second embodiment in that the substrate cooling step is continued during the solidified material forming step to vibrate the liquid coolant.

Note that since the construction of the third embodiment is basically identical to the substrate processing apparatus 9 and the processing units 91 shown in FIGS. 3 to 14, it is denoted by the same reference numerals and not described in the following description.

Also in this third embodiment, a substrate loading step of loading a substrate W into a processing unit 91 (S201) and a preparation step of preparing the DIW as the solidification liquid in an supercooled state (S202) are performed as in the second embodiment.

Subsequently, a substrate cooling step of cooling the substrate W (Step S203) is performed on a substrate under surface Wb. First, in response to an operation command from a control unit 97 to a substrate holder 11, a substrate rotating mechanism 121 starts rotating a spin base 113 and keeps rotating it in the substrate cooling step. Further, a cup 210 is positioned to a middle collecting position in response to an operation command from the control unit 97 to a drainage collector 21. Note that a blocking member 231 of an atmosphere blocker 23 is kept at a separated position.

The number of rotations of the substrate W in the substrate cooling step is preferably set at 300 to 900 rpm so that a liquid coolant supplied to the substrate under surface Wb can spread over the entire substrate under surface Wb. In the following description, the number of rotations of the substrate W in the substrate cooling step is set at 400 rpm.

Further, an on-off valve 477 is opened in response to an operation command from the control unit 97 to an under surface cooler 47. This causes the liquid coolant to be supplied from an HFE supplier 373 to the substrate under surface Wb through a nozzle 291 via a pipe 475, a lower branch pipe 461 and a lower second supply pipe 283.

Note that the HFE as the liquid coolant is preferably temperature-regulated to − (minus) 40° C. (Celsius) to − (minus) 10° C. (Celsius) to rapidly solidify the solidification liquid adhering to the substrate top surface Wf in a solidified material forming step to be described later. In the following description, the temperature of the liquid coolant is set at − (minus) 20° C. (Celsius).

Further, an ultrasonic oscillator is disposed in the lower branch pipe 461 so that the substrate W can be vibrated via the liquid coolant. Note that the operation of the ultrasonic oscillator is synchronized with the on-off valve 477. That is, ultrasonic oscillation is started when the on-off valve 477 is opened while being stopped when the on-off valve 477 is closed.

The liquid coolant supplied to the vicinity of the center of the substrate under surface Wb spreads from the vicinity of the center toward a peripheral edge part of the substrate under surface Wb due to a centrifugal force produced by the rotation of the substrate W. This causes the liquid coolant to spread over the entire substrate under surface Wb, the entire substrate under surface Wb comes into contact with the liquid coolant, and the substrate W is cooled by cold heat of the liquid coolant. Further, ultrasonic vibration applied to the liquid coolant is transmitted to the substrate W to vibrate the substrate W.

Subsequently, similar to the second embodiment, the solidified material forming step of forming a solidified material of a solidification liquid by supplying the supercooled solidification liquid to the substrate top surface Wf is performed (Step S204).

Also in this embodiment, similar to the second embodiment, the solidification liquid discharged from a nozzle 311 is solidified by a landing impact on the substrate top surface Wf. In addition to this, the solidification liquid is solidified also by coming into contact with the substrate W cooled to or below a solidification point.

Further, ultrasonic waves are applied to the liquid coolant supplied to the substrate under surface Wb to ultrasonically vibrate the substrate W. This ultrasonic vibration also becomes an external stimulus to the solidification liquid and promotes the solidification of the solidification liquid.

Further, by cooling the substrate W with the liquid coolant beforehand, the solidification liquid supplied to the substrate top surface Wf in the solidified material forming step is rapidly solidified when landing on the substrate top surface Wf without the temperature thereof being increased by heat of the substrate W.

Further, when the solidification liquid is solidified, heat of solidification is generated to increase the temperature of the surrounding solidification liquid and extends a time required for solidification as a whole. However, since the generated heat of solidification is absorbed by the cooled substrate W in this embodiment, the temperature of the surrounding solidification liquid is not increased and the solidified material is rapidly formed.

After the solidified material of the solidification liquid is formed over the entire substrate top surface Wf, the on-off valve 337 is closed in response to an operation command from the control unit 97 to the solidified material forming unit 31. Further, the nozzle driving mechanism 313 positions the nozzle 311 to the retracted position (position where the nozzle 311 is retracted radially outwardly of the cup 210) in response to the operation command from the control unit 97 to the solidified material forming unit 31. Further, the on-off valve 477 is closed in response to an operation command from the control unit 97 to the under surface cooler 47.

Thereafter, similar to the second embodiment, the solidified material cooling step (Step S205), a melting step (Step S206), a rinsing step (Step S207), a drying step (Step S208) and a substrate unloading step (Step S209) are performed, whereby a series of operations are finished.

As described above, in this embodiment, the supercooled solidification liquid is discharged to the substrate top surface Wf and is solidified utilizing a landing impact on the substrate top surface Wf, a rapid cooling stimulus by cold heat of the cooled substrate W and ultrasonic vibration applied to the substrate. Accordingly, a cooler for solidifying a liquid film of the solidification liquid on the substrate top surface Wf as in the conventional technology, i.e. an apparatus or the like for cooling a nitrogen gas with liquid nitrogen and supplying the cooled nitrogen gas is not necessary, and enlargement of the entire apparatus and a cost increase caused by adding such an apparatus and a running cost increase caused by the use of liquid nitrogen or the like can be prevented.

Further, since a gaseous refrigerant with low heat transfer efficiency is not used to solidify the liquid film of the solidification liquid on the substrate top surface Wf and the solidified material of the solidification liquid is formed only by supplying the supercooled solidification liquid itself onto the substrate top surface Wf, a time required to form the solidified material can be shortened.

Further, by cooling the substrate W with the liquid coolant beforehand, the solidification liquid supplied to the substrate top surface Wf in the solidified material forming step is rapidly solidified when landing on the substrate top surface Wf without the temperature thereof being increased by the heat of the substrate W.

Further, heat of solidification is generated when the solidification liquid is solidified, thereby increasing the temperature of the surrounding solidification liquid and extending the time required for solidification as a whole. However, in this embodiment, the generated heat of solidification is absorbed by the cooled substrate W and the solidified material is rapidly formed without the temperature of the surrounding solidification liquid being increased.

Further, in order to reduce the temperature of the solidified material of the solidification liquid formed on the substrate top surface Wf, the liquid coolant is directly discharged to the solidified material of the solidification liquid to cool it. Since a liquid has higher heat transfer efficiency than a gas, the temperature of the solidified material of the solidification liquid can be reduced in a short time and a time required for the process can be shortened.

Further, since the solidified material is formed by discharging the supercooled solidification liquid to the substrate top surface Wf, even if the liquid coolant is discharged onto the substrate top surface Wf thereafter, the solidified material on the substrate top surface Wf is solidified and not eliminated. Accordingly, the thickness of the solidified material of the solidification liquid on the substrate top surface Wf is not changed by the supply of the liquid coolant and the cleaning ability can be precisely controlled.

A means for applying vibration to the liquid coolant supplied from the under surface cooler 47 is not limited to the above ultrasonic oscillator. For example, vibration may be applied to the liquid coolant by opening and closing the on-off valve 477 at short intervals, causing the pump 383 of the HFE supplier 373 to finely pulsate by adopting a bellows pump, disposing a flow regulating valve in the lower branch pipe 461 to change the flow rate or the like.

<Miscellaneous>

Note that the invention is not limited to the above embodiments and various changes besides those described above can be made without departing from the gist thereof. For example, another method can be adopted as the solidified material forming step. That is, it is also possible to solidify the solidification liquid by another external stimulus without utilizing the landing impact of the solidification liquid on the substrate top surface Wf in the solidified material forming step.

For example, in the solidified material forming step, it is also possible to form a liquid film of the solidification liquid on the substrate top surface Wf without giving any landing impact of the solidification liquid on the substrate top surface Wf by supplying the solidification liquid from the nozzle 311 located very close to the substrate top surface and, thereafter, solidify the solidification liquid by giving an external stimulus such as dripping of the solidification liquid from the nozzle 311 moved upward, discharge of the liquid coolant to the substrate under surface Wb for sudden cooling, discharge of the liquid coolant, to which ultrasonic waves are applied, to the substrate under surface Wb, or vibration of the substrate holder 11.

Further, although the DIW is supplied as the solidification liquid to the substrate W in the above respective embodiments, the solidification liquid is not limited to the DIW, and pure water, ultrapure water, hydrogen water, carbonated water, or another liquid such as SC1 can also be used as such.

Further, although the DIW is supplied as the melting liquid to the substrate W in the above respective embodiments, the melting liquid is not limited to the DIW, and pure water, ultrapure water, hydrogen water, carbonated water, or another liquid such as SC1 can also be used as such.

Further, although the solidification liquid and the rinsing liquid are the same DIW in the above respective embodiments, they may be different liquids.

Further, although the HFE is used as the liquid coolant in the above respective embodiments, another liquid may also be used if it is a liquid having a solidification point lower than that of the solidification liquid. For example, the liquid may be o-xylene (1,2-dimethylbenzene) (chemical formula:

$C_8H_{10}$, solidification point: – (minus) 25.2° C. (Celsius)), m-xylene (1,3-dimethylbenzene) (chemical formula: solidification point: – (minus) 48.9° C. (Celsius)), trichloromethane (chemical formula: $CHCl_3$, solidification point: – (minus) 63.5° C. (Celsius)), tetrachloroethylene (chemical formula: $CCl_2=CCl$, solidification point: – (minus) 22.2° C. (Celsius)), hexane (chemical formula: $C_6H_{14}$, solidification point: – (minus) 100° C. (Celsius)), heptane (chemical formula: $C_7H_{16}$, solidification point: – (minus) 91° C. (Celsius)), isopropyl alcohol (chemical formula: $C_3H_8O$), ethyl alcohol (chemical formula: $C_2H_5OH$, solidification point: – (minus) 114° C. (Celsius)), methyl alcohol (chemical formula: $CH_3OH$, solidification point: – (minus) 98° C. (Celsius)), octane (chemical formula: $C_8H_{18}$, solidification point: – (minus) 56.8° C. (Celsius)) or the like. Note that these liquids may be diluted.

Out of these liquids, isopropyl alcohol, ethyl alcohol and the like can dissolve into the DIW as the solidification liquid, and the liquid collected in the solidified material cooling step becomes a solution in which the solidification liquid and the liquid coolant are mixed. However, by mixing the liquid coolant with the solidification liquid, the resulting solution has a solidification point lower than that of the solidification liquid (e.g. in the case of mixing isopropyl alcohol with the DIW, the solidification point changes depending on isopropyl alcohol concentration, but is equal to or below – (minus) 20° C. at most concentrations). Accordingly, it is possible not only to separate and collect only the liquid coolant as in the case of HFE, but also to collect and reutilize the mixed solution.

Further, although the liquid HFE is used in the solidified material cooling step in the respective above embodiments, a means for cooling the solidified material is not limited to this. That is, it is also possible to cool the solidified material by cooling a gas such as nitrogen gas, ozone gas or argon gas to a temperature lower than the solidification point of the solidification liquid and supplying it to the substrate formed with the solidified material.

For example, in the solidified material cooling step, the cooled gas can be discharged to the substrate top surface Wf from the nozzle 351 and supplied to the entire substrate top surface Wf by rotationally moving the nozzle 351 above the substrate W by the nozzle driving mechanism 353. In this case, since the solidification liquid is already solidified on the substrate W, even if the cooling ability is increased by increasing the flow rate of the cooling gas, there is no likelihood that the solidification liquid on the substrate is blown to make the thickness of the solidified material of the solidification liquid uneven or the solidification liquid is eliminated from the substrate top surface Wf so that no solidified material of the solidification liquid is formed.

Further, in the DIW tank 341 of the first DIW supplier 333 or the pipe path reaching the nozzle 311 from the DIW tank 341 in the solidified material forming unit 31, it is also possible to stably supply supercooled water having a low temperature to the substrate top surface Wf by applying a magnetic field environment, an electric field environment or ultrasonic waves to the solidification liquid.

Further, although the same HFE is supplied as the liquid coolant to the surface cooler 35 and the under surface cooler 47 from one HFE supplier 373 in the above respective embodiments, the liquid coolant can also be supplied from separate supply sources. In this case, different liquids can be used or liquid coolants having different temperatures can also be supplied.

As described above, in a first aspect of the present invention, the solidification liquid supplied to the substrate in the solidified material forming step is preferably supercooled. Similarly, the solidified material forming unit preferably supplies the supercooled solidification liquid to the substrate.

In the invention thus constructed, the supercooled solidification liquid is solidified by a landing impact thereof on the substrate and the solidified material of the solidification liquid is formed on the substrate. Accordingly, a gas for solidifying the solidification liquid needs not be supplied. Note that if the solidification liquid is formulated to form the solidified material on the substrate, crystallization of the supercooled solidification liquid is started not only on the substrate, but may be started in the process reaching the substrate. According to this invention, the solidified material is formed only by supplying the supercooled solidification liquid onto the substrate, wherefore a step of supplying a low-temperature gas to form the solidified material is not necessary, which leads to shortening of a processing time.

It is also possible to further include the solidified material cooling step of cooling the solidified material of the solidification liquid on the substrate by supplying a fluid having a temperature lower than the solidification point of the solidification liquid.

In the invention thus constructed, since the temperature of the solidified material of the solidification liquid formed on the substrate is reduced by the fluid having a temperature lower than the solidification point of the solidification liquid, an ability to remove particles and the like on the substrate top surface can be improved.

Further, the fluid supplied in the solidified material cooling step may be a liquid coolant having a solidification point lower than that of the solidification liquid.

In the invention this constructed, the temperature of the solidified material of the solidification liquid is reduced by supplying the liquid coolant having a solidification point lower than that of the solidification liquid to the solidified material of the solidification liquid on the substrate. Since a liquid has higher heat transfer efficiency than a gas and is not diffused into the atmosphere unlike a gas, the temperature of the solidified material of the solidification liquid can be reduced in a shorter time. Further, the liquid coolant can easily spread over the entire surface of the substrate and the solidified material of the solidification liquid on the substrate can be evenly cooled. This can make a distribution of the cleaning ability on the substrate smaller.

Further, the solidified material forming step may further include the substrate cooling step of cooling the substrate, and the refrigerant may be discharged to the under surface of the substrate or the top surface of the substrate before the solidified material forming step.

In the invention thus constructed, the supercooled solidification liquid can be efficiently solidified since the substrate is cooled by discharging the refrigerant to the top and under surfaces of the substrate. That is, by cooling the substrate beforehand, the substrate needs not be cooled by the solidification liquid and the solidified material of the solidification liquid can be formed on the substrate top surface immediately after the solidification liquid is supplied.

Further, in the solidified material forming step, the thickness of the solidified material of the solidification liquid on the substrate may be changed within the plane of the substrate.

Since the cleaning ability depends also on the thickness of the solidified material formed on the substrate in freeze cleaning as shown in FIG. 2, the cleaning ability can have an in-plane distribution by making the thickness of the solidified material of the solidification liquid on the substrate different within the plane of the substrate in the invention thus constructed. That is, if the cleaning ability has a distribution within the plane of the substrate when the thickness of the solidified material on the substrate is even, the in-plane distribution of the cleaning ability can be made smaller by increasing the thickness of the solidified material in a part where the cleaning ability is low.

Further, in the solidified material forming step, the thickness of the solidified material on the substrate can be changed by changing the amount of the solidification liquid supplied onto the substrate within plane of the substrate.

In the invention thus constructed, the thickness of the solidified material on the substrate can be easily changed and the in-plane distribution of the cleaning ability can be easily made smaller by reducing the amount of the supercooled solidification liquid supplied to the substrate in a certain part or increasing the amount in a certain part.

Further, in the solidified material forming step, the thickness of the solidified material of the solidification liquid within the plane of the substrate may be increased as the distance from the central part toward the peripheral edge part of the substrate.

In the invention thus constructed, the cleaning ability at the peripheral edge part of the substrate can be increased as compared to the central part of the substrate by successively increasing the thickness of the solidification liquid within the plane of the substrate from the central part toward the peripheral edge part of the substrate. This can improve the cleaning ability at the substrate peripheral edge part where the temperature of the solidified material of the solidification liquid is likely to increase due to heat absorption from the atmosphere or the like and make the distribution of the cleaning ability within the plane of the substrate smaller.

Thus far, the embodiments have been described in which the supercooled solidification liquid is supplied to the substrate and a landing impact on the substrate is utilized as an external stimulus. However, as another embodiment of the present invention, it is also possible to supply a solidification liquid having a solidification point higher than normal temperature to a substrate and solidify the solidification liquid utilizing a normal-temperature atmosphere as an external stimulus. The following fourth to fifteenth embodiments relate to such an embodiment.

Fourth Embodiment

Figure 17:
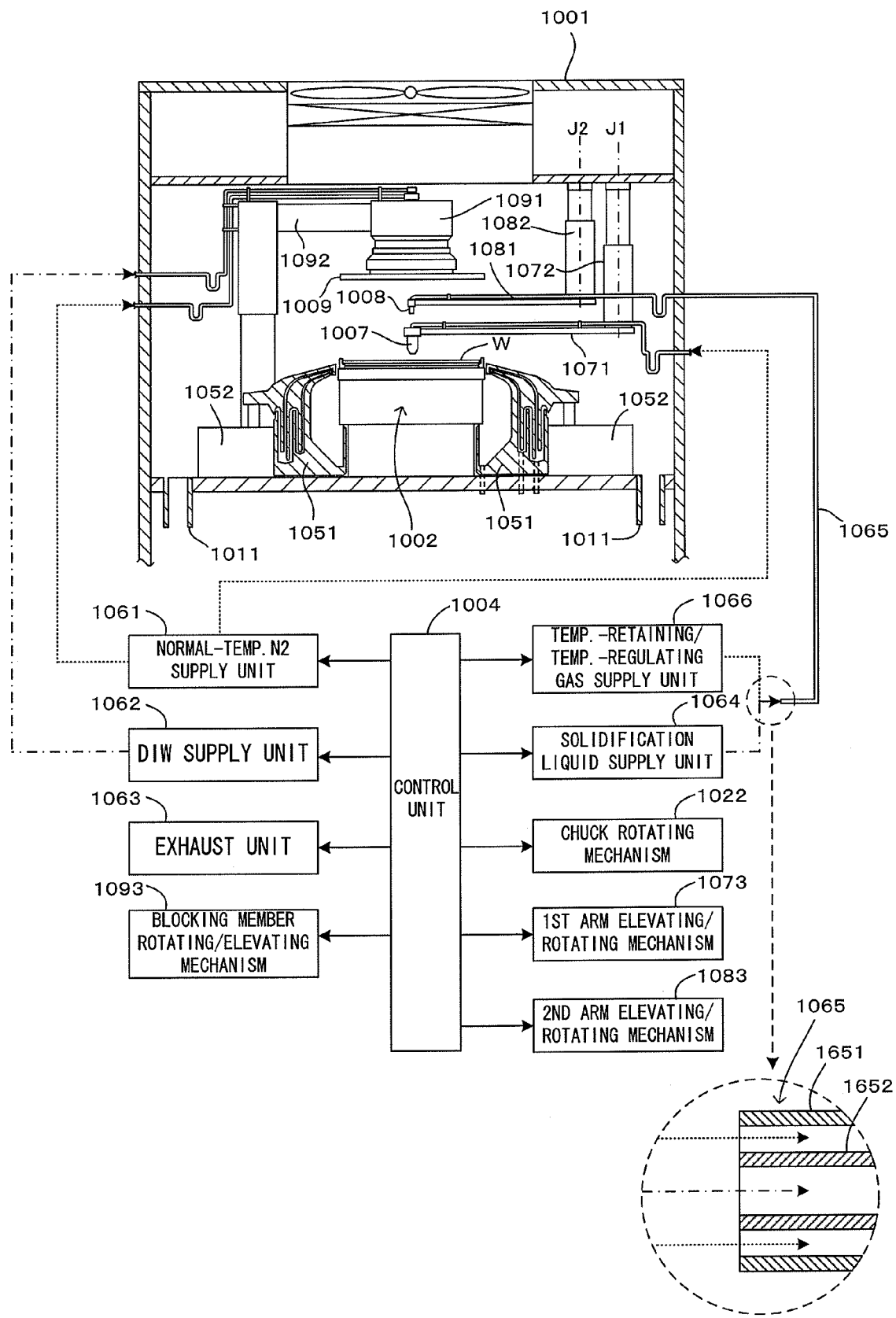
FIG. 17 is a diagram showing a fourth embodiment of the substrate processing apparatus according to this invention.
Figure 18:
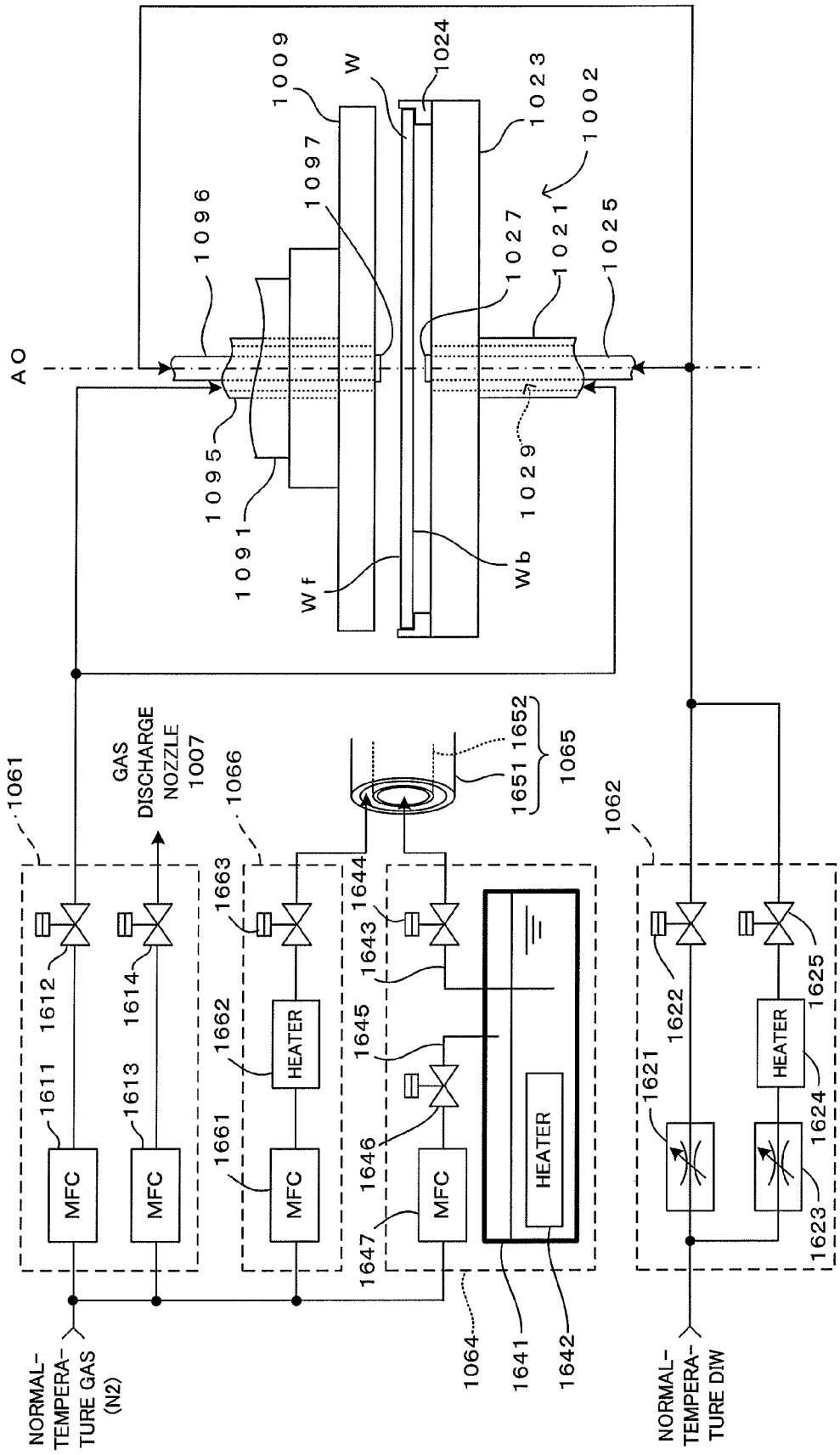
FIG. 18 is a diagram showing supply modes of a nitrogen gas and DIW in the substrate processing apparatus of FIG. 17.
Figure 19:
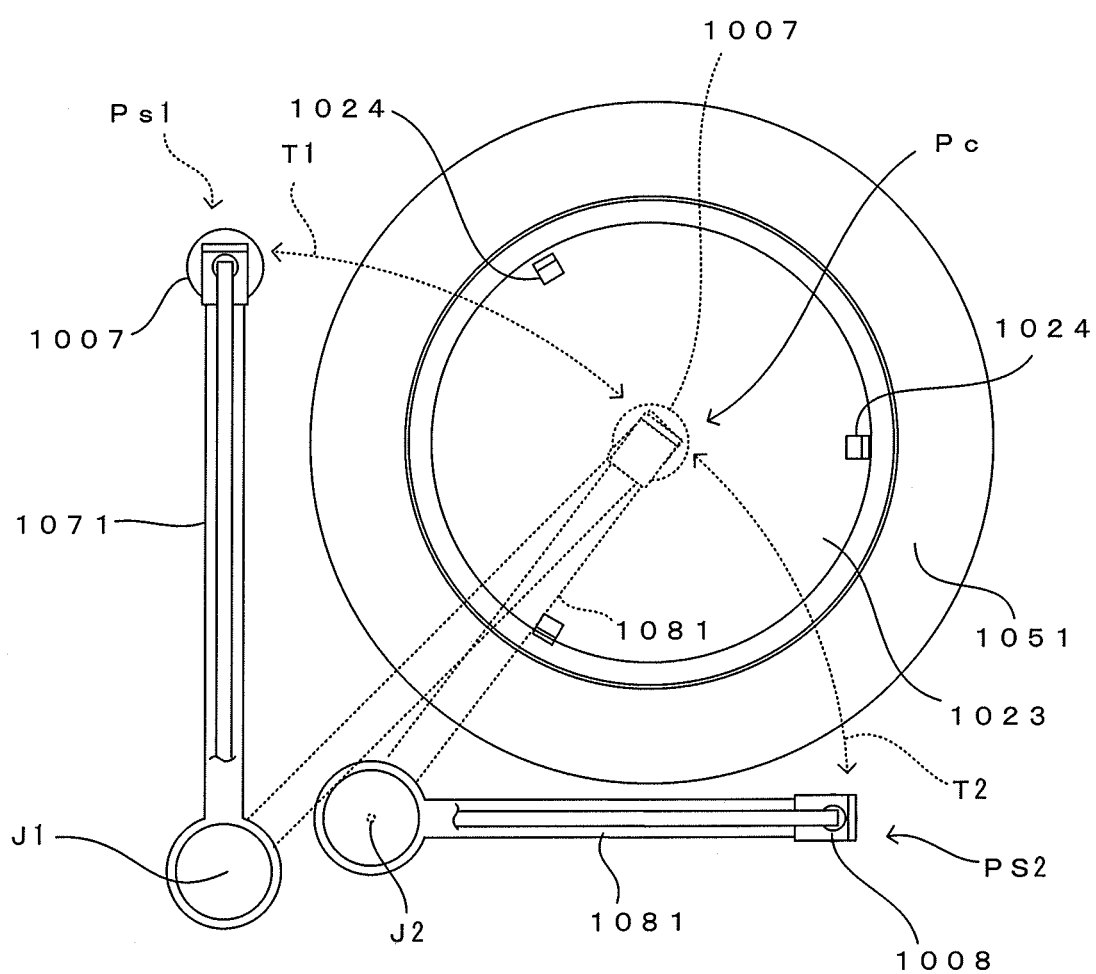
FIG. 19 is a diagram showing an operation mode of an arm in the substrate processing apparatus of FIG. 17

FIG. 17 is a diagram showing a fourth embodiment of the substrate processing apparatus according to this invention. FIG. 18 is a diagram showing supply modes of a nitrogen gas and DIW in the substrate processing apparatus of FIG. 17. FIG. 19 is a diagram showing an operation mode of an arm in the substrate processing apparatus of FIG. 17. This apparatus is a single-substrate processing apparatus capable of performing a freeze cleaning process to remove contaminants such as particles adhering to a top surface Wf of a substrate W such as a semiconductor wafer, more specifically, a substrate processing apparatus which performs a freeze cleaning process for a substrate top surface Wf formed with a fine pattern to remove particles and the like from the substrate top surface together with a solidified film (solidified material) by removing the solidified film after a liquid film is formed on the top surface Wf and frozen to form the solidified film.

This substrate processing apparatus includes a processing chamber 1001. A normal-temperature atmosphere is set in this processing chamber 1001, and a spin chuck 1002 is so constructed in the processing chamber 1001 as to rotate a substrate W held in a substantially horizontal posture with a top surface Wf thereof faced upward. Specifically, as shown in FIG. 18, a disk-shaped spin base 1023 is fixed to the upper end of a center shaft 1021 of this spin chuck 1002 by a fastening part such as a screw. This center shaft 1021 is coupled to a rotary shaft of a chuck rotating mechanism 1022 including a motor. When the chuck rotating mechanism 1022 is driven in response to an operation command from a control unit 1004 for controlling the entire apparatus, the spin base 1023 fixed to the center shaft 1021 rotates about a central axis of rotation AO.

A plurality of chuck pins 1024 for gripping a peripheral edge part of the substrate W stand near a peripheral edge part of the spin base 1023. Three or more chuck pins 1024 may be provided to reliably hold the circular substrate W. The chuck pins 1024 are arranged at equal angular intervals along the peripheral edge part of the spin base 1023. Each of the chuck pins 1024 includes a substrate supporting portion for supporting the peripheral edge part of the substrate W from below and a substrate holding portion for holding the substrate by pressing the outer peripheral end surface of the substrate W supported on the substrate supporting portion. Each chuck pin 1024 can be switched between a pressing state where the substrate holding portion presses the outer peripheral end surface of the substrate W and a releasing state where the substrate holding portion is separated from the outer peripheral end surface of the substrate W.

The respective chuck pins 1024 are set in the releasing state when the substrate W is transferred to the spin base 1023 while being set in the pressing state when a cleaning process is performed on the substrate W. When being set in the pressing state, the respective chuck pins 1024 grip the peripheral edge part of the substrate W and the substrate W is held in the substantially horizontal posture while being spaced apart from the spin base 1023 by a predetermined distance. In this way, the substrate W is held with the top surface Wf thereof faced upward and an under surface Wb thereof faced downward.

A blocking member 1009 is arranged above the spin chuck 1002 constructed as described above. This blocking member 1009 is in the form of a circular plate having an opening in a central part. Further, the lower surface of the blocking member 1009 is a substrate-facing surface facing the top surface Wf of the substrate W substantially in parallel and is sized to have a diameter equal to or larger than that of the substrate W. This blocking member 1009 is substantially horizontally attached to the lower end of a supporting shaft 1091. This supporting shaft 1091 is held rotatably about a vertical axis passing through the center of the substrate W by an arm 1092 extending in a horizontal direction. Further, a blocking member rotating/elevating mechanism 1093 is connected to the arm 1092.

The blocking member rotating/elevating mechanism 1093 rotates the supporting shaft 1091 about the vertical axis passing through the center of the substrate W in response to an operation command from the control unit 1004. The control unit 1004 controls the movement of the blocking member rotating/elevating mechanism 1093 and rotates the blocking member 1009 in the same rotational direction and substantially at the same rotational speed as the substrate W according to the rotation of the substrate W held by the spin chuck 1002. Further, the blocking member rotating/elevating mechanism 1093 moves the blocking member 1009 toward and conversely away from the spin base 1023 in response to an operation command from the control unit 1004. Specifically, the control unit 1004 controls the movement of the blocking member rotating/elevating mechanism 1093 to lift the blocking member 1009 to a separated position (position shown in FIG. 17) above the spin chuck 1002 when the substrate W is loaded into and unloaded from the substrate processing apparatus. On the other hand, the blocking member 1009 is lowered to a facing position set very close to the top surface Wf of the substrate W held by the spin chuck 1002 when a specified process is performed on the substrate W.

As shown in FIG. 18, the supporting shaft 1091 of the blocking member 1009 is hollow and a gas supply pipe 1095 which is open in the lower surface (substrate-facing surface) of the blocking member 1009 is inserted into the supporting shaft 1091. This gas supply pipe 1095 is connected to a normal-temperature nitrogen gas supply unit 1061. This normal-temperature nitrogen gas supply unit 1061 is for supplying a normal-temperature nitrogen gas supplied from a nitrogen gas supply source (not shown) to the substrate W and includes two paths; a drying path and a solidification promoting path.

A mass flow controller (MFC) 1611 and an on-off valve 1612 are provided in the drying path out of these two paths. This mass flow controller (MFC) 1611 can regulate the flow rate of the normal-temperature nitrogen gas with high accuracy in response to a flow rate command from the control unit 1004. Further, the on-off valve 1612 opens and closes in response to opening and closing commands from the control unit 1004 to switchingly supply and stop the supply of the nitrogen gas having the flow rate regulated by the mass flow controller 1611. Thus, by the control unit 1004 controlling the normal-temperature nitrogen gas supply unit 1061, the nitrogen gas having the flow rate regulated is supplied as a dry gas for drying the substrate W from the gas supply pipe 1095 toward a space formed between the blocking member 1009 and the top surface Wf of the substrate W at a proper timing.

Similar to the drying path, a mass flow controller (MFC) 1613 and an on-off valve 1614 are provided in the solidification promoting path. By the control unit 1004 controlling the normal-temperature nitrogen gas supply unit 1061, the nitrogen gas having the flow rate regulated is pressure-fed to a gas discharge nozzle 1007 to be described later and supplied as a solidification promoting gas to a liquid film of a solidification liquid formed on the substrate top surface Wf. Note that although the nitrogen gas is supplied as the drying gas and the solidification promoting gas from the normal-temperature nitrogen gas supply unit 1061 in this embodiment, a normal-temperature gas such as air or another inert gas may be supplied.

A liquid supply pipe 1096 is inserted through the interior of the gas supply pipe 1095. A lower end part of this liquid supply pipe 1096 is open in the lower surface of the blocking member 1009, and an upper liquid discharge nozzle 1097 is provided at the leading end of the liquid supply pipe 1096. On the other hand, an upper end part of the liquid supply pipe 1096 is connected to a DIW supply unit 1062. This DIW supply unit 1062 is for supplying normal-temperature DIW supplied from a DIW supply source (not shown) to the substrate W as a rinsing liquid and supplying high-temperature DIW heated to about 80° C. to the substrate W for a melting and removing process, and is constructed as follows. Here, two pipe lines are provided for the DIW supply source. A flow regulating valve 1621 and an on-off valve 1622 are disposed in the pipe line for a rinsing process which is one of these pipe lines. The flow regulating valve 1621 can regulate the flow rate of the normal-temperature DIW with high accuracy in response to a flow rate command from the control unit 1004. Further, the on-off valve 1622 opens and closes in response to opening and closing commands from the control unit 1004 to switchingly supply and stop the supply of the normal-temperature DIW having the flow rate regulated by the flow regulating valve 1621.

A flow regulating valve 1623, a heater 1624 and an on-off valve 1625 are disposed in another pipe line for the melting and removing process. This flow regulating valve 1623 regulates the flow rate of the normal-temperature DIW with high accuracy in response to a flow rate command from the control unit 1004 and feeds the regulated normal-temperature DIW to the heater 1624. The heater 1624 heats the fed normal-temperature DIW to about 80° C. and the heated DIW (hereinafter, referred to as "high-temperature DIW") is fed out via the on-off valve 1625. Note that the on-off valve 1625 switchingly supplies and stops the supply of the high-temperature DIW by being opened and closed in response to opening and closing commands from the control unit 1004. In this way, the normal-temperature DIW and the high-temperature DIW fed out from the DIW supply unit 1062 are discharged from the upper liquid discharge nozzle 1097 toward the top surface Wf of the substrate W at proper timings.

The center shaft 1021 of the spin chuck 1002 has a cylindrical hollow and a cylindrical liquid supply pipe 1025 for supplying the rinsing liquid to the under surface Wb of the substrate W is inserted through the interior of the center shaft 1021. The liquid supply pipe 1025 extends up to a position proximate to the under surface Wb that is the lower surface of the substrate W held by the spin chuck 1002, and a lower liquid discharge nozzle 1027 for discharging the rinsing liquid toward a central part of the lower surface of the substrate W is provided at the leading end of the liquid supply pipe 1025. The liquid supply pipe 1025 is connected to the DIW supply unit 1062 described above and supplies the high-temperature DIW as a melting and removing liquid and the normal-temperature DIW as a rinsing liquid toward the under surface Wb of the substrate W.

A clearance between the inner wall surface of the center shaft 1021 and the outer wall surface of the liquid supply pipe 1025 serves as a gas supply path 1029 having a ring-shaped cross section. This gas supply path 1029 is connected to the normal-temperature nitrogen gas supply unit 1061 and the nitrogen gas for drying is supplied from the normal-temperature nitrogen gas supply unit 1061 to a space formed between the spin base 1023 and the under surface Wb of the substrate W via the gas supply path 1029.

As shown in FIG. 17, in this embodiment, a splash guard 1051 is so provided around the spin chuck 1002 movably upward and downward relative to the rotary shaft of the spin chuck 1002 as to surround around the substrate W held in the horizontal posture by the spin chuck 1002. This splash guard 1051 is shaped to be rotationally symmetrical with respect to the rotary shaft. By moving the splash guard 1051 upward and downward in a stepwise manner by driving a guard elevating mechanism 1052, the solidification liquid for forming the liquid film, the DIW, the rinsing liquid, and other processing liquids supplied to the substrate W for other purposes that are scattered out of the rotating substrate W can be sorted out and discharged to unillustrated discharged liquid processing units from the interior of the processing chamber 1001.

A plurality of exhaust ports 1011 are provided at a bottom surface part of this processing chamber 1001, and the internal space of the processing chamber 1001 is connected to an exhaust unit 1063 via these exhaust ports 1011. This exhaust unit 1063 includes an exhaust damper and an exhaust pump and the amount of exhaust by the exhaust unit 1063 can be regulated by controlling a degree of opening of the exhaust damper. The control unit 1004 gives a command concerning the amount of opening of the exhaust damper to the exhaust unit 1063 to regulate the amount of exhaust from the processing chamber 1001 and control temperature and humidity in the internal space.

In this substrate processing apparatus, the gas discharge nozzle 1007 is connected to the solidification promoting path (mass flow controller 1613+on-off valve 1614) of the normal-temperature nitrogen gas supply unit 1061 constructed as described above. When being pressure-fed to the gas discharge nozzle 1007, the normal-temperature nitrogen gas is discharged as the solidification promoting gas from the nozzle 1007 to the top surface Wf of the substrate W held by the spin chuck 1002. Further, this gas discharge nozzle 1007 is mounted on the leading end of a horizontally extending first arm 1071 as shown in FIG. 17. The rear end of this first arm 1071 is supported rotatably about a central axis of rotation J1 on a rotary shaft 1072 hanging down from a ceiling part of the processing chamber 1001. A first arm elevating/rotating mechanism 1073 is coupled to the rotary shaft 1072, and the rotary shaft 1072 is driven and rotated about the central axis of rotation J1 or vertically moved in response to an operation command from the control unit 1004. As a result, the gas discharge nozzle 1007 mounted on the leading end of the first arm 1071 moves above the substrate top surface Wf as shown in FIG. 19.

In this embodiment, a solidification liquid discharge nozzle 1008 is movable above the substrate top surface Wf similar to the gas discharge nozzle 1007. This solidification liquid discharge nozzle 1008 supplies the solidification liquid for forming the liquid film toward the top surface Wf of the substrate W held by the spin chuck 1002. In the present invention, tert-butanol or ethylene carbonate having a solidification point higher than normal temperature is used as the solidification liquid. For example, the solidification point of the tert-butanol is 25.69° C. slightly higher than normal temperature, and that of ethylene carbonate is 36.4° C. slightly higher than that of tert-butanol. They liquefy when being heated a little and, on the other hand, are solidified when being placed in a normal-temperature environment. Accordingly, in this embodiment, the solidification liquid supply unit 1064 constructed as described next is provided and the solidification liquid supply unit 1064 and the solidification liquid discharge nozzle 1008 are connected by a pipe 1065 having a double pipe structure.

This solidification liquid supply unit 1064 includes a tank 1641 for storing the solidification liquid as shown in FIG. 18. A heater 1642 is arranged in this tank 1641 and operates in response to an operation command from the control unit 1004. The solidification liquid stored in the tank 1641 is maintained in a liquid state by increasing the temperature thereof to or above the solidification point, for example, about 30° C. when tert-butanol is used as the solidification liquid or about 50° C. when ethylene carbonate is used as the solidification liquid. Although not shown in FIG. 18, an opening used to replenish the solidification liquid is provided in the tank 1641, so that the solidification liquid can be appropriately replenished by an operator. Of course, an automatic replenishment mechanism may be provided to automatically replenish the solidification liquid when the stored amount of the solidification liquid in the tank 1641 is reduced to a predetermined level or lower.

A pipe 1643 for taking out the solidification liquid extends toward a tank bottom part in the tank 1641, and a leading end part of this pipe 1643 is immersed in the solidification liquid stored in the tank 1641. Further, the rear end of the pipe 1643 is connected to the pipe 1065 via an on-off valve 1644. This pipe 1065 is for connecting the solidification liquid supply unit 1064 and the solidification liquid discharge nozzle 1008 as described above and has such a double tube structure in which an inner tube 1652 is inserted in an outer tube 1651. The pipe 1643 is connected to one end of the inner tube 1652 and the nozzle 1008 is connected to the other end thereof.

A pressurizing pipe 1645 for pressurizing by introducing a nitrogen gas into the tank is inserted through the upper surface of the tank 1641, and connected to a nitrogen gas supply source (not shown) via an on-off valve 1646 and a mass flow controller (MFC) 1647. Thus, when the on-off valve 1646 is opened in response to a command from the control unit 1004, the nitrogen gas having the flow rate regulated by the mass flow controller 1647 is fed into the tank 1641 via the pressurizing pipe 1645. In response to this, the solidification liquid stored in the tank 1641 is pushed out and fed to the solidification liquid discharge nozzle 1008 via the on-off valve 1644 and the inner tube 1652.

If the temperature of the solidification liquid decreases while the solidification liquid is fed to the solidification liquid discharge nozzle 1008 via the inner tube 1652 of the pipe 1065 in this way, fluidity of the solidification liquid may decrease to change the supplied amount of the solidification liquid to the substrate top surface Wf or the solidification liquid may be solidified in the inner tube 1652 or the nozzle 1008. Accordingly, in this embodiment, a temperature-retaining/temperature-regulating gas supply unit 1066 is provided. This temperature-retaining/temperature-regulating gas supply unit 1066 regulates the temperature of the normal-temperature nitrogen gas to a temperature equivalent to that of the solidification liquid stored in the tank 1641 and supplies the nitrogen gas to a gas supply path formed between the outer tube 1651 and the inner tube 1652. In this temperature-retaining/temperature-regulating gas supply unit 1066, a mass flow controller 1661 regulates the flow rate of the normal-temperature nitrogen gas with high accuracy in response to a flow rate command from the control unit 1004 and feeds the normal-temperature nitrogen gas to a heater 1662. This heater 1662 is connected to the gas supply path via an on-off valve 1663, and supplies the nitrogen gas to the gas supply path via the on-off valve 1663 after heating the nitrogen gas to a temperature corresponding to the set temperature of the solidification liquid (30 to 50° C. depending on the type of the solidification liquid). The temperature of the solidification liquid present in the inner tube 1652 and the nozzle 1008 is maintained above the solidification point and substantially constant by a temperature-retaining and temperature-regulating function brought about by the supply of the heated nitrogen gas.

To rotate the nozzle 1008, which receives the supply of the temperature-retained and temperature-regulated solidification liquid in this way, about a central axis of rotation J2 and vertically move the nozzle 1008, the rear end of a horizontally extending second arm 1081 is supported rotatably about the central axis of rotation J2 on a rotary shaft 1082. On the other hand, the solidification liquid discharge nozzle 1008 is mounted on the leading end of the second arm 1081 with a discharge port (not shown) faced downward. Further, a second arm elevating/rotating mechanism 1083 is coupled to the rotary shaft 1082, and the rotary shaft 1082 is driven and rotated about the central axis of rotation J2 or vertically moved in response to an operation command from the control unit 1004. As a result, the solidification liquid discharge nozzle 1008 amounted on the leading end of the second arm 1081 moves above the substrate top surface Wf as described below.

The gas discharge nozzle 1007 and the solidification liquid discharge nozzle 1008 can respectively independently move relative to the substrate W. That is, when the first arm elevating/rotating mechanism 1073 is driven and the first arm 1071 pivots about the central axis of rotation J1 in response to an operation command from the control unit 1004 as shown in FIG. 19, the gas discharge nozzle 1007 mounted on the first arm 1071 horizontally moves along a movement trajectory T1 between a rotation center position Pc equivalent to the center of rotation of the spin base 1023 and a standby position Ps1 retracted sideways from a position facing the substrate W. That is, the first arm elevating/rotating mechanism 1073 moves the gas discharge nozzle 1007 relative to the substrate W along the top surface Wf of the substrate W.

Further, when the second arm elevating/rotating mechanism 1083 is driven and the second arm 1081 pivots about the central axis of rotation J2 in response to an operation command from the control unit 1004, the solidification liquid discharge nozzle 1008 mounted on the second arm 1081 horizontally moves along a movement trajectory T2 between a standby position Ps2 different from the standby position Ps1 of the first arm 1007 and the rotation center position Pc. That is, the second arm elevating/rotating mechanism 1083 moves the solidification liquid discharge nozzle 1008 relative to the substrate W along the top surface Wf of the substrate W.

Next, movements of the substrate processing apparatus constructed as described above are described with reference to FIGS. 20A to 20C and 21A to 21C. These figures are views diagrammatically showing movements of the substrate processing apparatus of FIG. 17. In this apparatus, when an unprocessed substrate W is loaded into the apparatus, the control unit 1004 controls the respective parts of the apparatus to perform a series of cleaning processes on the substrate W. Here, the substrate W is loaded into the processing chamber 1001 with the top surface Wf thereof faced upward beforehand and held by the spin chuck 1002. On the other hand, the blocking member 1009 is retracted to a separated position where it does not interfere with the arms 1071, 1081 while the lower surface thereof is held facing the arms 1071, 1081 as shown in FIG. 17. While the apparatus is operating, the heated nitrogen gas is supplied from the temperature-retaining/temperature-regulating gas supply unit 1066 to the gas supply path formed between the outer tube 1651 and the inner tube 1652 to maintain the temperature of the solidification liquid constant while preventing the solidification liquid from being solidified in the inner tube 1652 as a preparation step.

Figure 20A:
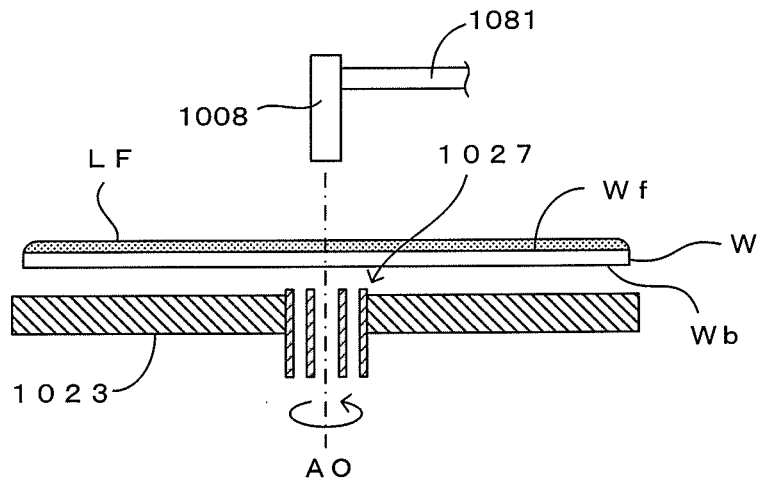
FIGS. 20A to 20C are views diagrammatically showing movements of the substrate processing apparatus of FIG. 17.

After loading of the substrate W, the control unit 1004 drives the chuck rotating mechanism 1022 to rotate the spin chuck 1002 and drives the second arm elevating/rotating mechanism 1083 to move and position the second arm 1081 to the rotation center position Pc. In this way, the solidification liquid discharge nozzle 1008 is positioned above the rotation center of the substrate top surface Wf, i.e. at the rotation center position Pc as shown in FIG. 20A. Then, the control unit 1004 controls the respective parts of the solidification liquid supply unit 1064 to feed the solidification liquid from the solidification liquid supply unit 1064 to the solidification liquid discharge nozzle 1008 via the inner tube 1652 of the pipe 1065. At this time, since an outer peripheral part of the inner tube 1652 is filled with the heated nitrogen gas as described above, the solidification liquid is pressure-fed to the nozzle 1008 while being kept at a predetermined temperature higher than normal temperature. Then, the solidification liquid is supplied from the solidification liquid discharge nozzle 1008 to the substrate top surface Wf and evenly spreads radially outwardly of the substrate W by a centrifugal force resulting from the rotation of the substrate W, and a part thereof is spun off the substrate. In this way, the thickness of the liquid film of the solidification liquid is controlled to be even over the entire substrate top surface Wf and a liquid film LF having a predetermined thickness is formed over the entire substrate top surface Wf (liquid film forming step: Step S1).

Further, when the liquid film LF is formed, the temperature thereof is higher than normal temperature. Note that, in forming the liquid film, it is not an essential requirement to spin off a part of the solidification liquid supplied to the substrate surface Wf as described above. For example, the liquid film may be formed on the substrate top surface Wf without spinning off the solidification liquid from the substrate W in a state where the rotation of the substrate W is stopped or the substrate W is rotated at a relatively low speed.

Figure 20B:
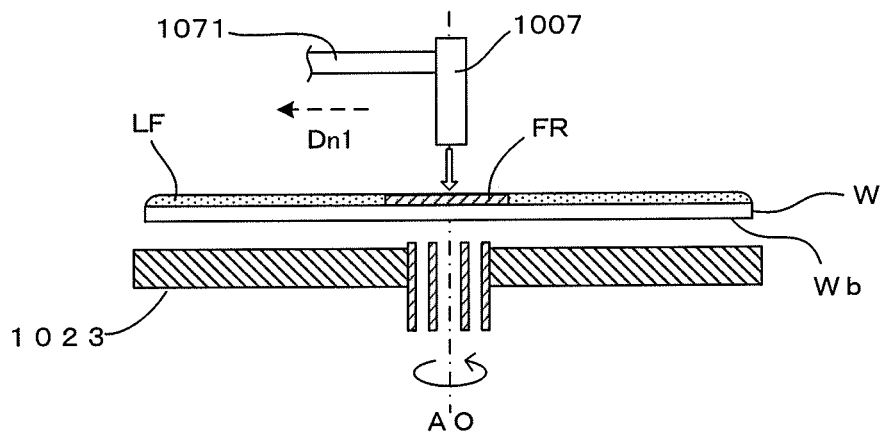

When formation of the liquid film is finished in this way, the control unit 1004 drives the second arm elevating/rotating mechanism 1083 to move the second arm 1081 to the standby position Ps2 and cause it to wait. Further, after or simultaneously with the movement of the second arm 1081, the control unit 1004 drives the first arm elevating/rotating mechanism 1073. Then, the first arm 1071 is moved to the position above the rotation center of the substrate W, i.e. to the rotation center position Pc, and the gas discharge nozzle 1007 is positioned at the position above the rotation center of the substrate W (FIG. 20B). The control unit 1004 controls the normal-temperature nitrogen gas supply unit 1061, whereby the normal-temperature nitrogen gas having the flow rate regulated is pressure-fed to the gas discharge nozzle 1007 and discharged as the solidification promoting gas toward the top surface Wf of the rotating substrate W from this nozzle 1007, thereby shortening a time required until the liquid film LF formed by the solidification liquid is solidified (solidification promoting step: Step S2).

In this embodiment, since temperature around the substrate W is near normal temperature, the temperature of the liquid film LF is reduced, though gradually, by the surrounding atmosphere of the substrate W. Further, the liquid film LF is cooled and the temperature decreases also by vaporization heat resulting from the rotation of the substrate W. However, it is preferable to increase a cooling rate by blowing the normal-temperature nitrogen gas to the liquid film LF in terms of improving throughput by shortening a time required for the freeze cleaning process. Accordingly, in this embodiment, the gas discharge nozzle 1007 is gradually moved toward an end edge position of the substrate W while the normal-temperature nitrogen gas (solidification promoting gas) is discharged from the gas discharge nozzle 1007 toward the top surface Wf of the rotating substrate W. This causes the liquid film LF formed in a surface area of the substrate top surface Wf to be partially forcibly cooled, the temperature of the liquid film LF falls below the solidification point of the solidification liquid (>normal temperature) and the liquid film LF is partially solidified. As a result, a solidified material FR (part of the solidified film FF) is formed in a central part of the substrate top surface Wf. Note that, in freezing the liquid film LF in this way, the control unit 1004 suppresses the flow rate of the normal-temperature nitrogen gas (i.e. the amount of the normal-temperature nitrogen gas per unit time) to a value suitable for solidification of the liquid film LF by controlling the mass flow controller 1613 of the normal-temperature nitrogen gas supply unit 1061. By suppressing the flow rate of the normal-temperature nitrogen gas in this way, the occurrence of a problem that the substrate top surface Wf is partially dried and exposed and a problem that a film thickness distribution becomes uneven due to wind pressure and process uniformity cannot be ensured is prevented.

Figure 20C:
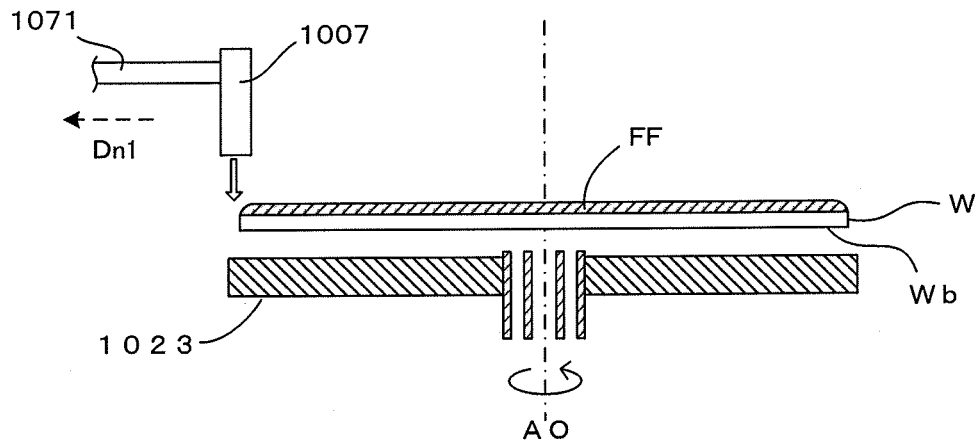

A frozen area, i.e. the solidified material FR spreads from the central part to the peripheral edge part of the substrate top surface Wf by scanning of the nozzle 1007 in a direction Dn1, and the liquid film surface on the substrate top surface Wf is entirely frozen during the scanning and the solidified film FF is formed in a short time, for example, as shown in FIG. 20C.

Figure 21A:
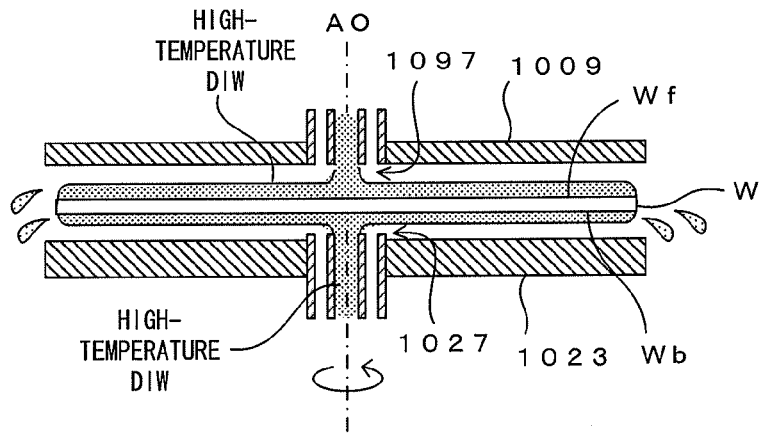
FIGS. 21A to 21C are views diagrammatically showing movements of the substrate processing apparatus of FIG. 17.
Figure 21B:
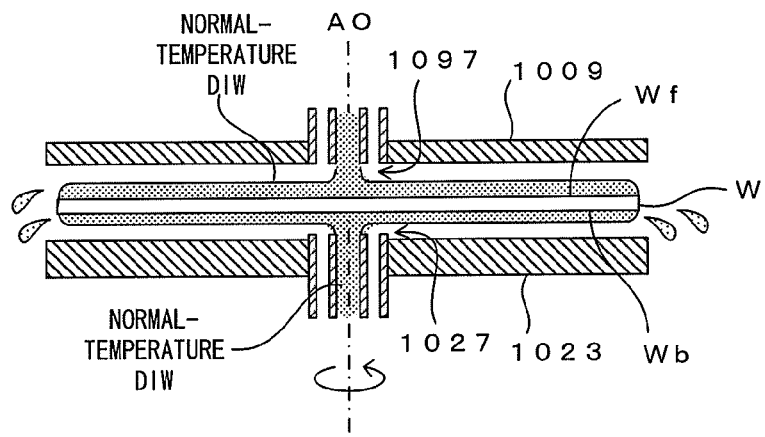

In response to the completion of this solidification, the control unit 1004 stops the discharge of the normal-temperature nitrogen gas (solidification promoting gas) from the nozzle 1007 and moves the first arm 1071 to the standby position Ps1 to retract the nozzle 1007 from the substrate top surface Wf. Thereafter, as shown in FIG. 21A, the blocking member 1009 is arranged proximate to the substrate top surface Wf and the high-temperature DIW heated to about 80° C. is supplied from the nozzle 1097 provided on the blocking member 1009 toward the frozen liquid film on the substrate top surface Wf, i.e. the solidified film (solidified material) FF to melt and remove the solidified film (solidified material) FF (melting and removing step: S3). Subsequently, as shown in FIG. 21B, the normal-temperature DIW is supplied as a rinsing liquid to the substrate top surface Wf to rinse the substrate W (Step S4).

Figure 21C:
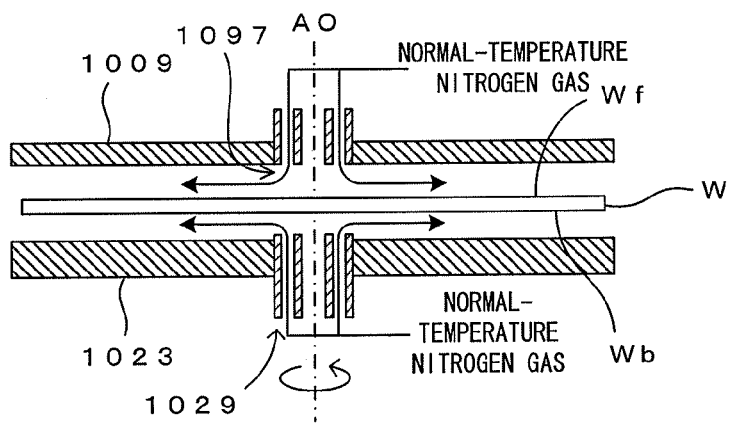

When the processes thus far are performed, the DIW is supplied to the top surface of the substrate W in a state where the substrate W rotates while being sandwiched between the blocking member 1009 and the spin base 1023. Here, in parallel with the supply of the high-temperature DIW and the normal-temperature DIW to the substrate top surface Wf, the high-temperature DIW and the normal-temperature DIW may be supplied also from the nozzle 1027 (FIGS. 21A, 21B). Subsequently, the supply of the DIW to the substrate W is stopped and, as shown in FIG. 21C, a spin-drying process for drying the substrate W by high-speed rotation is performed (Step S5). That is, the substrate W is rotated at a high speed while the nitrogen gas for drying supplied by the normal-temperature nitrogen gas supply unit 1061 is discharged from the nozzle 1097 provided on the blocking member 1009 and the gas supply path 1029 provided in the spin base 1023, whereby the DIW remaining on the substrate W is spun off to dry the substrate W. When the drying process is finished in this way, the already processed substrate W is unloaded to complete the processes for one substrate.

As described above, according to this embodiment, the liquid film LF is formed by supplying the solidification liquid having a solidification point higher than normal temperature to the top surface Wf of the substrate W and the solidified material FF is formed on the substrate top surface Wf by solidifying the liquid film LF. Thus, it is no longer necessary to use a cryogenic gas which has been essential for solidification in the conventional technology. Thus, running cost can be suppressed. Further, since heat insulation for the supply lines is not necessary, size enlargement of the apparatus and peripheral equipment can be prevented, a footprint reduction can be realized and cost of the apparatus and peripheral equipment can also be suppressed.

Further, in the fourth embodiment described above, the normal-temperature nitrogen gas is supplied as the solidification promoting gas in solidifying the liquid film LF. Since this normal-temperature nitrogen gas has a temperature lower than the solidification point of the solidification liquid, a time required to solidify the liquid film LF can be shortened and throughput can be improved.

As just described, in the fourth embodiment, the solidification liquid discharge nozzle 1008 corresponds to a "nozzle" of the invention, the solidification liquid supply unit 1064 corresponds to a "solidification liquid supplier" of the invention, and a "solidified material forming unit" of the invention is constructed by the solidification liquid supply unit 1064, the solidification liquid discharge nozzle 1008 and the pipe 1065. Further, the high-temperature DIW corresponds to a "high-temperature removing liquid" of the invention, and a "remover" of the invention is constructed by the DIW supply unit 1062 and the upper liquid discharge nozzle 1097. Further, the normal-temperature nitrogen gas supplied from the normal-temperature nitrogen gas supply unit 1061 corresponds to a "cooling fluid having a temperature lower than a solidification point of a solidification liquid" of the invention, and the normal-temperature nitrogen gas supply unit 1061 and the gas discharge nozzle 1007 function as a "solidification promoter" and a "first solidification promoting unit" of the invention. Furthermore, the temperature-retaining/temperature-regulating gas supply unit 1066 functions as a "solidification preventer" of the invention.

Fifth Embodiment

FIG. 22 is a view showing movements of a fifth embodiment of the substrate processing apparatus according to this invention. This fifth embodiment largely differs from the fourth embodiment in the content of a solidification promoting process. The other constructions are basically same as the fourth embodiment. That is, in the fifth embodiment, a solidification promoting path (mass flow controller 1613+on-off valve 1614) of a normal-temperature nitrogen gas supply unit 1061 is connected not only to a gas discharge nozzle 1007, but also to a gas supply path 1029. A control unit 1004 controls the normal-temperature nitrogen gas supply unit 1061, whereby a normal-temperature nitrogen gas having the flow rate regulated is pressure-fed to the gas discharge nozzle 1007 and the gas supply path 1029 and supplied as a solidification promoting gas not only to a top surface Wf, but also to an under surface Wb of a substrate W (Step S2A). This can further shorten a time required to solidify a liquid film LF. In this way, in the fifth embodiment, the normal-temperature nitrogen gas supply unit 1061 and the gas supply path 1029 function as the "solidification promoter" and a "second solidification promoting unit" of the invention.

Sixth Embodiment

FIG. 23 is a view showing movements of a sixth embodiment of the substrate processing apparatus according to this invention. This sixth embodiment largely differs from the fourth and fifth embodiments in that a liquid film LF is left as it is for a predetermined time to form a solidified film FF after being formed by supplying a solidification liquid to a top surface Wf of a substrate W (Step S1A) and the solidification promoting process (Steps S2, S2A) is omitted. Note that the other constructions are basically same as the fourth and fifth embodiments. That is, since a solidification liquid having a solidification point higher than normal temperature such as tert-butanol or ethylene carbonate is used in the present invention instead of DIW used in the conventional freeze cleaning technology, the solidification liquid supplied to the top surface Wf of the substrate W is gradually cooled and solidified by being left in a normal-temperature atmosphere of the processing chamber 1001. Further, vaporization heat generated in rotating the substrate W acts to solidify the solidification liquid. Accordingly, in the sixth embodiment, the apparatus construction is simplified without providing the gas discharge nozzle 1007 and the solidification promoting path (mass flow controller 1613+on-off valve 1614).

Seventh Embodiment

FIG. 24 is a view showing movements of a seventh embodiment of the substrate processing apparatus according to this invention. This seventh embodiment largely differs from the fourth embodiment in how to remove the solidified film (solidified material) FF and the temperature of the DIW used therefor, and the other constructions are basically same as the fourth embodiment. That is, the high-temperature DIW having a temperature higher than the solidification point of the solidification liquid is used to remove the solidified film (solidified material) FF in the fourth embodiment, whereas normal-temperature DIW is used in the seventh embodiment. This utilizes the fact that solubility of tert-butanol and ethylene carbonate into the normal-temperature DIW is relatively high, and the solidified film FF is dissolved and removed by supplying the normal-temperature DIW (Step S3A). In the seventh embodiment in which the high-temperature DIW is not used in this way, it is not necessary to provide the pipe path for the melting and removing process (flow regulating valve 1623+heater 1624+on-off valve 1622), the apparatus construction can be simplified and running cost can be reduced since the DIW needs not be heated. Further, the removing process and the rinsing process can be successively or integrally performed to make the processes more efficient.

Eighth Embodiment

Freeze cleaning is for removing particles and the like adhering to a substrate top surface by removing a solidified material from the substrate top surface after a solidification liquid supplied to the top surface Wf of a substrate W is solidified as described above, and removal efficiency is closely related to an end-point temperature of the solidified material. This is the finding obtained by the present inventors based on an experiment using DIW as a solidification liquid, and the content of this finding is that particle removal efficiency is improved not only by merely freezing a DIW liquid film, but also reducing an end-point temperature of the liquid film after freezing. It is easily inferred that similar functions and effects are obtained by applying this finding to a case where tert-butanol, ethylene carbonate or the like is a solidification liquid. Accordingly, after the content of the above experiment and the content of the finding are described in detail, embodiments to which this finding is applied are described below.

Figure 25:
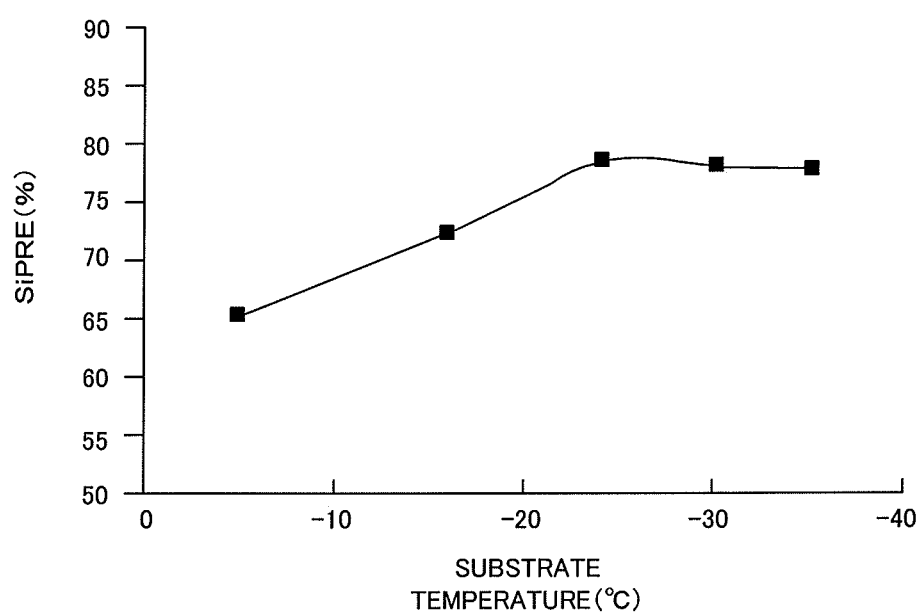
FIG. 25 is a graph showing a relationship between liquid film temperature and particle removal efficiency in a freeze cleaning technology.

FIG. 25 is a graph showing a relationship between liquid film temperature and particle removal efficiency in a so-called freeze cleaning technology and, specifically, this relationship was obtained by the following experiment. In this experiment, bare (state where no pattern is formed) Si wafers (wafer diameter: 300 mm) are selected as a representative example of substrates. Further, evaluation is made for a case where substrate surfaces are contaminated by Si debris (particle diameter: 0.08 μm or larger) as particles.

First, wafers (substrates) are forcibly contaminated using a single-substrate processing apparatus (Spin Processor SS-3000 produced by Dai Nippon Screen MFG Co., Ltd.). Specifically, a dispersion liquid in which particles (Si debris) are dispersed is supplied to the wafer from a nozzle arranged to face the wafer while the wafer is rotated. Here, the amount of the dispersion liquid, the number of rotations of the wafer and a processing time are appropriately so adjusted that the number of particles adhering to the wafer surface is about 10000. Thereafter, the number (initial value) of the particles adhering to the wafer surface is measured. Note that the number of the particles is measured for an area of the wafer excluding a 3 mm-peripheral area from the outer periphery (edge cut) using a wafer inspection equipment SP1 produced by KLA-Tencor.

Subsequently, the following cleaning process is performed on each wafer. First, DIW temperature-regulated to 0.5° C. is discharged for 6 seconds to the wafer rotating at 150 rpm to cool the wafer. Thereafter, the discharge of the DIW is stopped and the number of rotations of the wafer is maintained for 2 seconds, whereby redundant DIW is spun off to form a liquid film. After formation of the liquid film, the number of rotations of the wafer is reduced to 50 rpm and a nitrogen gas of −190° C. is discharged to the wafer surface at a flow rate of 90 [L/min] by a scan nozzle while the number of rotations of the wafer is maintained. The nozzle is scanned back and forth between the center and the end of the wafer for 20 seconds. Black rectangles in FIG. 25 correspond to the numbers of scans, and the result up to five scans is shown in FIG. 25 with the leftmost black rectangle representing one scan, the second leftmost one representing two scans, and so forth. By changing the number of scans in this way, the temperature after freezing is changed.

After the above cooling is finished, the number of rotations of the wafer is set to 2000 rpm and DIW temperature-regulated to 80° C. is discharged at a flow rate of 4.0 [L/min] for 2 seconds. Thereafter, the number of rotations of the wafer is set to 500 rpm and normal-temperature DIW as a rinsing liquid is supplied at a flow rate of 1.5 [L/min] for 30 seconds to rinse the wafer. Thereafter, the wafer is spin-dried by being rotated at a high speed.

The number of particles adhering to the wafer surface having a series of cleaning processes performed thereon in this way is measured. Then, a removal rate is calculated by comparing the number of particles after freeze cleaning and the initial number of particles measured earlier (before the freeze cleaning process). The graph shown in FIG. 25 is obtained by plotting data obtained in this way.

As is clear from FIG. 25, the particle removal efficiency is improved and the cleaning effect is improved not only by merely freezing the liquid film, but also by reducing the end-point temperature of the liquid film after freezing. Accordingly, in the eighth embodiment described next, a cooling process using a normal-temperature nitrogen gas is performed on a solidified material FF to improve the particle removal efficiency.

Figure 26:
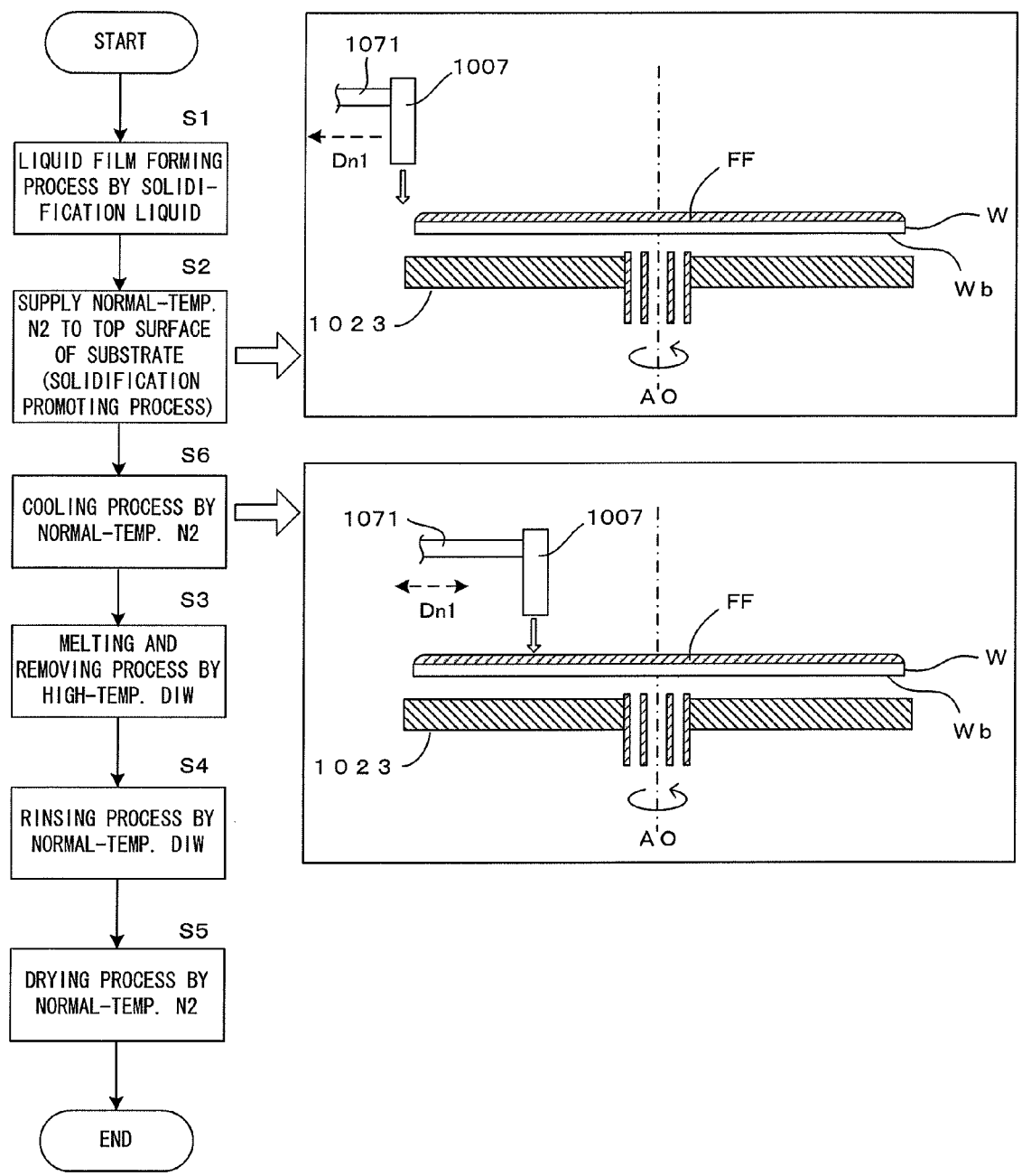
FIG. 26 is a view showing movements of an eighth embodiment of the substrate processing apparatus according to this invention.

FIG. 26 is a view showing movements of the eighth embodiment of the substrate processing apparatus according to this invention. This eighth embodiment largely differs from the fourth embodiment in that a cooling process (Step S6) is performed after a solidified film (solidified material) FF is formed via a solidification promoting process (Step S2) and before the solidified film FF is removed (Step S3) and the other constructions are basically the same as the fourth embodiment. In this cooling process, a gas discharge nozzle 1007 continues to discharge a normal-temperature nitrogen gas to a substrate top surface Wf after the solidification promoting process, and is scan-moved above the substrate top surface Wf to cool the solidified film FF with the discharge state kept. Since an end-point temperature of the solidified film FF is reliably reduced to normal temperature by this, particle removal efficiency can be improved.

Note that in the case of forming the solidified film FF without performing the solidification promoting process (Step S2) (e.g. sixth embodiment shown in FIG. 23), the gas discharge nozzle 1007 may be scan-moved above the substrate top surface Wf to cool the solidified film FF while discharging the normal-temperature nitrogen gas supplied from a normal-temperature nitrogen gas supply unit 1061 at a timing at which a solidification liquid is solidified. As just described, in the eighth embodiment and its modification, the normal-temperature nitrogen gas supply unit 1061 and the gas discharge nozzle 1007 function as a "cooler" and a "first cooling unit" of the invention.

Ninth Embodiment

Figure 27:
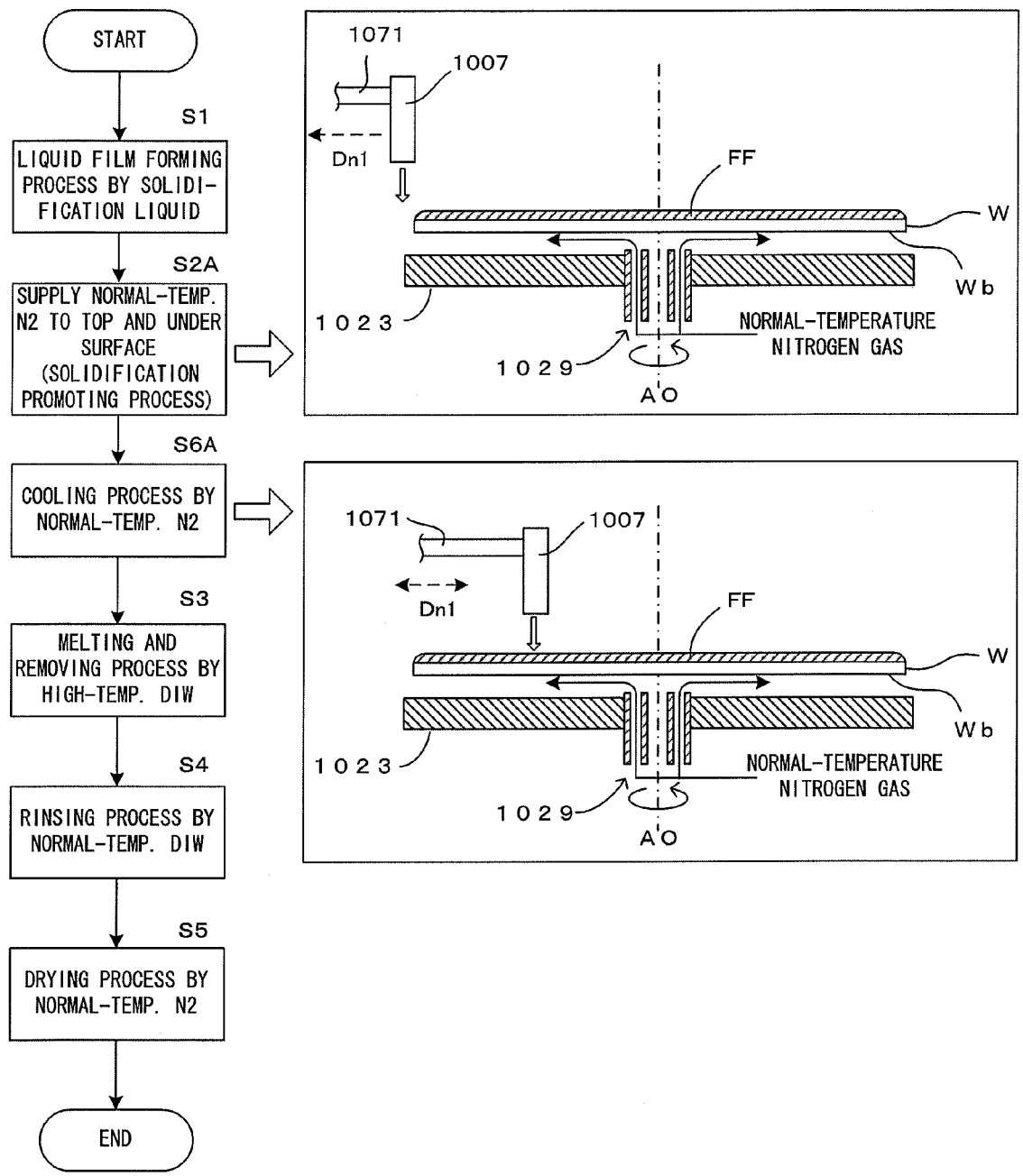
FIG. 27 is a view showing movements of a ninth embodiment of the substrate processing apparatus according to this invention.

FIG. 27 is a view showing movements of the ninth embodiment of the substrate processing apparatus according to this invention. This ninth embodiment largely differs from the fifth embodiment (FIG. 22) in that a cooling process (Step S6A) is performed after a solidified film (solidified material) FF is formed via a solidification promoting process (Step S2A) and before the solidified film FF is removed (Step S3) and the other constructions are basically the same as the fifth embodiment. In this cooling process, a normal-temperature nitrogen gas is supplied to an under surface Wb of a substrate W from a gas supply path 1029 and a gas discharge nozzle 1007 is scan-moved above a substrate top surface Wf while discharging the normal-temperature nitrogen gas toward the substrate top surface Wf as in the eighth embodiment. Since the solidified film (solidified material) FF is cooled by supplying the normal-temperature nitrogen gas to both the top surface Wf and the under surface Wb of the substrate W in this way, particle removal efficiency can be improved. In addition, since an end-point temperature of the solidified film FF can be reduced to normal temperature in a shorter time than in the eighth embodiment, a processing time can be shortened.

Note that in the case of forming the solidified film FF without performing the solidification promoting process (Step S2A) (e.g. sixth embodiment shown in FIG. 23), the gas discharge nozzle 1007 may be scan-moved above the substrate top surface Wf while discharging the normal-temperature nitrogen gas supplied from a normal-temperature nitrogen gas supply unit 1061 and the normal-temperature nitrogen gas may be supplied to the under surface Wb of the substrate W from the gas supply path 1029 at a timing at which a solidification liquid is solidified. As just described, in the ninth embodiment and its modification, the normal-temperature nitrogen gas supply unit 1061, the gas discharge nozzle 1007 and the gas supply path 1029 function as the "cooler" of the invention and, out of these, a combination of the normal-temperature nitrogen gas supply unit 1061 and the gas discharge nozzle 1007 corresponds to the "first cooling unit" of the invention and a combination of the normal-temperature nitrogen gas supply unit 1061 and the gas supply path 1029 corresponds to a "second cooling unit" of the invention.

Tenth Embodiment

Although the normal-temperature nitrogen gas is used as a cooling fluid for cooling the solidified film (solidified material) FF to reduce the end-point temperature in the above eighth embodiment (FIG. 26) and ninth embodiment (FIG. 27), normal-temperature DIW may be utilized instead of the normal-temperature nitrogen gas.

FIG. 28 is a view showing movements of the tenth embodiment of the substrate processing apparatus according to this invention. In this tenth embodiment, when a solidified film (solidified material) FF is formed via a solidification promoting process (Step S2), the discharge of a normal-temperature nitrogen gas (solidification promoting gas) from a nozzle 1007 is stopped, and a first arm 1071 is moved to a standby position Ps1 to retract the nozzle 1007 from a substrate top surface Wf. Thereafter, a blocking member 1009 is arranged proximate to the substrate top surface Wf and normal-temperature DIW is supplied toward the solidified film (solidified material) FF from a nozzle 1097 provided on the blocking member 1009 (Step S6B). Note that since the purpose of the cooling process is to reduce the end-point temperature of the solidified film FF to the vicinity of normal temperature in this embodiment, the supply of the normal-temperature DIW is stopped before the solidified film FF is dissolved and removed by the normal-temperature DIW. After the temperature of the solidified film FF is reduced in this way, a melting and removing process by high-temperature DIW (Step S3), a rinsing process by the normal-temperature DIW (Step S4) and a drying process by the normal-temperature nitrogen gas (Step S5) are performed.

As just described, in the tenth embodiment, particle removal efficiency can be improved using the normal-temperature DIW and a DIW supply unit 1062 and an upper liquid discharge nozzle 1097 function as the "cooler" and the "first cooling unit" of the invention.

Eleventh Embodiment

Figure 29:
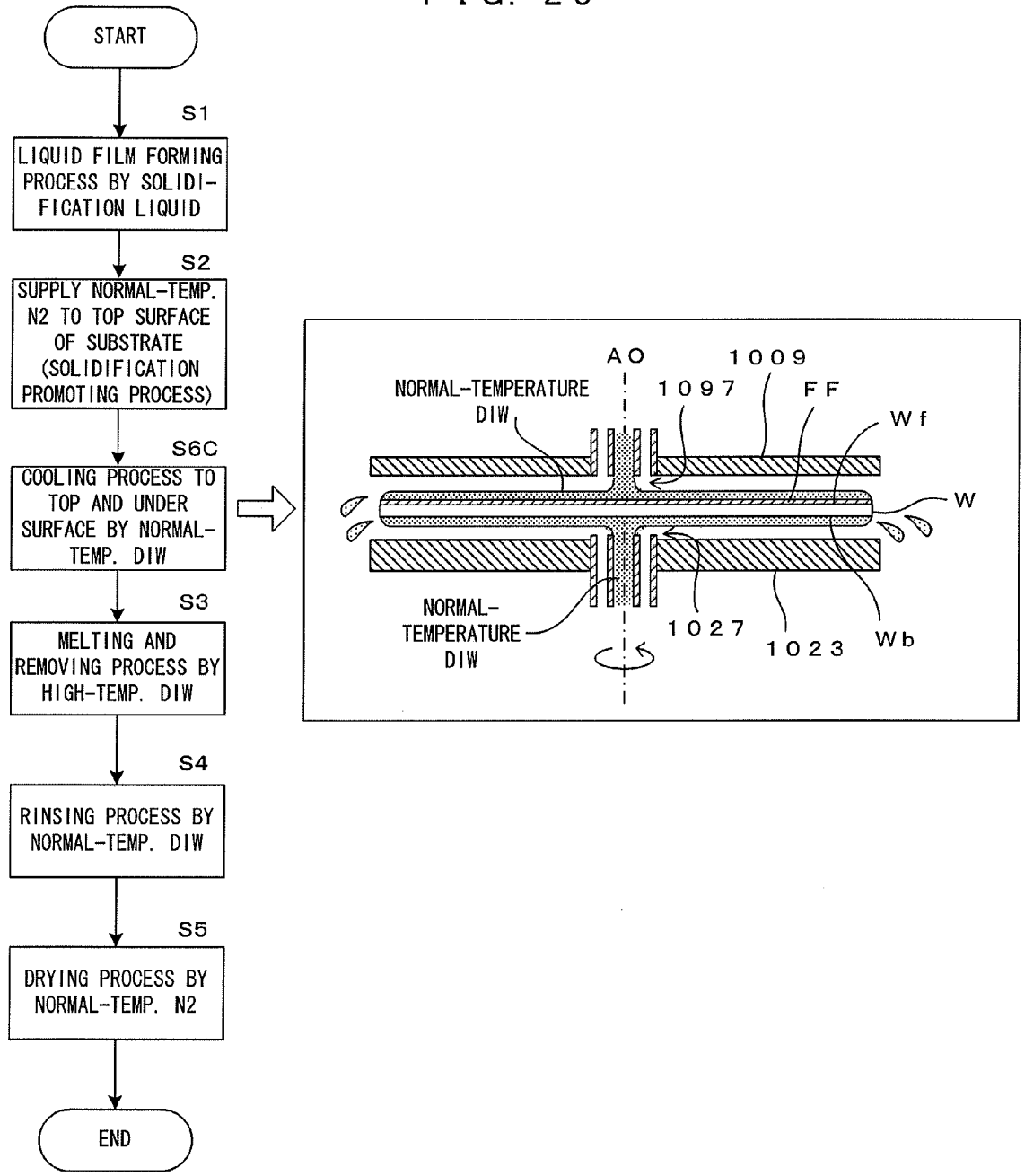
FIG. 29 is a view showing movements of an eleventh embodiment of the substrate processing apparatus according to this invention.

FIG. 29 is a view showing movements of the eleventh embodiment of the substrate processing apparatus according to this invention. In this eleventh embodiment, when a solidified film (solidified material) FF is formed via a solidification promoting process (Step S2), the discharge of a normal-temperature nitrogen gas (solidification promoting gas) from nozzles 1007, 1027 is stopped, and a first arm 1071 is moved to a standby position Ps1 to retract the nozzle 1007 from a substrate top surface Wf. Thereafter, a blocking member 1009 is arranged proximate to the substrate top surface Wf and normal-temperature DIW is supplied toward the solidified film (solidified material) FF from a nozzle 1097 provided on the blocking member 1009 and also supplied to an under surface Wb of the substrate W from the nozzle 1027 (Step S6C). Note that, in this embodiment as well, the supply of the normal-temperature DIW from the nozzle 1007 is stopped before the solidified film FF is dissolved and removed by the normal-temperature DIW as in the tenth embodiment. After the temperature of the solidified film FF is reduced in this way, a melting and removing process by high-temperature DIW (Step S3), a rinsing process by the normal-temperature DIW (Step S4) and a drying process by the normal-temperature nitrogen gas (Step S5) are performed.

As just described, in the eleventh embodiment, particle removal efficiency can be improved using the normal-temperature DIW and a DIW supply unit 1062, the upper liquid discharge nozzle 1097 and the lower liquid discharge nozzle 1027 function as the "cooler" of the invention. Out of these, a combination of the DIW supply unit 1062 and the upper liquid discharge nozzle 1097 corresponds to the "first cooling unit" of the invention and a combination of the DIW supply unit 1062 and the lower liquid discharge nozzle 1027 corresponds to the "second cooling unit" of the invention Twelfth Embodiment Although the normal-temperature DIW is supplied to the solidified film (solidified material) FF from the nozzle 1007 to such a degree that the solidified film FF is neither dissolved nor removed by the normal-temperature DIW in the tenth and eleventh embodiments, the solidified film FF may be dissolved and removed by continuing to supply the normal-temperature DIW to the top surface Wf of the substrate W as described above. Further, the substrate W can be rinsed by further continuing to supply the normal-temperature DIW even after the solidified film FF is removed. Accordingly, in the twelfth embodiment, a cooling process (Step S6B), a removing process (Step S3A) and a rinsing process (Step S4) are performed using normal-temperature DIW as shown in FIG. 30. In the twelfth embodiment in which high-temperature DIW is not used, it is not necessary to provide the pipe path for the melting and removing process (flow regulating valve 1623+heater 1624+on-off valve 1622), the apparatus construction can be simplified and running cost can be reduced since the DIW needs not be heated. Further, the cooling process, the removing process and the rinsing process can be successively or integrally performed to make the processes more efficient.

Figure 31:
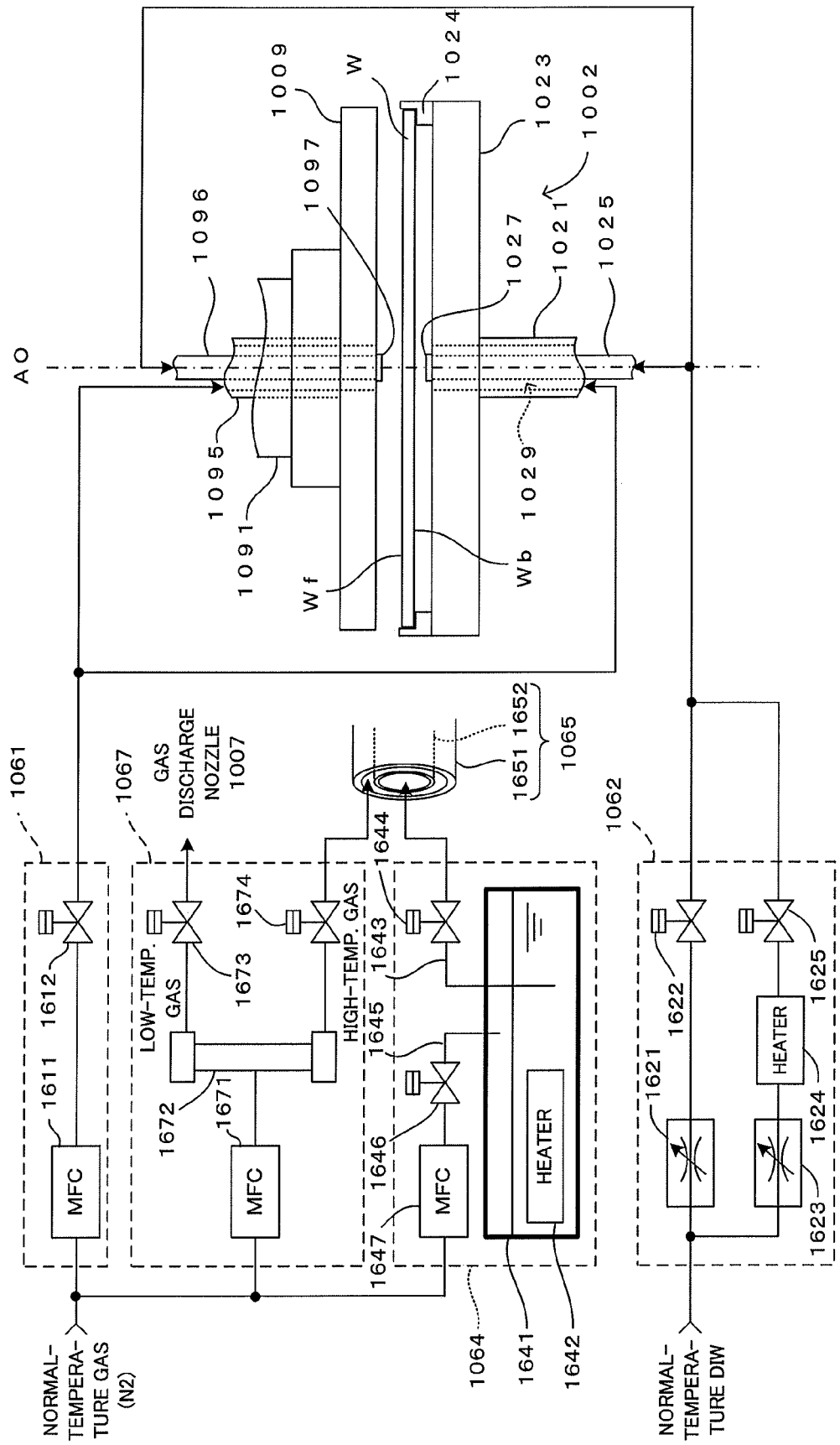
FIG. 31 is a view showing a thirteenth embodiment of the substrate processing apparatus according to this invention.

Note that the invention is not limited to the above embodiments and various changes besides those described above can be made without departing from the gist thereof. For example, although the normal-temperature nitrogen gas is heated to obtain the nitrogen gas for temperature retention/temperature regulation using the heater 1662 of the temperature-retaining/temperature-regulating gas supply unit 1066 in the above embodiments, a means for generating the nitrogen gas for temperature retention/temperature regulation is not limited to this and a vortex tube may be used, for example, as shown in FIG. 31. By using the vortex tube, it is possible to not only generate a high-temperature nitrogen gas, but also simultaneously generate a low-temperature nitrogen gas, which can be used as a cooling gas. A thirteenth embodiment of the invention is described below with reference to FIG. 31.

Thirteenth Embodiment

FIG. 31 is a view showing the thirteenth embodiment of the substrate processing apparatus according to this invention. In this thirteenth embodiment, a high-temperature/low-temperature nitrogen gas supply unit 1067 is provided. This high-temperature/low-temperature nitrogen gas supply unit 1067 includes a mass flow controller (MFC) 1671, a vortex tube 1672 and two on-off valves 1673, 1674. This mass flow controller 1671 can regulate the flow rate of a normal-temperature nitrogen gas with high accuracy in response to a flow rate command from a control unit 1004. Further, the vortex tube 1672 includes a supply port, a warm air discharge port and a cold air discharge port. When the nitrogen gas regulated by the mass flow controller 1671 flows into the tube through the supply port, it is thermally separated between the warm air discharge port and the cold air discharge port. Then, a high-temperature nitrogen gas higher than normal temperature is discharged from the warm air discharge port and a low-temperature nitrogen gas lower than normal temperature is discharged from the cold air discharge port. Note that the vortex tube 1672 itself is not described in detail here since being known.

The cold air discharge port of the vortex tube 1672 is connected to a gas discharge nozzle 1007 via the on-off valve 1673, and the low-temperature nitrogen gas is supplied as a solidification promoting gas to the gas discharge nozzle 1007 when the on-off valve 1673 is opened in response to an opening command from the control unit 1004. Further, the warm air discharge port of the vortex tube 1672 is connected to a gas supply path of a pipe 1065 via the on-off valve 1674, and the high-temperature nitrogen gas is supplied as a nitrogen gas for temperature retention/temperature regulation to the pipe 1065 when the on-off valve 1674 is opened in response to an opening command from the control unit 1004.

As just described, in this embodiment, the high-temperature nitrogen gas and the low-temperature nitrogen gas are generated from the normal-temperature nitrogen gas, solidification can be promoted and the temperature of the solidification liquid can be retained by using these, and freeze cleaning can be performed with excellent efficiency. Thus, in the thirteenth embodiment, the high-temperature/low-temperature nitrogen gas supply unit 1067 functions as the "solidification promoter" and the "solidification preventer" of the invention.

Further, although the pipe 1065 is formed to have a double tube structure and the nitrogen gas for temperature retention/temperature regulation is supplied to the gas supply path of the pipe 1965 to keep the temperature of the solidification liquid constant and prevent solidification in the pipe 1065 and the nozzle 1007 in the above embodiment, a wire-shaped heater may be arranged along a pipe to regulate the temperature of the solidification liquid in the pipe and a nozzle instead of using the nitrogen gas for temperature retention/temperature regulation. In this case, the heater functions as the "solidification preventer" of the invention.

Fourteenth Embodiment

Figure 32:
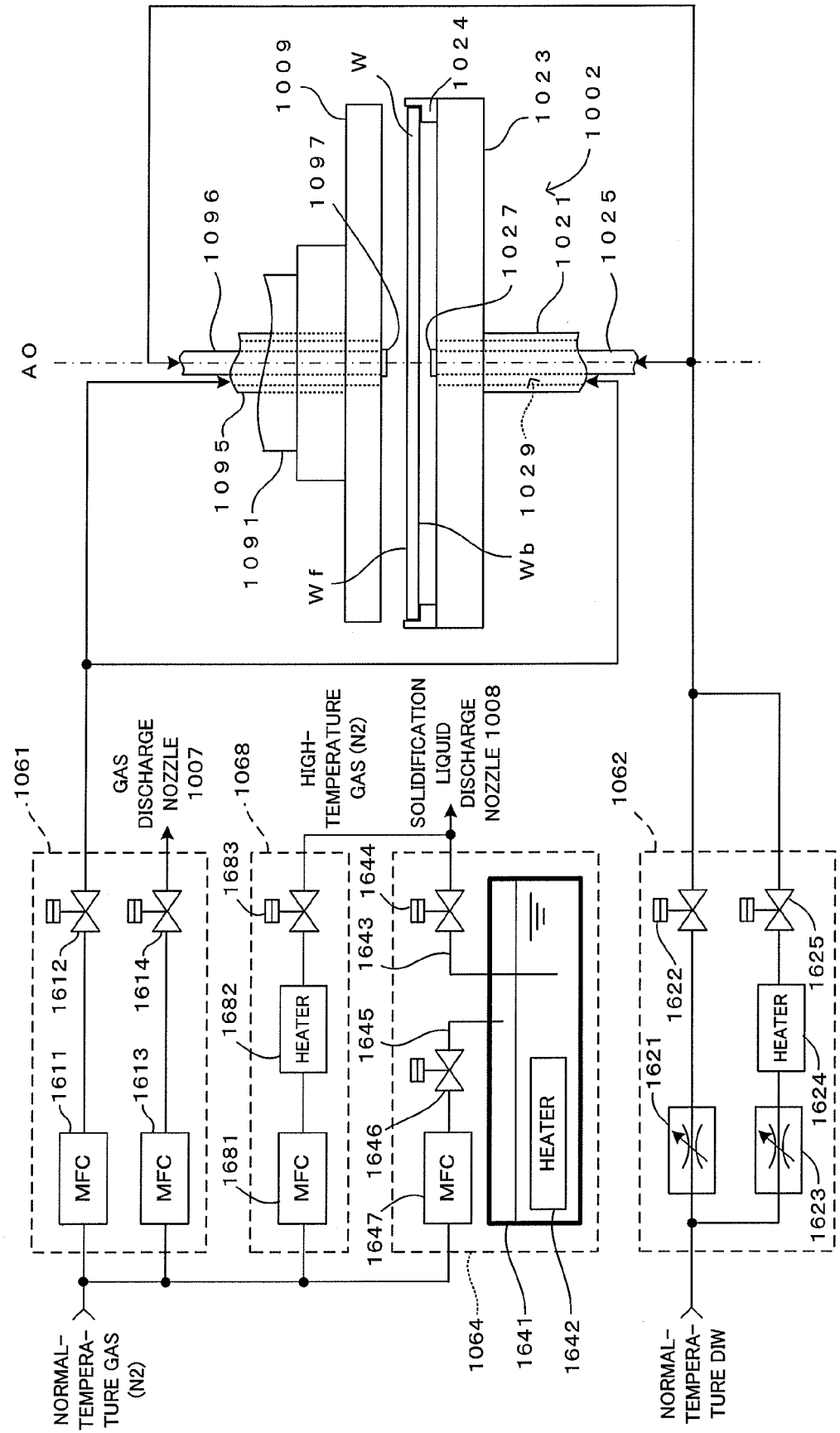
FIG. 32 is a view showing a fourteenth embodiment of the substrate processing apparatus according to this invention.

Further, instead of regulating the temperature of the solidification liquid in the pipe and the nozzle, the solidification liquid remaining in the pipe and the nozzle after the discharge of the solidification liquid from the nozzle 1007 is completed may be removed. For example, a pipe having a single tube structure may be used and a purging gas supply unit 1068 may be provided as shown in FIG. 32. Note that the purging gas supply unit 1068 has a basic construction similar to that of the temperature-retaining/temperature-regulating gas supply unit 1066 and includes a mass flow controller (MFC) 1681, a heater 1682 and an on-off valve 1683.

In response to an opening command from the control unit 1004 after the discharge of the solidification liquid from the nozzle 1007 is completed, the on-off valve 1683 can be opened and the solidification liquid remaining in the pipe and the nozzle 1007 can be purged from a discharge port (not shown) of the nozzle 1007 by pressure-feeding a high-temperature nitrogen gas heated to a temperature higher than the solidification point of the solidification liquid by the heater 1682 to the pipe. As just described, since the solidification liquid remaining in the pipe and the nozzle 1007 is purged at a proper timing in the fourteenth embodiment shown in FIG. 32, solidification of the solidification liquid in the pipe and the nozzle 1007 can be reliably prevented. Thus, in the fourteenth embodiment, the purging gas supply unit 1068 functions as the "solidification preventer" and a "purging unit" of the invention.

Fifteenth Embodiment

Figure 33:
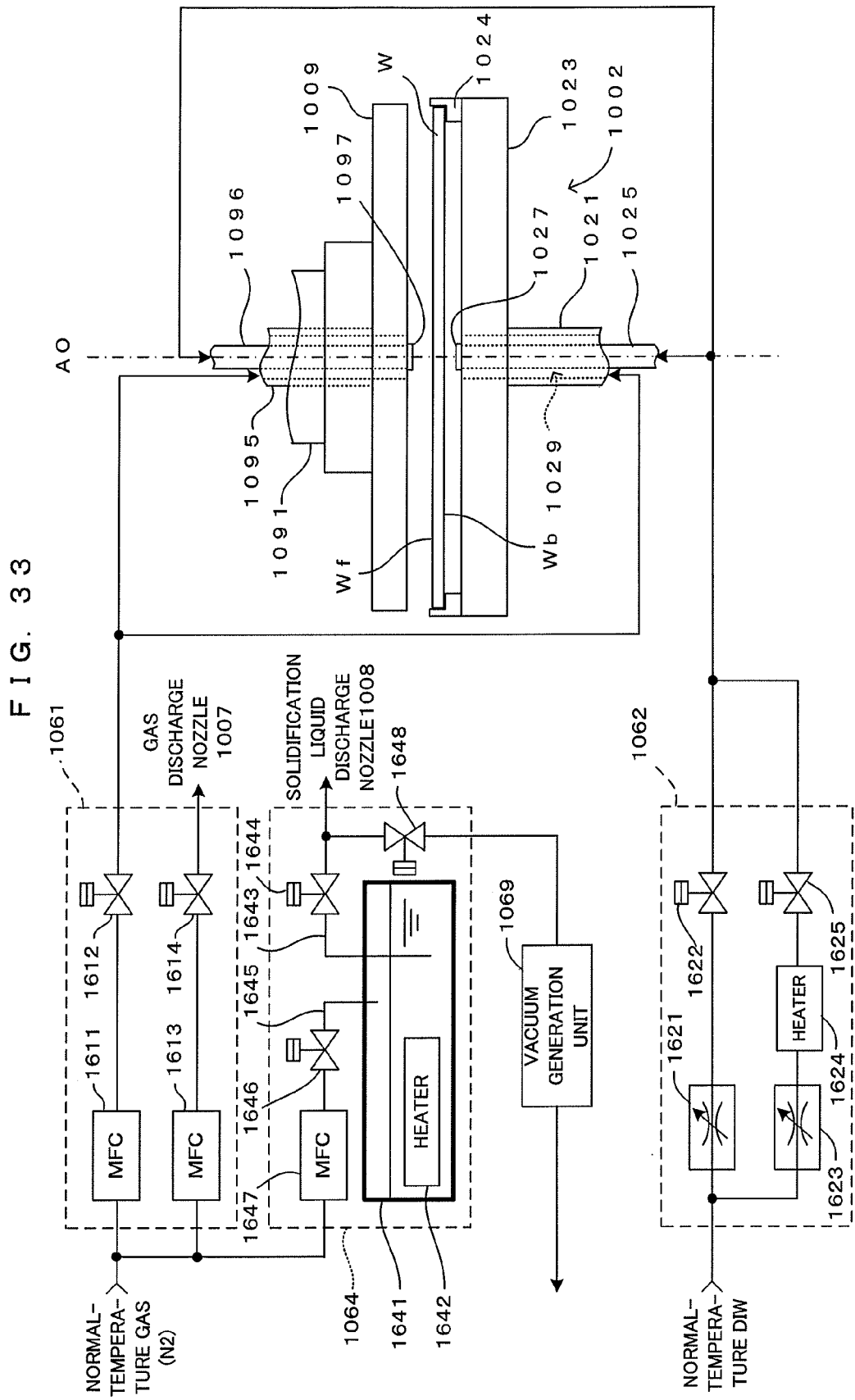
FIG. 33 is a view showing a fifteenth embodiment of the substrate processing apparatus according to this invention.

Further, instead of purging the remaining solidification liquid from the discharge port of the nozzle 1007, a vacuum generation unit 1069 such as "Convum (registered trademark)" may be provided, for example, as shown in FIG. 33. This vacuum generation unit 1069 is connected to a pipe via an on-off valve 1648. An on-off valve 1644 is closed and the on-off valve 1648 is opened in response to an operation command from a control unit 1004 after the discharge of a solidification liquid from a nozzle 1007 is completed, whereby the vacuum generation unit 1069 sucks and discharges the solidification liquid remaining in the pipe and the nozzle 1007. As just described, since the solidification liquid remaining in the pipe and the nozzle 1007 is sucked and discharged at a proper timing in the fifteenth embodiment shown in FIG. 33, solidification of the solidification liquid in the pipe and the nozzle 1007 can be reliably prevented. Thus, in the fifteenth embodiment, the vacuum generation unit 1069 functions as the "solidification preventer" and a "suction and discharge unit" of the invention.

Although the nitrogen gas supply source and the DIW supply source are both built in the substrate processing apparatuses of the above embodiments, these supply sources may be provided outside the apparatuses and, for example, supply sources existing in a factor may be utilized.

Further, although the substrate processing apparatuses of the above embodiments include the blocking member 1009 arranged above and proximate to the substrate W, the invention is applicable also to apparatuses including no blocking member. Further, although the substrate W is held by the chuck pins 1024 held in contact with the peripheral edge part thereof in the apparatuses of these embodiments, the substrate holding method is not limited to this and the invention can also be applied to apparatuses in which a substrate is held by another method.

As described above, in the second aspect of the invention, the solidification liquid having a solidification point higher than normal temperature is preferably supplied to the substrate in the solidified material forming step. Similarly, the solidified material forming unit preferably supplies the solidification liquid having a solidification point higher than normal temperature to the top surface of the substrate.

In the invention (substrate processing method and substrate processing apparatus) thus constructed, freeze cleaning is performed using the solidification liquid having the solidification point higher than normal temperature instead of DIW used in the conventional freeze cleaning technology. Accordingly, the solidification liquid supplied to the upper surface of the substrate is solidified even when being left as it is in a normal temperature atmosphere. Thus, it is no longer necessary to use a cryogenic gas which has been essential for solidification in the conventional freeze cleaning technology and running cost for freeze cleaning is reduced. Further, since the cryogenic gas is not necessary, heat insulation for the supply lines carried out in the conventional technology becomes unnecessary and cost of the apparatus and peripheral equipment is also be suppressed. Note that the "cryogenic gas" mentioned in this specification means a gas whose temperature is forcibly reduced using a cryogenic material such as liquid nitrogen.

Here, the solidified material forming unit may supply the solidification liquid to the top surface of the substrate while heating it to a temperature equal to or higher than the solidification point of the solidification liquid, and fluidity of the solidification liquid is increased and the solidification liquid is easily supplied to the substrate top surface by heating the solidification liquid in this way. Further, since the solidification liquid is evenly supplied to the substrate top surface, in-plane uniformity of a removal rate of removing particles and the like is improved.

Further, the solidification promoter for supplying a cooling fluid having a temperature lower than the solidification point of the solidification liquid to the substrate may be provided to promote solidification of the solidification liquid, whereby a processing time can be shortened. The first solidification promoting unit for supplying the cooling fluid to the top surface of the substrate to which the solidification liquid was supplied or the second solidification promoting unit for supplying the cooling fluid to the under surface of the substrate to which the solidification liquid was supplied may be, for example, provided as the solidification promoter.

Further, since temperature around the substrate held by the substrate holder is usually normal temperature in the substrate processing apparatus of this type, the temperature of the solidification liquid gradually approaches normal temperature to be solidified with time. Accordingly, the solidified material may be removed by the remover after the solidification liquid is solidified with the passage of time following the supply of the solidification liquid to the top surface of the substrate.

The remover for removing the solidified material may be constructed as follows. For example, a high-temperature removing liquid having a temperature higher than the solidification point of the solidification liquid may be supplied to the top surface of the substrate formed with the solidified material to melt and remove the solidified material. Further, a removing liquid for dissolving the solidification liquid may be supplied to the top surface of the substrate formed with the solidified material to dissolve and remove the solidified material.

As described in detail later, as the end-point temperature of the solidified material decreases, efficiency in removing particles and the like adhering to the top surface of the substrate is improved. Accordingly, the cooler for cooling the solidified material to reduce the temperature of the solidified material after the solidified material is formed and before the solidified material is removed may be provided. The first cooling unit for supplying a cooling fluid having a temperature lower than the solidification point of the solidification liquid to the top surface of the substrate formed with the solidified material or the second cooling unit for supplying a cooling fluid having a temperature lower than the solidification point of the solidification liquid to the under surface of the substrate formed with the solidified material may be provided as this cooler.

In the case of promoting solidification by the cooling fluid of the solidification promoter, the supply of the cooling fluid may be continued to cool the solidified material until a time point before the solidified material is removed by the remover even after the solidified material is formed. That is, the solidification promoting process and the cooling process can be successively performed by the solidification promoter, thereby improving process efficiency.

Further, the rinser may be further provided which rinses the top surface of the substrate by supplying the rinsing liquid to the top surface of the substrate after the solidified material is removed by the remover. Further, the remover may be caused to function as the rinser. That is, by continuing the supply of the removing liquid even after the solidified material is removed by the remover supplying the removing liquid to the top surface of the substrate, the top surface of the substrate can be rinsed. By successively performing the removing process and the rinsing process in this way, process efficiency can be improved.

When the solidified material forming unit including the solidification liquid supplier for supplying the solidification liquid and the pipe having one end connected to the solidification liquid supplier and the other end connected to the nozzle to cause the solidification liquid supplied from the solidification liquid supplier to flow to the nozzle, the solidification liquid can be no longer supplied if the solidification liquid in the nozzle and the pipe is solidified. Accordingly, in the case of performing freeze cleaning using the solidification liquid, it is preferable to provide the solidification preventer for preventing solidification of the solidification liquid in the nozzle and the pipe, and the solidification preventer can be adopted in various modes. For example, the solidification preventer may be so constructed as to keep the temperature of the solidification liquid in the nozzle and the pipe equal to or higher than the solidification point of the solidification liquid. Further, in the case of adopting a pipe having a double tube structure (inner tube+outer tube) as the pipe, a temperature-retaining fluid supplier for supplying a high-temperature temperature-retaining fluid having a temperature higher than that of the solidification liquid may be provided as the solidification preventer between the inner tube and the outer tube. Further, a purging unit for discharging the solidification liquid in the nozzle and the pipe from the discharge port of the nozzle by supplying a high-temperature purging fluid having a temperature higher than that of the solidification liquid to one end of the pipe after the solidified material is formed by the solidified material forming unit may be provided as the solidification preventer. Furthermore, a suction and discharge unit for discharging the solidification liquid in the nozzle and the pipe from the one end of the pipe by applying a negative pressure to the one end of the pipe after the solidified material is formed by the solidified material forming unit may be provided as the solidification preventer.

This invention can be applied to a substrate processing method and a substrate processing apparatus for performing a cleaning process on various substrates such as semiconductor wafers, glass substrates for photomasks, glass substrates for liquid crystal displays, glass substrates for plasma displays, substrates for FEDs (Field Emission Displays), substrates for optical discs, substrates for magnetic discs and substrates for magneto-optical discs.

What is claimed is:

1. A substrate processing method, comprising:
   a preparation step of preparing a solidification liquid to be supplied to a substrate in a supercooled liquid state;
   a solidified material forming step of supplying the solidification liquid prepared in the preparation step to the substrate via a space and forming a solidified material of the solidification liquid on the substrate; and
   a removing step of removing the solidified material of the solidification liquid on the substrate, wherein
   the solidification liquid is solidified by an external stimulus that is at least one of a landing impact of the solidification liquid onto a surface of the substrate and applying vibration transmitted from the substrate; and
   the solidified material forming step is for changing the thickness of the solidified material of the solidification liquid on the substrate within the plane of the substrate by supplying a solidification liquid in a supercooled liquid state onto the solidified material of the solidification liquid on the substrate.

2. The substrate processing method according to claim 1, further comprising:
   a solidified material cooling step of cooling the solidified material by supplying a fluid having a temperature lower than a solidification point of the solidification liquid to the solidified material of the solidification liquid on the substrate.

3. The substrate processing method according to claim 2, wherein:
   the fluid supplied in the solidified material cooling step is a liquid coolant having a solidification point lower than that of the solidification liquid.

4. The substrate processing method according to claim 3, wherein:
   the solidified material forming step includes a substrate cooling step of cooling the substrate.

5. The substrate processing method according to claim 4, wherein:
   the substrate cooling step is for discharging a refrigerant to an under surface of the substrate.

6. The substrate processing method according to claim 4, wherein:
   the substrate cooling step is for discharging a refrigerant to a top surface of the substrate before the solidified material forming step.

7. The substrate processing method according to claim 3, wherein:
   the liquid coolant does not dissolve into the solidification liquid.

8. The substrate processing method according to claim 1, wherein:
   the solidified material forming step is for changing the thickness of the solidified material on the substrate by changing the amount of the solidification liquid supplied to the substrate within the plane of the substrate.

9. The substrate processing method according to claim 1, wherein:
   the solidified material forming step is for increasing the thickness of the solidified material of the solidification liquid within the plane of the substrate as the distance from a central part to a peripheral edge part of the substrate.

10. The substrate processing method according to claim 1, further comprising: a solidified material cooling step of cooling the solidified material by supplying a fluid having a temperature lower than a solidification point of the solidification liquid to the solidified material of the solidification liquid on the substrate, wherein
    the solidified material forming step is for changing the thickness of the solidified material of the solidification liquid on the substrate within the plane of the substrate according to an in-plane distribution of cooling efficiency in the solidified material cooling step, whereby cleaning ability to have an in-plane distribution; and
    the removing step is for removing the solidified material of the solidification liquid on the substrate after the solidified material cooling step.

11. The substrate processing method according to claim 10, wherein:
    the fluid supplied in the solidified material cooling step is a liquid coolant having a solidification point lower than that of the solidification liquid.

12. The substrate processing method according to claim 11, wherein:
    the liquid coolant does not dissolve into the solidification liquid.

* * * * *